(12) United States Patent
Lee et al.

(10) Patent No.: US 11,869,811 B2
(45) Date of Patent: Jan. 9, 2024

(54) SEMICONDUCTOR DEVICE AND METHOD OF MANUFACTURING THE SAME

(71) Applicant: Samsung Electronics Co., Ltd., Suwon-si (KR)

(72) Inventors: Wonhyuk Lee, Incheon (KR); Jeongyun Lee, Yongin-si (KR); Yongseok Lee, Hwaseong-si (KR); Bosoon Kim, Hwaseong-si (KR); Sangduk Park, Hwaseong-si (KR); Seungchul Oh, Seoul (KR); Youngmook Oh, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 87 days.

(21) Appl. No.: 17/562,802

(22) Filed: Dec. 27, 2021

(65) Prior Publication Data

US 2022/0122891 A1 Apr. 21, 2022

Related U.S. Application Data

(63) Continuation of application No. 16/503,728, filed on Jul. 5, 2019, now Pat. No. 11,211,294, which is a (Continued)

(30) Foreign Application Priority Data

Jan. 13, 2016 (KR) .................. 10-2016-0004336

(51) Int. Cl.
*H01L 29/78* (2006.01)
*H01L 21/8234* (2006.01)
*H01L 27/088* (2006.01)
*H01L 21/762* (2006.01)
*H01L 29/08* (2006.01)
*H01L 21/8238* (2006.01)

(52) U.S. Cl.
CPC ............... *H01L 21/823481* (2013.01); *H01L 21/76224* (2013.01); *H01L 21/823418* (2013.01);
(Continued)

(58) Field of Classification Search
CPC .......... H01L 21/823481; H01L 27/088; H01L 21/76224; H01L 21/823418;
(Continued)

(56) References Cited

U.S. PATENT DOCUMENTS 7,745,292 B2 6/2010 Lian et al.
8,278,179 B2 10/2012 Lin et al.
(Continued)

FOREIGN PATENT DOCUMENTS

KR 20040057609 A 7/2004
KR 20090038349 A 4/2009

*Primary Examiner* — Samuel Park
(74) *Attorney, Agent, or Firm* — Muir Patent Law, PLLC

(57) ABSTRACT

A semiconductor device includes a device isolation layer provided on a substrate, the device isolation layer defining first and second sub-active patterns, first and second gate electrodes crossing the first and second sub-active patterns, respectively, and an isolation structure provided on the device isolation layer between the first and second sub-active patterns. The first and second sub-active patterns extend in a first direction and are spaced apart from each other in the first direction. The device isolation layer includes a diffusion break region disposed between the first and second sub-active patterns. The isolation structure covers a top surface of the diffusion break region.

20 Claims, 51 Drawing Sheets

Related U.S. Application Data continuation of application No. 15/405,420, filed on Jan. 13, 2017, now Pat. No. 10,366,927.

(52) U.S. Cl.
CPC ........ *H01L 27/088* (2013.01); *H01L 29/0847* (2013.01); *H01L 21/823431* (2013.01); *H01L 21/823456* (2013.01); *H01L 21/823814* (2013.01); *H01L 27/0886* (2013.01)

(58) Field of Classification Search
CPC ......... H01L 29/0847; H01L 21/823431; H01L 21/823814; H01L 21/823456; H01L 27/0886
See application file for complete search history.

(56) References Cited

U.S. PATENT DOCUMENTS

| | | |
|---|---|---|
| 8,765,546 B1 | 7/2014 | Hung et al. |
| 8,846,491 B1 | 9/2014 | Pham et al. |
| 8,975,672 B2 | 3/2015 | Chiang et al. |
| 9,054,193 B2 | 6/2015 | Yin et al. |
| 9,105,724 B2 | 8/2015 | Ito |
| 9,252,273 B2 | 2/2016 | Zang |
| 9,349,836 B2 | 5/2016 | Alptekin et al. |
| 9,356,146 B2 | 5/2016 | Matsumoto |
| 9,412,616 B1* | 8/2016 | Xie ................. H01L 29/785 |
| 2008/0119020 A1 | 5/2008 | Grisham et al. |
| 2008/0308875 A1 | 12/2008 | Lee et al. |
| 2011/0287611 A1 | 11/2011 | Cheng et al. |
| 2013/0140639 A1* | 6/2013 | Shieh ............ H01L 29/66545 438/296 |
| 2013/0244389 A1 | 9/2013 | Cheng et al. |
| 2013/0285155 A1 | 10/2013 | Glass et al. |
| 2014/0264572 A1* | 9/2014 | Kim ............ H01L 29/66545 438/156 |
| 2015/0035018 A1 | 2/2015 | Liu et al. |
| 2015/0162333 A1 | 6/2015 | Kuo et al. |
| 2015/0194521 A1 | 7/2015 | Yedinak et al. |
| 2016/0093715 A1 | 3/2016 | Liu et al. |
| 2016/0099181 A1 | 4/2016 | Tung |
| 2016/0163604 A1 | 6/2016 | Xie et al. |
| 2016/0225762 A1 | 8/2016 | Zang et al. |
| 2017/0154823 A1* | 6/2017 | Tseng ................ H01L 21/0228 |

\* cited by examiner

SEMICONDUCTOR DEVICE AND METHOD OF MANUFACTURING THE SAME

CROSS-REFERENCE TO RELATED APPLICATIONS

This U.S. non-provisional patent application is a continuation of U.S. patent application Ser. No. 16/503,728, filed Jul. 5, 2019, which is a continuation of U.S. patent application Ser. No. 15/405,420 filed on Jan. 13, 2017, which claims priority under 35 U.S.C. § 119 to Korean Patent Application No. 10-2016-0004336, filed on Jan. 13, 2016, in the Korean Intellectual Property Office, the disclosure of each of which is hereby incorporated by reference in its entirety.

BACKGROUND

Embodiments of the inventive concepts relate to a semiconductor device and, for example, to a semiconductor device including a field effect transistor and a method of manufacturing the same.

A semiconductor device may include an integrated circuit including metal-oxide-semiconductor field effect transistors (MOSFETs). As sizes and design rules of semiconductor devices have been reduced, MOSFETs have been scaled down. Various problems (e.g., a short channel effect) may be caused by the reduction in size of the MOSFETs, and thus operating characteristics of semiconductor devices may be deteriorated. Accordingly, various researches are being conducted for semiconductor devices capable of overcoming limitations according to a high integration density and capable of improving performance of semiconductor devices.

SUMMARY

Embodiments of the inventive concepts may provide a semiconductor device having a simplified structure and a method of manufacturing the same.

Embodiments of the inventive concepts may also provide a method of manufacturing a semiconductor device capable of reducing or minimizing a manufacture cost.

In an aspect, a semiconductor device may include a device isolation layer provided on a substrate defining a first sub-active pattern and a second sub-active pattern, the first and second sub-active patterns extending in a first direction and spaced apart from each other in the first direction, a first gate electrode and a second gate electrode crossing the first sub-active pattern and the second sub-active pattern, respectively, and an isolation structure provided on the device isolation layer between the first and second sub-active patterns. The device isolation layer may include a diffusion break region which is a portion of the device isolation layer disposed between the first and second sub-active patterns, and the isolation structure may cover a top surface of the diffusion break region.

In an aspect, a method of manufacturing a semiconductor device may include forming a first sub-active pattern and a second sub-active pattern on a substrate, the first and second sub-active patterns extending in a first direction and spaced apart from each other in the first direction, forming a device isolation layer exposing an upper portion of the first sub-active pattern and an upper portion of the second sub-active pattern, forming first and second sacrificial patterns crossing the first and second sub-active patterns, respectively, forming a first fin spacer and a second fin spacer on a sidewall of the upper portion of the first sub-active pattern and a sidewall of the upper portion of the second sub-active pattern, respectively, the first and second fin spacers being in contact with each other between the first and second sub-active patterns, and replacing the first and second sacrificial patterns with first and second gate electrodes.

In an aspect, a method of manufacturing a semiconductor device may include forming a first sub-active pattern and a second sub-active pattern on a substrate, the first and second sub-active patterns extending in a first direction and spaced apart from each other in the first direction, forming a device isolation layer exposing an upper portion of the first sub-active pattern and an upper portion of the second sub-active pattern, forming first, second, and third sacrificial patterns extending in a second direction crossing the first direction, the first and second sacrificial patterns crossing the first and second sub-active patterns, respectively, and the third sacrificial pattern crossing a portion of the device isolation layer between the first and second sub-active patterns, forming isolation spacers on both sidewalls of the third sacrificial pattern, selectively removing the third sacrificial pattern to form a gap region between the isolation spacers, forming an isolation pattern filling the gap region, and replacing the first and second sacrificial patterns with first and second gate electrodes.

BRIEF DESCRIPTION OF THE DRAWINGS

Aspects of the inventive concepts will become more apparent in view of the attached drawings and accompanying detailed description.

DETAILED DESCRIPTION

Figure 1:
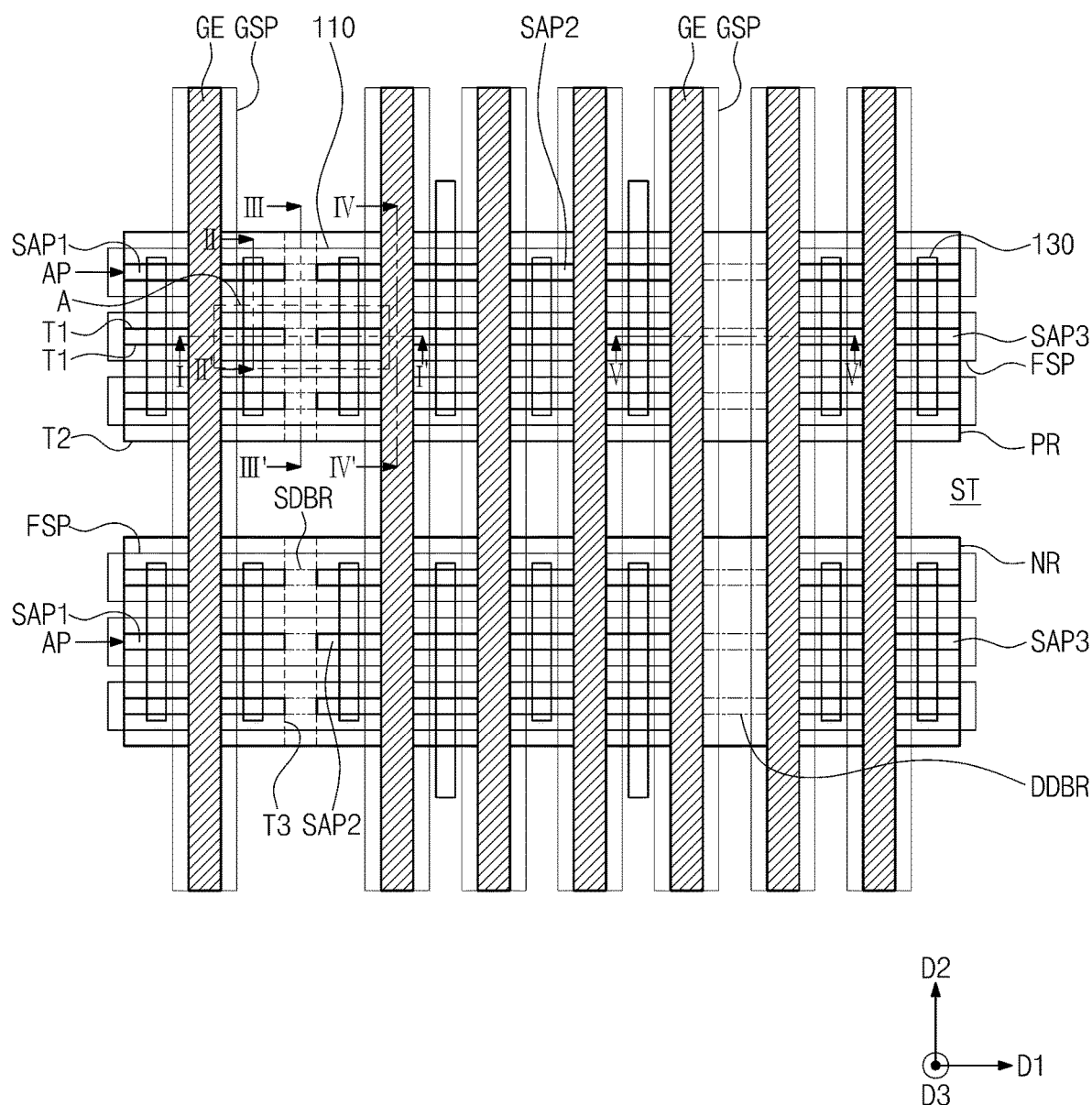
FIG. 1 is a plan view illustrating a semiconductor device according to some embodiments of the inventive concepts.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.). [Alt: The term "contact," as used herein, refers to a direct connection (i.e., touching) unless the context indicates otherwise.]

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2A:
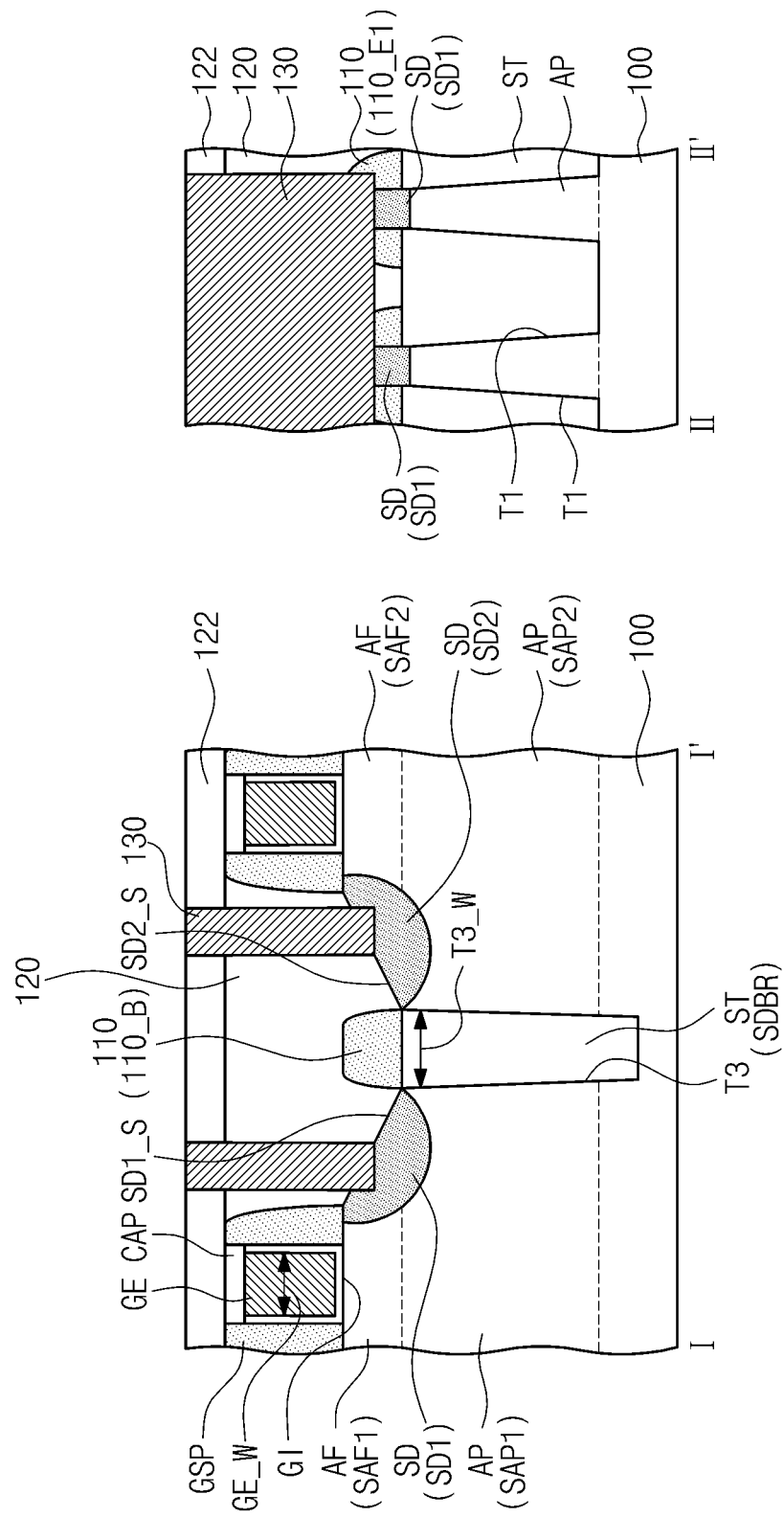
FIG. 2A is cross-sectional views taken along lines I-I' and II-II' of FIG. 1.
Figure 2B:
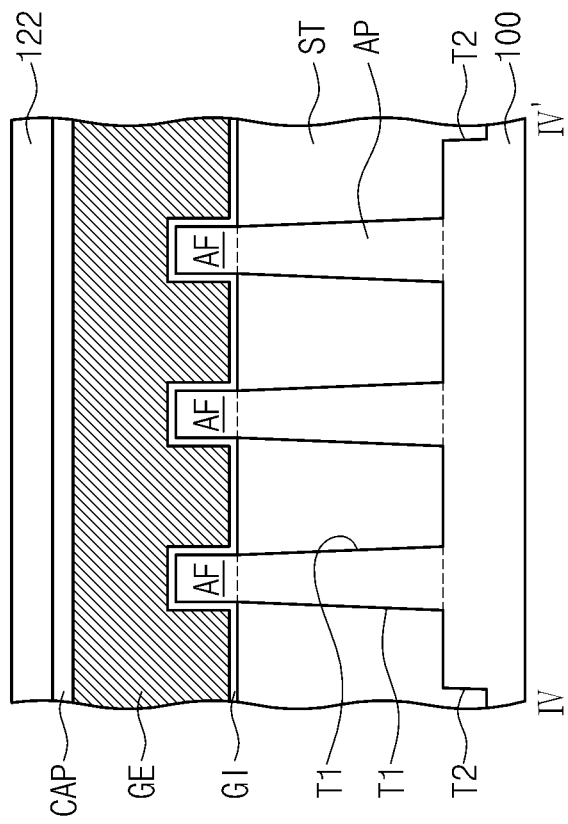
FIG. 2B is cross-sectional views taken along lines III-III' and IV-IV' of FIG. 1.
Figure 2B:
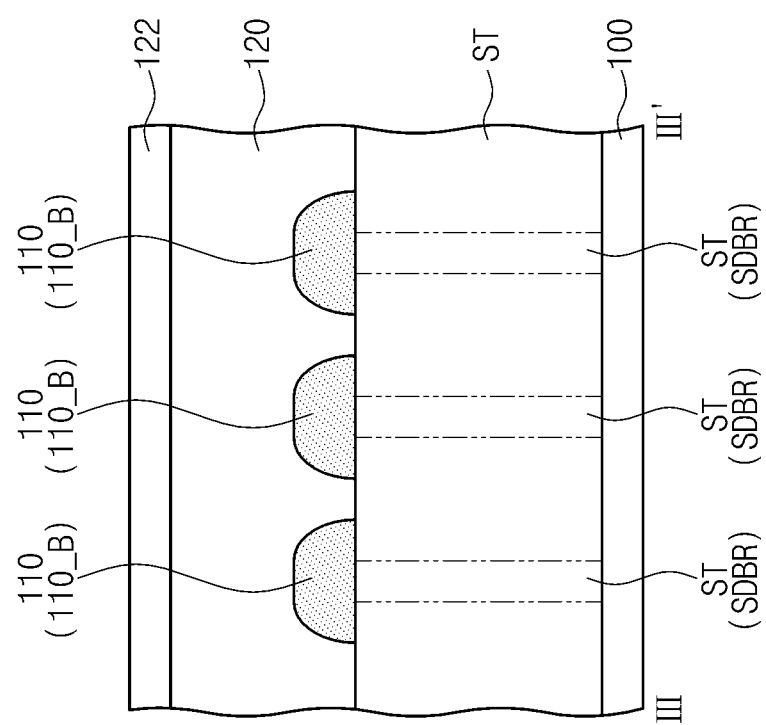
Figure 2C:
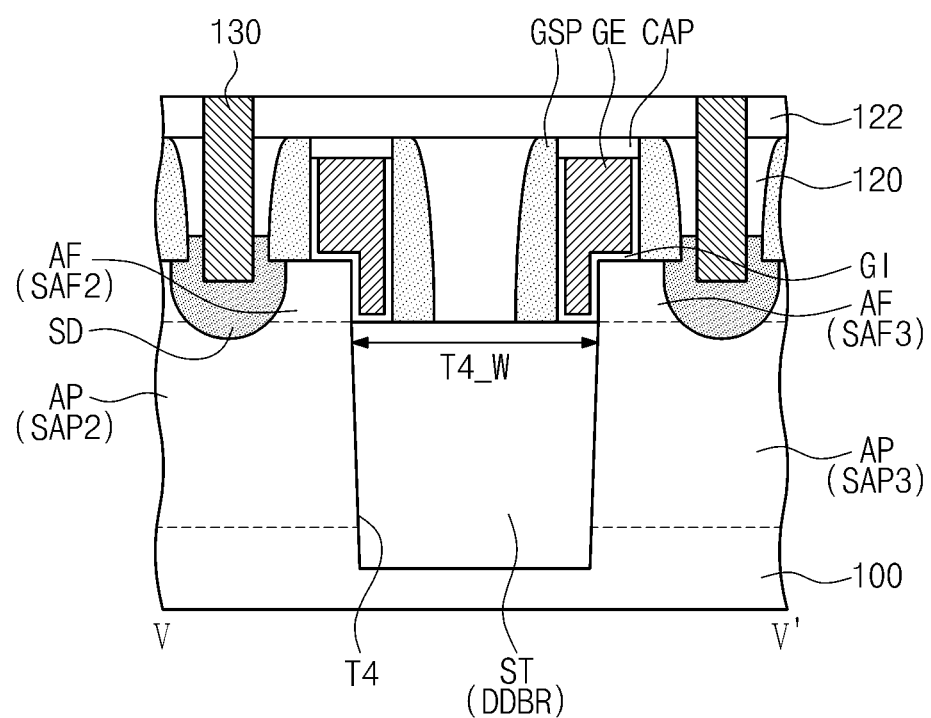
FIG. 2C is a cross-sectional view taken along a line V-V' of FIG. 1.

FIG. 1 is a plan view illustrating a semiconductor device according to some embodiments of the inventive concepts. FIG. 2A is cross-sectional views taken along lines I-I' and II-II' of FIG. 1. FIG. 2B is cross-sectional views taken along lines III-III' and IV-IV' of FIG. 1. FIG. 2C is a cross-sectional view taken along a line V-V' of FIG. 1.

Referring to FIGS. 1 and 2A to 2C, trenches T1 to T4 may be provided in an upper portion of a substrate 100 to define active regions PR and NR and active patterns AP. For example, the substrate 100 may be a silicon substrate, a germanium substrate, a silicon-on-insulator (SOI) substrate, or a germanium-on-insulator (GOI) substrate.

First trenches T1 may extend in a first direction D1 substantially parallel to a top surface of the substrate 100 to define the active patterns AP. Each of the active patterns AP may be defined by a pair of first trenches T1 adjacent to each other. Thus, the active patterns AP may also extend in the first direction D1 and may be spaced apart from each other in a second direction D2 that crosses (e.g., is perpendicular to) the first direction D1 and is substantially parallel to the top surface of the substrate 100.

A second trench T2 may define the active regions PR and NR. The second trench T2 may include portions that extend in the first direction D1 to define sides, which are parallel to the first direction D1, of each of the active regions PR and NR. The second trench T2 may further include portions that extend in the second direction D2 to define sides, which are parallel to the second direction D2, of each of the active regions PR and NR. As illustrated in FIG. 2B, a depth of the second trench T2 may be greater than depths of the first trenches T1. In the present specification, depths of the trenches T1 to T4 may mean depths in a third direction D3 perpendicular to the top surface of the substrate 100. Thus, a bottom surface of the second trench T2 may be disposed at a lower level than bottom surfaces of the first trenches T1. The active regions PR and NR may include a P-channel metal-oxide-semiconductor field effect transistor (P-channel MOSFET) region PR and an N-channel metal-oxide-semiconductor field effect transistor (N-channel MOSFET) region NR, which are spaced apart from each other in the second direction D2.

Third and fourth trenches T3 and T4 may extend in the second direction D2 to divide each of the active patterns AP into sub-active patterns SAP1, SAP2, and SAP3. In some embodiments, the third trench T3 may separate the first and second sub-active patterns SAP1 and SAP2 of each of the active patterns AP from each other, and the fourth trench T4 may separate the second and third sub-active patterns SAP2 and SAP3 of each of the active patterns AP. Thus, the first to third sub-active patterns SAP1, SAP2, and SAP3 included in each of the active patterns AP may extend in the first direction D1 and may be spaced apart from each other in the first direction D1. The third trench T3 and the fourth trench T4 may be provided in each of the active regions PR and NR. A width T3_W of the third trench T3 in the first direction D1 may be smaller than a width T4_W of the fourth trench T4 in the first direction D1. In some embodiments, the width T3_W of the third trench T3 in the first direction D1 may be smaller than twice a width GE_W of a gate electrode GE in the first direction D1. The gate electrode GE will be described later. A depth of the third trench T3 and a depth of the fourth trench T4 may be greater than the depth of the first trench T1. Thus, a bottom surface of the third trench T3 and a bottom surface of the fourth trench T4 may be disposed at a lower level than the bottom surface of the first trench T1. In some embodiments, the depth of the third trench T3 may be equal to the depth of the fourth trench T4. However, embodiments of the inventive concepts are not limited thereto.

A device isolation layer ST may be provided to fill portions (i.e., lower portions) of the trenches T1, T2, T3, and T4. Thus, each of the active patterns AP may have an upper portion (hereinafter, referred to as 'an active fin AF') exposed by the device isolation layer ST. The active fin AF may include first, second, and third sub-active fins SAF1, SAF2, and SAF3 which are included in the first, second, and third sub-active patterns SAP1, SAP2, and SAP3, respectively. The device isolation layer ST may include single diffusion break regions SDBR and double diffusion break regions DDBR. Each of the single diffusion break regions SDBR may correspond to a portion of the device isolation layer ST, which is disposed between the first and second sub-active patterns SAP1 and SAP2 included in the same active pattern AP. Each of the double diffusion break regions DDBR may correspond to another portion of the device isolation layer ST, which is disposed between the second and third sub-active patterns SAP2 and SAP3 included in the same active pattern AP. For example, the device isolation layer ST may include a dielectric material or an insulator (e.g. silicon oxide).

Gate electrodes GE may be provided on the active patterns AP and may cross the active patterns AP. In some embodiments, the gate electrodes GE may extend in the second direction D2 and may be spaced apart from each other in the first direction D1. Two of the gate electrodes GE may cross and/or overlap the double diffusion break regions DDBR. For example, as illustrated in FIGS. 1 and 2C, one of the two gate electrodes GE may cover end portions of the second sub-active fins SAF2 and may cross the double diffusion break regions DDBR, and the other of the two gate electrodes GE may cover end portions of the third sub-active fins SAF3 and may cross the double diffusion break regions DDBR. The gate electrodes GE may not be provided on the single diffusion break regions SDBR. For example, the single diffusion break regions SDBR may be spaced apart from the gate electrodes GE in a plan view.

Each of the gate electrodes GE may cross the P-channel MOSFET region PR and the N-channel MOSFET region NR. A gate insulating pattern GI may be provided under each of the gate electrodes GE, and a capping pattern CAP may be provided on a top surface of each of the gate electrodes GE. Gate spacers GSP may be provided on both sidewalls of each of the gate electrodes GE. In some embodiments, the gate insulating pattern GI may extend between each of the gate electrodes GE and the gate spacers GSP.

For example, the gate electrodes GE may include at least one of a doped semiconductor material, a metal, or a conductive metal nitride. For example, the gate insulating pattern GI may include at least one of silicon oxide, silicon oxynitride, or a high-k dielectric material of which a dielectric constant is higher than that of silicon oxide. For example, each of the capping pattern CAP and the gate spacer GSP may include at least one of silicon oxide, silicon nitride, silicon oxynitride, silicon carbonitride (SiCN), or silicon-carbon oxynitride (SiCON).

Source/drain regions SD may be provided on the active patterns AP at both sides of each of the gate electrodes GE.

In some embodiments, as illustrated in FIGS. 2A to 2C, each of the source/drain regions SD may include an epitaxial pattern grown using the active pattern AP as a seed. Thus, the source/drain regions SD may include a crystal structure. In these embodiments, the active patterns AP may have recess regions disposed at both sides of the gate electrode GE, and the source/drain regions SD may be provided in the recess regions, respectively. The source/drain regions SD in the P-channel MOSFET region PR may be configured to provide a compressive strain to the active pattern AP disposed therebetween, and the source/drain regions SD in the N-channel MOSFET region NR may be configured to provide a tensile strain to the active pattern AP disposed therebetween. In some embodiments, when the active patterns AP include silicon (Si), the source/drain regions SD of the P-channel MOSFET region PR may include silicon-germanium (SiGe) and the source/drain regions SD of the N-channel MOSFET region NR may include silicon carbide (SiC). The source/drain regions SD provided on the same active pattern AP may include first and second source/drain regions SD1 and SD2 adjacent to the single diffusion break region SDBR. For example, the first source/drain region SD1 may be disposed between the single diffusion break region SDBR and the gate electrode GE which crosses the first sub-active patterns SAP1 and is nearest to the single diffusion break region SDBR, and the second source/drain region SD2 may be disposed between the single diffusion break region SDBR and the gate electrode GE which crosses the second sub-active patterns SAP2 and is nearest to the single diffusion break region SDBR. In some embodiments, as illustrated in FIGS. 2A to 2C, a level of the topmost surface of each of the first and second source/drain regions SD1 and SD2 may be substantially the same as a level of the topmost surface of the active pattern AP, but levels of the topmost surfaces of other source/drain regions SD except the first and second source/drain regions SD1 and SD2 may be higher than the level of the topmost surface of the active pattern AP. In some embodiments, the first source/drain region SD1 may have a first slope SD1_S, and the second source/drain region SD2 may have a second slope SD2_S. Each of the first and second slopes SD1_S and SD2_S may be inclined downward toward the single diffusion break region SDBR. For example, each of the first and second slopes SD1_S and SD2_S may extend from a sidewall or bottom surface of one gate spacer GSP adjacent thereto toward the single diffusion break region SDBR, and a level of each of the first and second slopes SD1_S and SD2_S may become progressively lower toward the single diffusion break region SDBR. Each of the first and second slopes SD1_S and SD2_S may have a (111) crystal plane. The source/drain regions SD of the P-channel MOSFET region PR may include P-type dopants, and the source/drain regions SD of the N-channel MOSFET region NR may include N-type dopants.

In certain embodiments, unlike FIGS. 2A to 2C, the source/drain regions SD may be dopant regions provided in the active fins AF at both sides of each of the gate electrodes GE. For, example, the source/drain regions SD may not be epitaxial patterns grown on recessed active fins AF but be formed by doping the active fins AF with impurities. In these embodiments, the source/drain regions SD of the P-channel MOSFET region PR may be P-type dopant regions, and the source/drain regions SD of the N-channel MOSFET region NR may be N-type dopant regions.

Portions of the active patterns AP (e.g., portions of the active fins AF) disposed under the gate electrodes GE may be used as channel regions. The channel regions may overlap with the gate electrodes GE in a plan view.

Figure 3A:
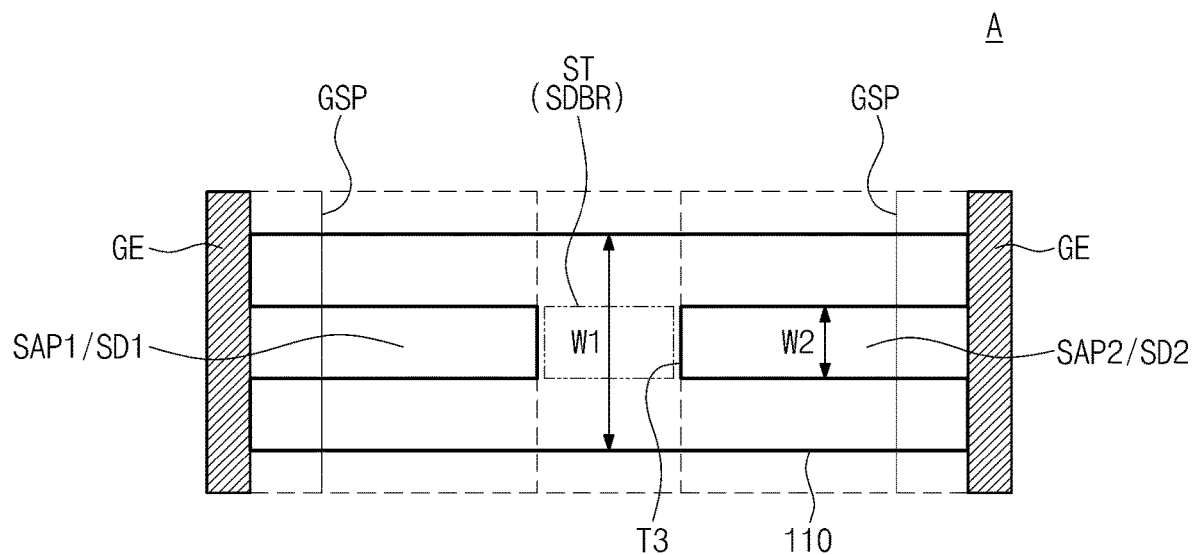
FIG. 3A is an enlarged view of a region 'A' of FIG. 1.
Figure 3B:
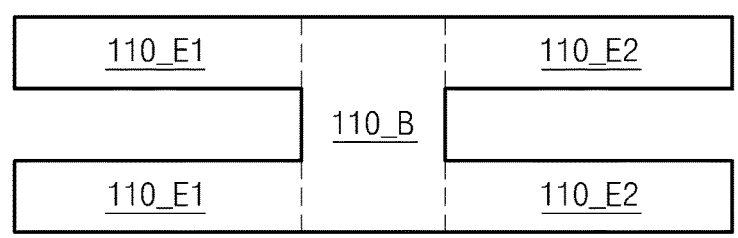
FIG. 3B is a plan view illustrating an isolation structure according to some embodiments of the inventive concepts.

FIG. 3A is an enlarged view of a region 'A' of FIG. 1. Source/drain contacts are omitted in FIG. 3A to clearly illustrate other components. FIG. 3B is a plan view illustrating an isolation structure according to some embodiments of the inventive concepts. The isolation structure of FIG. 3B is an isolation structure according to the embodiment illustrated in FIG. 1.

Referring to FIGS. 1, 2A to 2C, 3A and 3B, isolation structures 110 may be provided on the device isolation layer ST. Each of the isolation structures 110 may include a body portion 110_B disposed on the device isolation layer ST between the first and second sub-active patterns SAP1 and SAP2 included in the same active pattern AP. The Body portion 110_B of each of the isolation structures 110 may overlap with each of the single diffusion break regions SDBR in a plan view and may cover a top surface of each of the single diffusion break regions SDBR. As illustrated in FIGS. 2A and 2C, the body portion 110_B may have a convex shaped top surface with respect to a cross-sectional view. A bottom surface of the body portion 110_B may be in contact with the single diffusion break region SDBR. A width W1 of the body portion 110_B in the second direction D2 may be greater than a width W2 of the active pattern AP in the second direction D2.

In some embodiments, as illustrated in FIGS. 1, 2A, 3A, and 3B, each of the isolation structures 110 may further include a pair of first extensions 110_E1 and a pair of second extensions 110_E2. In these embodiments, each of the isolation structures 110 may have an H-shape in a plan view.

Each of the pair of first extensions 110_E1 may laterally protrude from a first sidewall of the body portion 110_B in parallel to the first direction D1. The pair of first extensions 110_E1 may be respectively in contact with both sidewalls of the first source/drain region SD1, which extend in the first direction D1. For example, the pair of first extensions 110_E1 may be spaced apart from each other in the second direction D2. The pair of first extensions 110_E1 may extend to one sidewall of the gate electrode GE which crosses the first sub-active patterns SAP1 and is nearest to the single diffusion break region SDBR. The pair of first extensions 110_E1 may be connected to the gate spacer GSP disposed on the one sidewall of the gate electrode GE.

Each of the pair of second extensions 110_E2 may laterally protrude from a second sidewall of the body portion 110_B in parallel to the first direction D1. The second sidewall of the body portion 110_B may be opposite to the first sidewall of the body portion 110_B. The pair of second extensions 110_E2 may be respectively in contact with both sidewalls of the second source/drain region SD2, which extend in the first direction D1. For example, the pair of second extensions 110_E2 may be spaced apart from each other in the second direction D2. The pair of second extensions 110_E2 may extend to one sidewall of the gate electrode GE which crosses the second sub-active patterns SAP2 and is nearest to the single diffusion break region SDBR. The pair of second extensions 110_E2 may be connected to the gate spacer GSP disposed on the one sidewall of the gate electrode GE crossing the second sub-active patterns SAP2.

In some embodiments, as illustrated in FIG. 2A, the top surface of the body portion 110_B and top surfaces of the first and second extensions 110_E1 and 110_E2 may be disposed at the substantially same level as the top surface of the active fin AF. In certain embodiments, unlike FIG. 2A, the top surface of the body portion 110_B and the top surfaces of the first and second extensions 110_E1 and 110_E2 may be disposed at a lower level than the top surface of the active fin AF. In certain embodiments, the top surfaces of the first and second extensions 110_E1 and 110_E2 may be disposed at a lower level than the top surface of the body portion 110_B.

In the embodiment in which each of the isolation structures 110 further includes the pair of first extensions 110_E1 and the pair of second extensions 110_E2, fin spacers FSP may be provided on the device isolation layer ST. The fin spacers FSP may be respectively disposed on sidewalls of other source/drain regions SD except the first and second source/drain regions SD1 and SD2. The fin spacers FSP may be connected to the gate spacers GSP. Top surfaces of the fin spacers FSP may be disposed at the substantially same level as the top surfaces of the first and second extensions 110_E1 and 110_E2.

The isolation structures 110 and the fin spacers FSP may be formed of the same material as the gate spacers GSP. For example, the isolation structures 110 and the fin spacers FSP may include an insulator or a dielectric material. For example, the isolation structures 110, the fin spacers FSP, and the gate spacers may include at least one of silicon oxide, silicon nitride, silicon oxynitride, silicon carbonitride (SiCN), or silicon-carbon oxynitride (SiCON).

In certain embodiments, each of the isolation structures 110 may not include the first and second extensions 110_E1 and 110_E2. These embodiments will be described later with reference to FIGS. 4A to 4C.

A first interlayer insulating layer 120 may be provided on the substrate 100. The first interlayer insulating layer 120 may cover the device isolation layer ST, the active patterns AP, the source/drain regions SD, and the isolation structures 110. A top surface of the first interlayer insulating layer 120 may be coplanar with top surfaces of the capping patterns CAP. However, embodiments of the inventive concepts are not limited thereto. The first interlayer insulating layer 120 may be spaced apart from the single diffusion break regions SDBR with the isolation structures 110 interposed therebetween. For example, the first interlayer insulating layer 120 may include at least one of a silicon oxide layer, a silicon nitride layer, or a silicon oxynitride layer.

A second interlayer insulating layer 122 may be provided on the first interlayer insulating layer 120. The second interlayer insulating layer 122 may cover the gate electrodes GE and the first interlayer insulating layer 120. For example, the second interlayer insulating layer 122 may include at least one of a silicon oxide layer, a silicon nitride layer, or a silicon oxynitride layer.

Contacts 130 may be provided at both sides of each of the gate electrodes GE. The contacts may penetrate the second and first interlayer insulating layers 122 and 120 so as to be electrically connected to the source/drain regions SD. One contact 130 may be connected to one source/drain region SD or a plurality of source/drain regions SD. However, embodiments of the inventive concepts are not limited thereto. For example, the contacts 130 may include a conductive material such as tungsten.

According to some embodiments of the inventive concepts, the first and second sub-active patterns SAP1 and SAP2 may be isolated from each other by a simple structure including the single diffusion break region SDBR of the device isolation layer ST and the isolation structure 110.

Figure 4A:
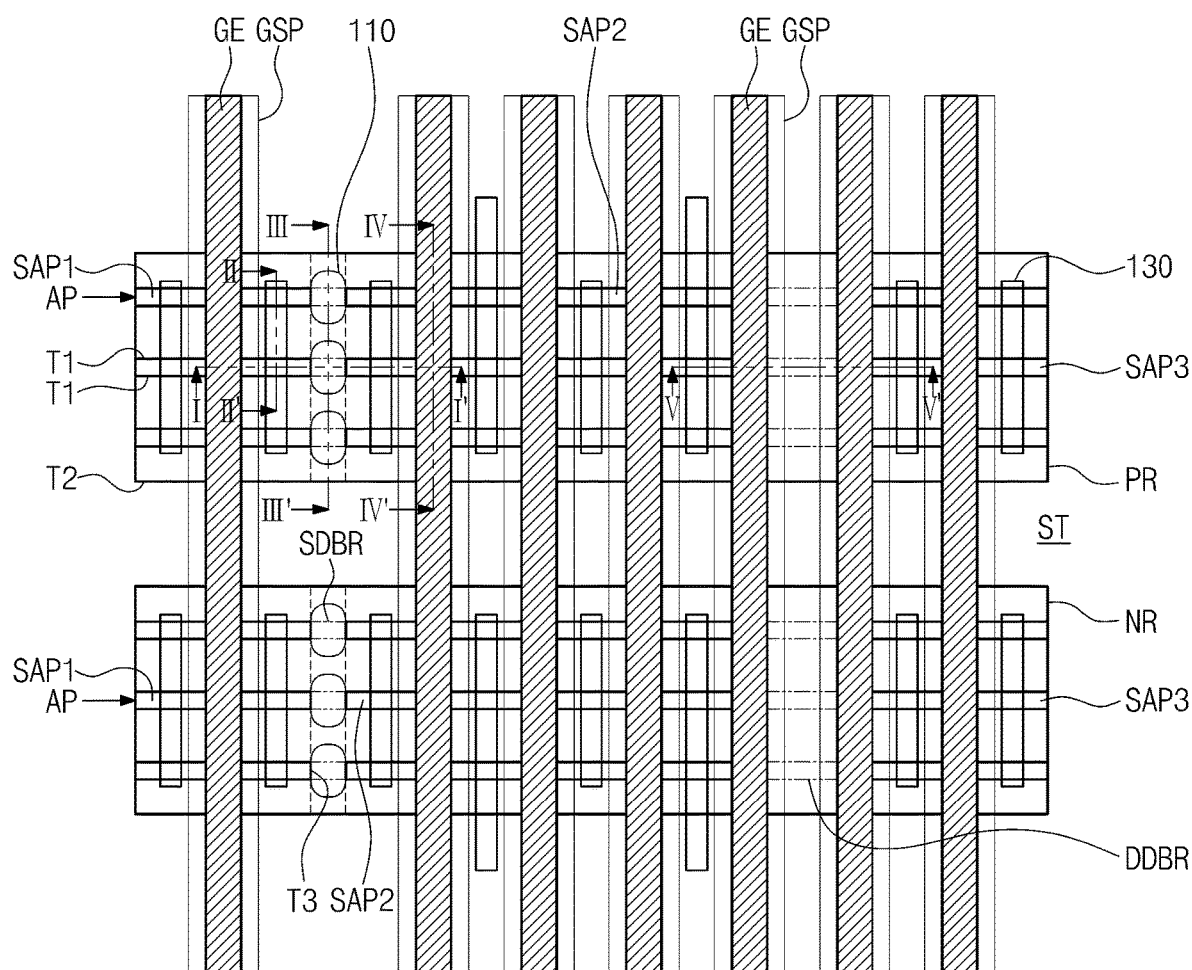
FIG. 4A is a plan view illustrating a semiconductor device according to some embodiments of the inventive concepts.
Figure 4A:
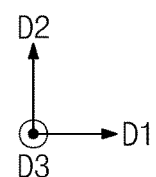
Figure 4B:
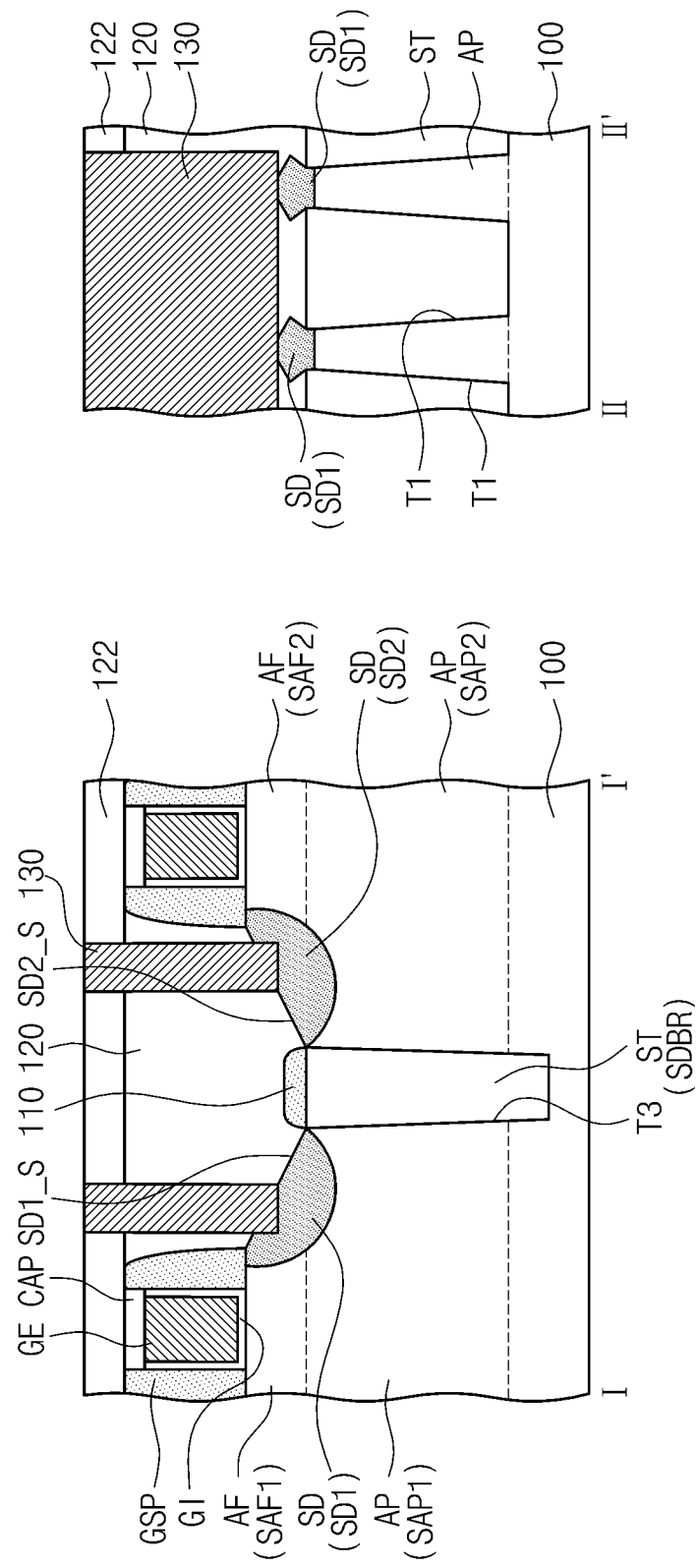
FIG. 4B is cross-sectional views taken along lines I-I' and II-II' of FIG. 4A.
Figure 4C:
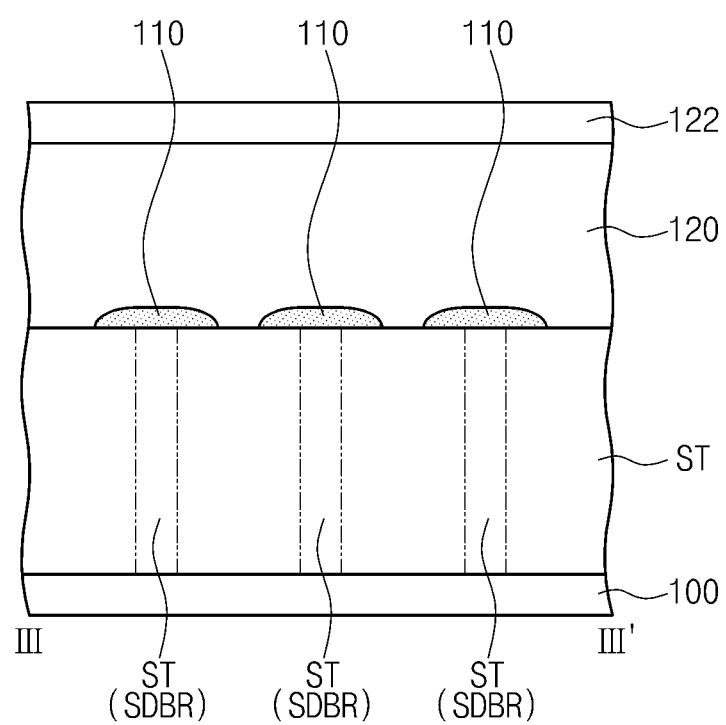
FIG. 4C is a cross-sectional view taken along a line III-III' of FIG. 4A.

FIG. 4A is a plan view illustrating a semiconductor device according to some embodiments of the inventive concepts. FIG. 4B is a cross-sectional view taken along lines I-I' and II-II' of FIG. 4A. FIG. 4C is a cross-sectional view taken along a line of FIG. 4A. Cross-sectional views taken along lines IV-IV' and V-V' of FIG. 4A may be the same as the cross-sectional views taken along the lines IV-IV' and V-V' in FIGS. 2B and 2C. In the present embodiment, the same components as described in the embodiment of FIGS. 1 and 2A to 2C will be indicated by the same reference numerals or the same reference designators. For the purpose of ease and convenience in explanation, the descriptions to the same components as in the embodiment of FIGS. 1 and 2A to 2C will be omitted or mentioned briefly. Hereinafter, isolation structures will be mainly described.

Referring to FIGS. 4A to 4C, isolation structures 110 may be provided on the device isolation layer ST. Each of the isolation structures 110 may be disposed on the device isolation layer ST between the first and second sub-active patterns SAP1 and SAP2 included in the same active pattern AP. Each of the isolation structures 110 may overlap with each of the single diffusion break regions SDBR in a plan view and may cover the top surface of each of the single diffusion break regions SDBR. As illustrated in FIGS. 4B and 4C, the isolation structure 110 may have a convexly rounded top surface in a cross-sectional view. A bottom surface of the isolation structure 110 may be in contact with the single diffusion break region SDBR.

According to the present embodiment, the top surfaces of the isolation structures 110 may be disposed at a lower level than the top surface of the active fin AF, as illustrated in FIGS. 4B and 4C. Each of the isolation structures 110 may not include the extensions described with reference to FIGS. 1, 2A, 2B, 3A, and 3B. Thus, the isolation structures 110 may be spaced apart from the gate spacers GSP. For example, a semiconductor device according to the present embodiment may not include the fin spacers described with reference to FIG. 1.

The isolation structures 110 may be formed of the same material as the gate spacers GSP. For example, the isolation structures 110 may include at least one of silicon oxide, silicon nitride, silicon oxynitride, silicon carbonitride (SiCN), or silicon-carbon oxynitride (SiCON).

The first interlayer insulating layer 120 may be provided on the substrate 100. The first interlayer insulating layer 120 may cover the device isolation layer ST, the active patterns AP, the source/drain regions SD, and the isolation structures 110. The first interlayer insulating layer 120 may be spaced apart from the single diffusion break regions SDBR with the isolation structures 110 interposed therebetween.

Figure 5A:
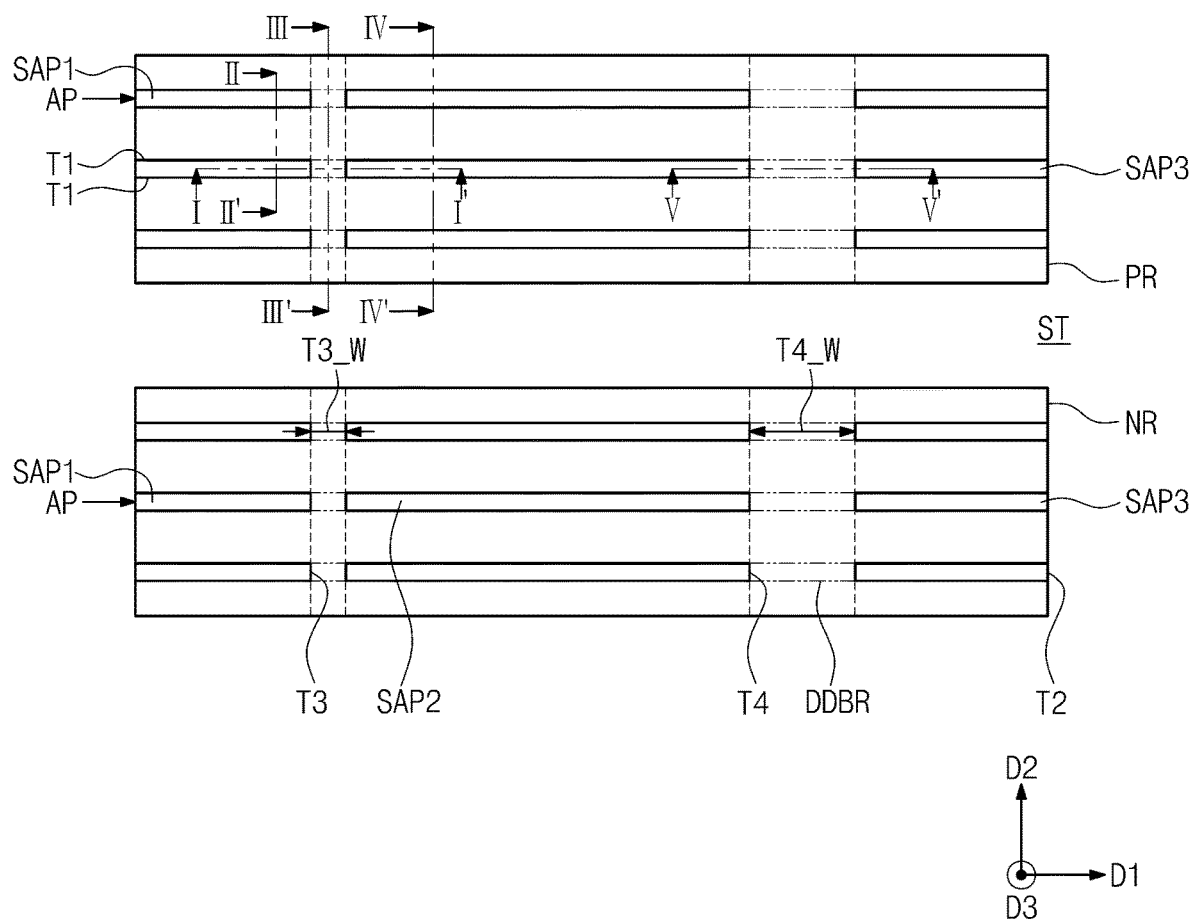
FIGS. 5A, 6A, and 7A are plan views illustrating a method of manufacturing a semiconductor device according to some embodiments of the inventive concepts.
Figure 5B:
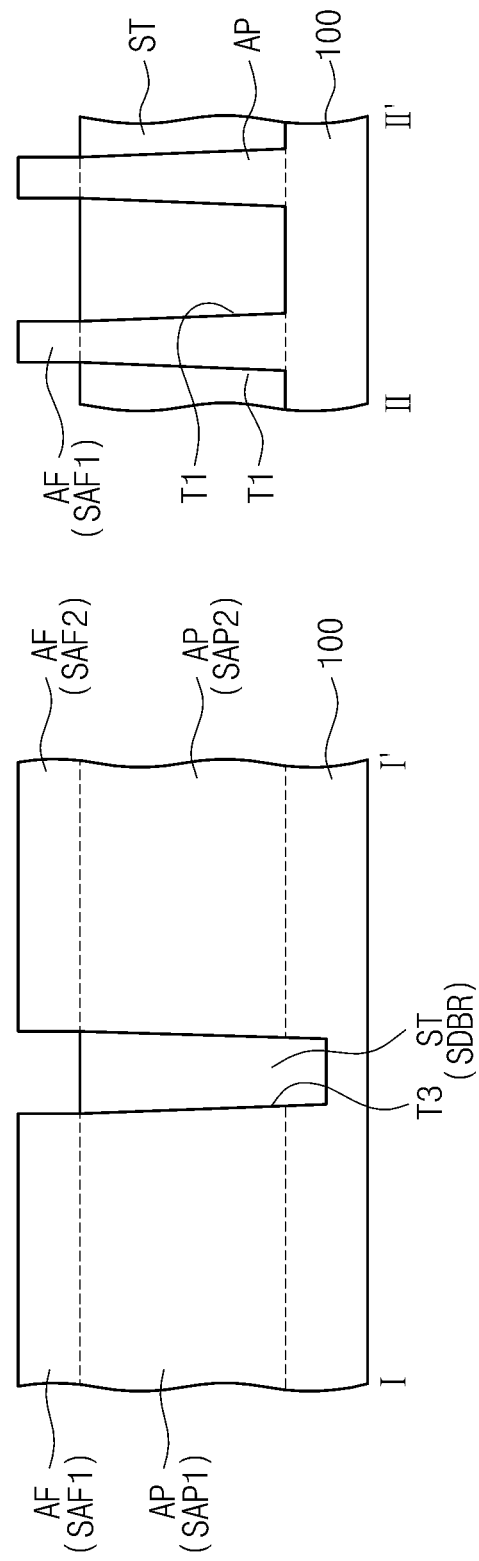
FIGS. 5B, 6B, and 7B are cross-sectional views taken along lines I-I' and II-II' of FIGS. 5A, 6A, and 7A, respectively.
Figure 5C:
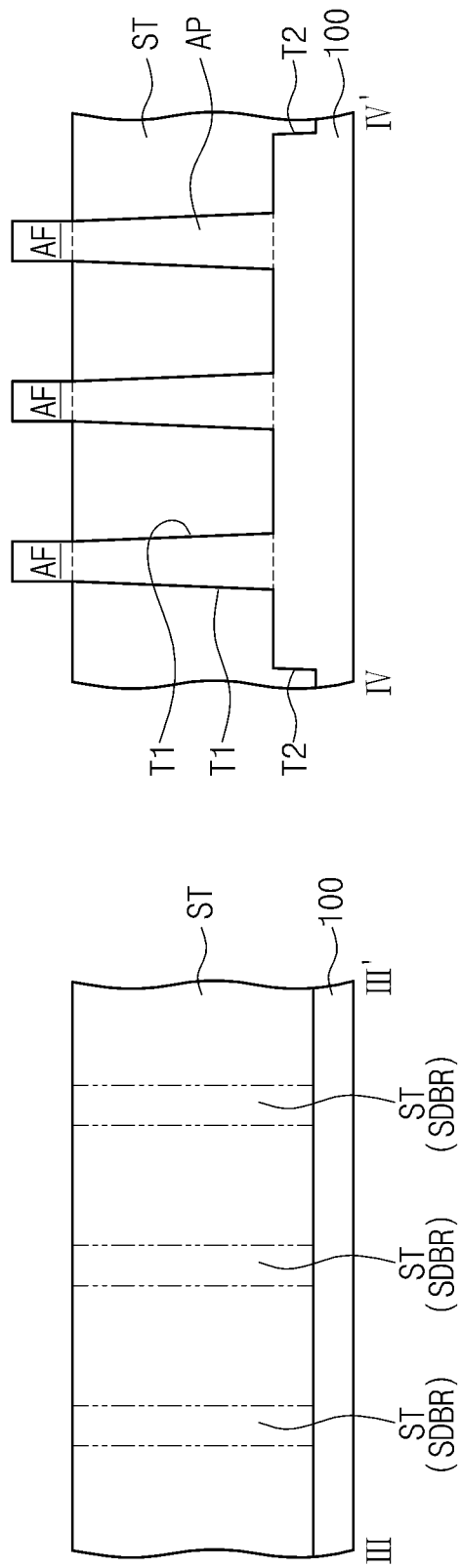
FIGS. 5C, 6C, and 7C are cross-sectional views taken along lines III-III' and IV-IV' of FIGS. 5A, 6A, and 7A, respectively.
Figure 5D:
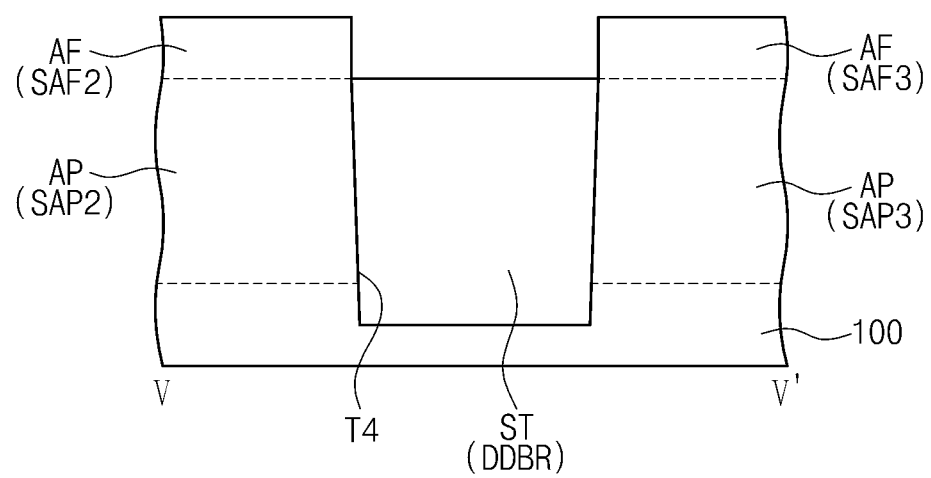
FIGS. 5D, 6D, and 7D are cross-sectional views taken along lines V-V' of FIGS. 5A, 6A, and 7A, respectively.
Figure 6A:
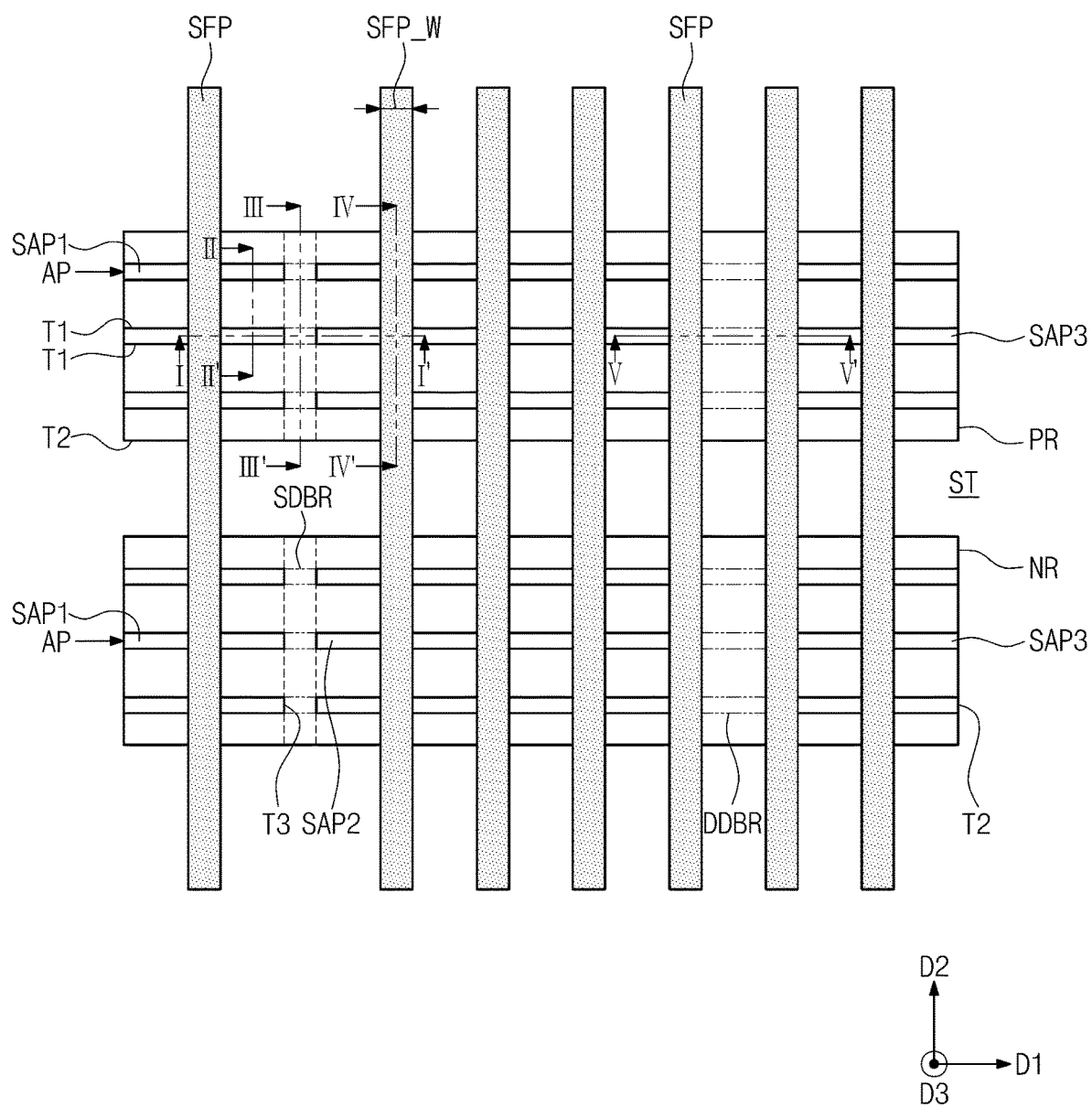
Figure 6B:
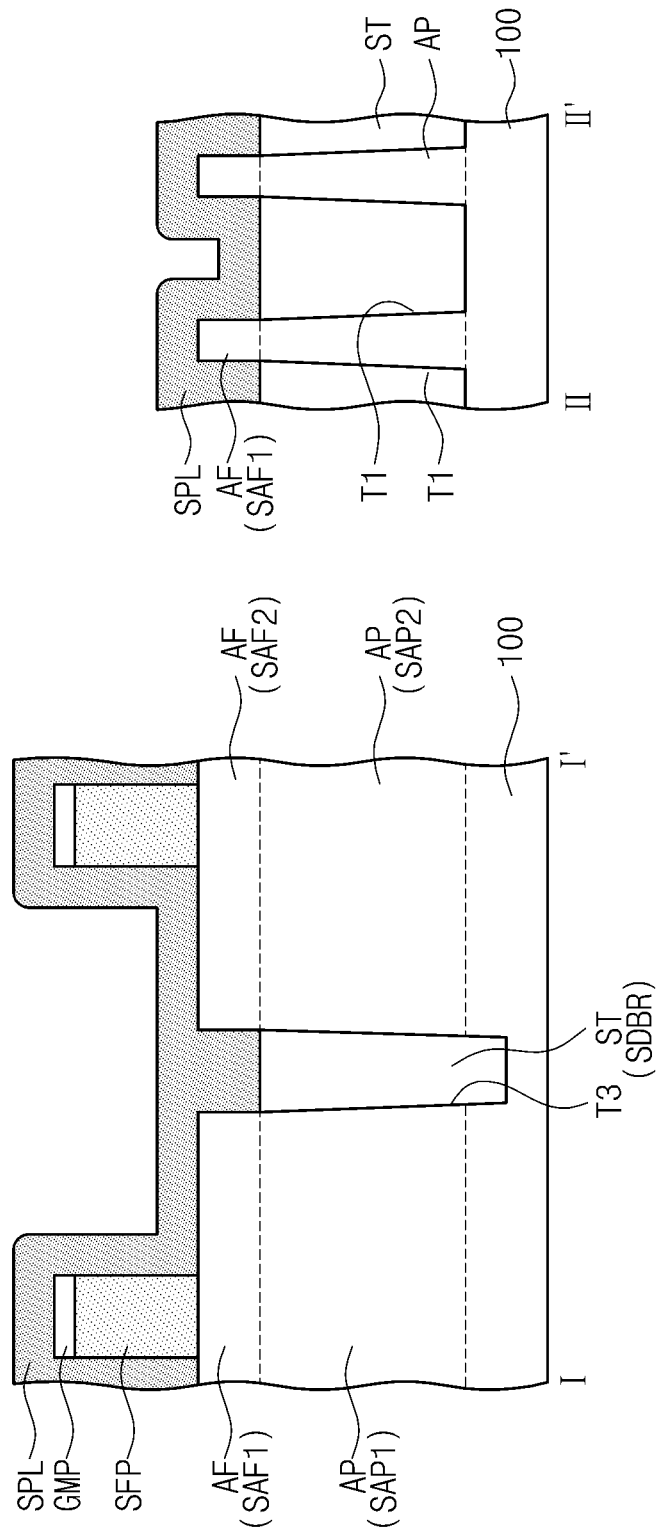
Figure 6C:
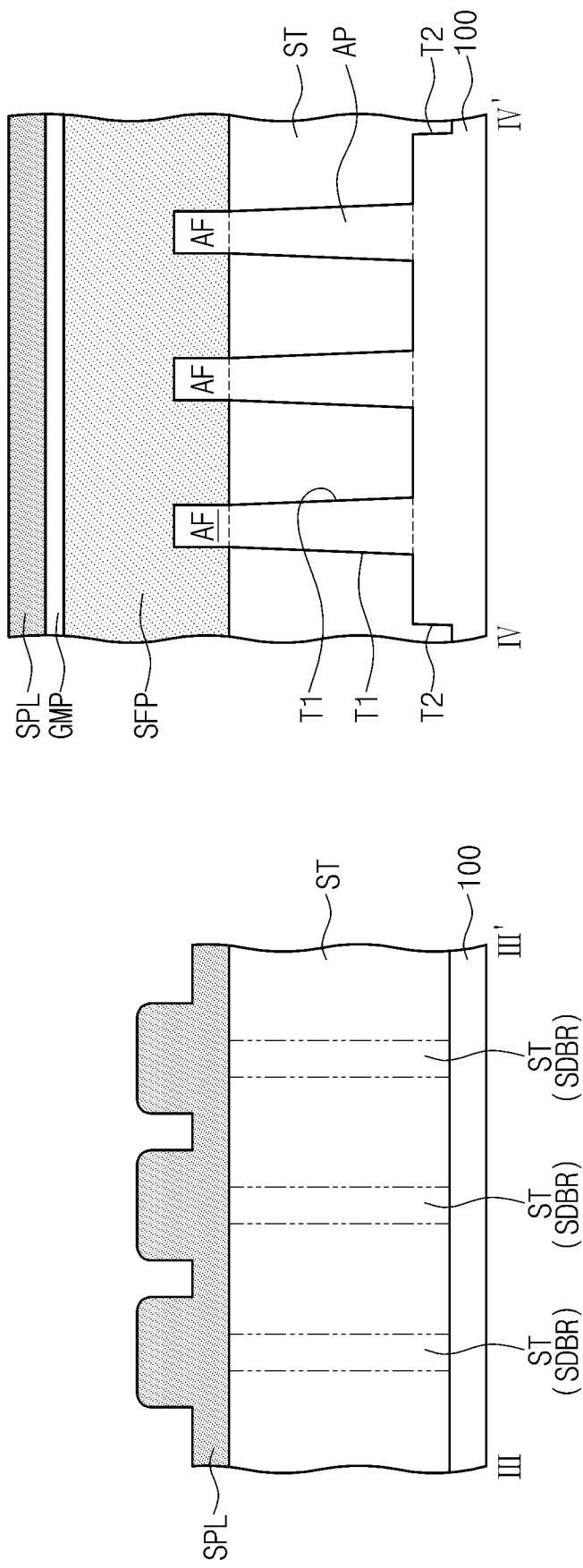
Figure 6D:
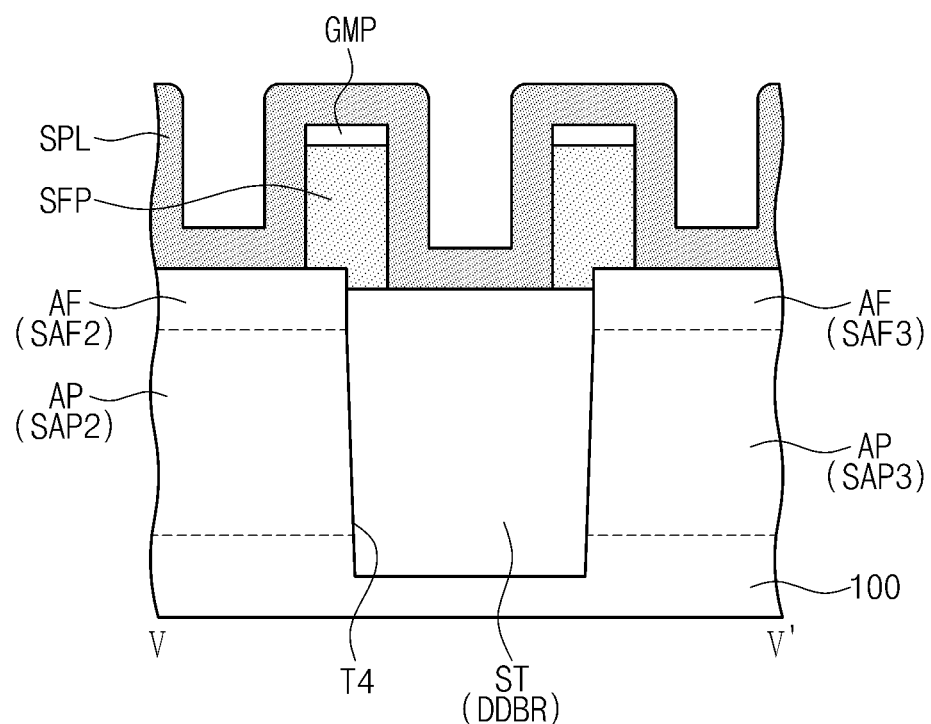
Figure 7A:
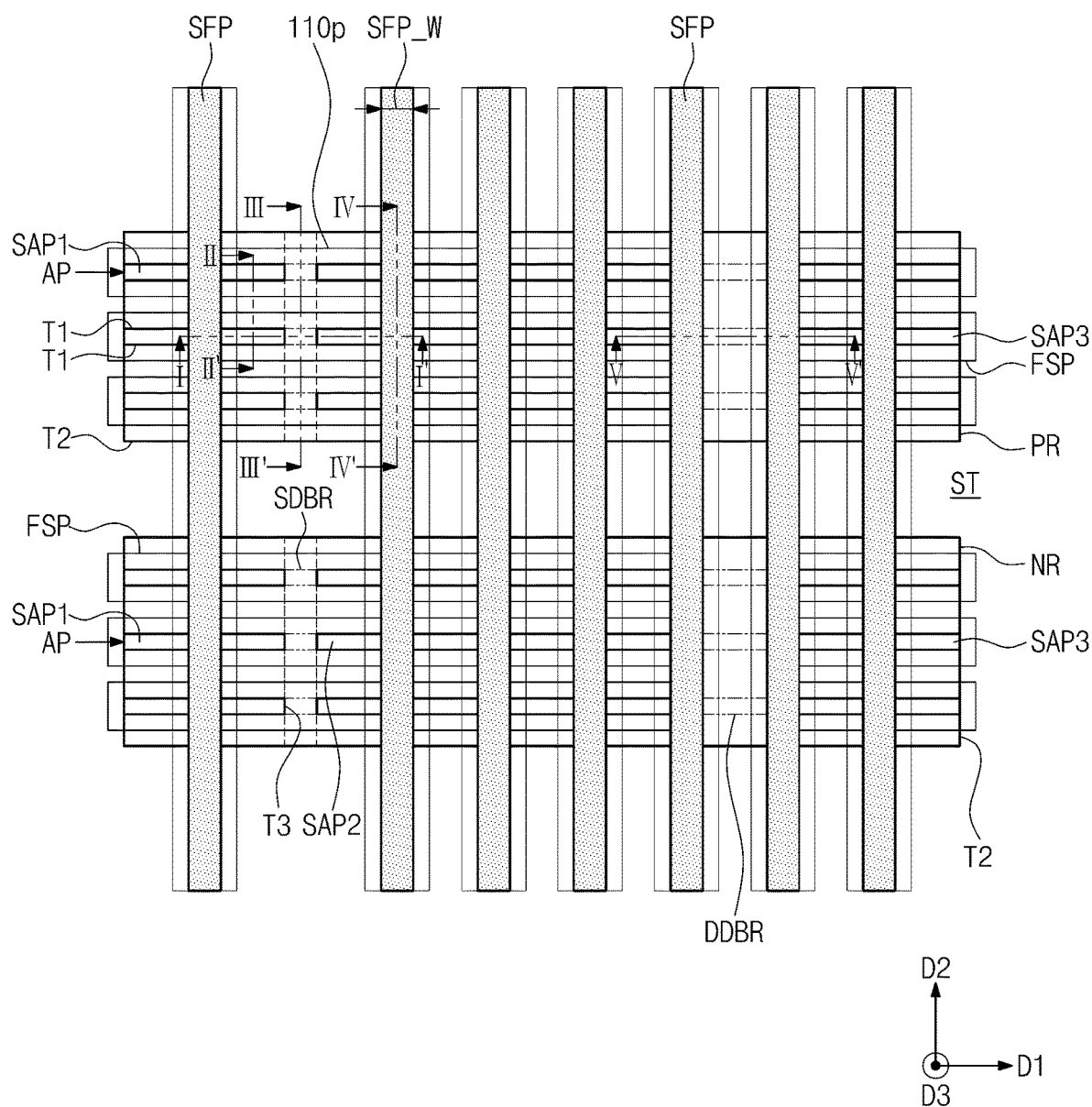
Figure 7B:
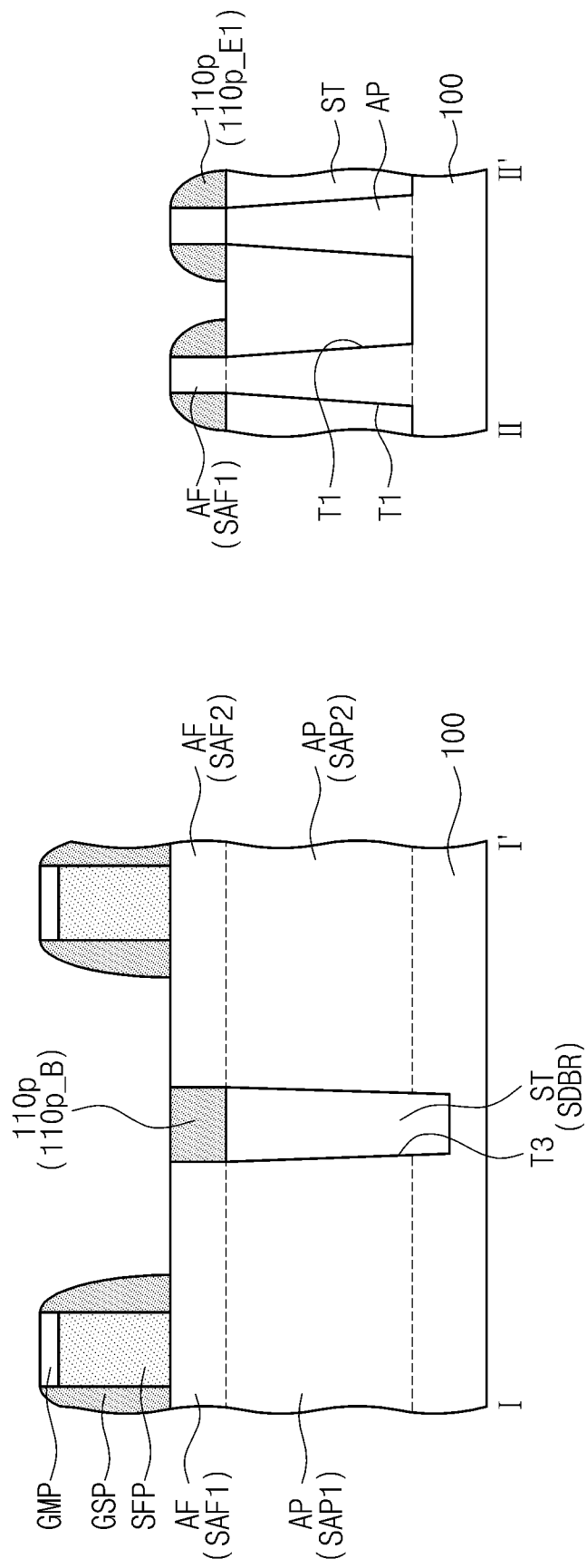
Figure 7C:
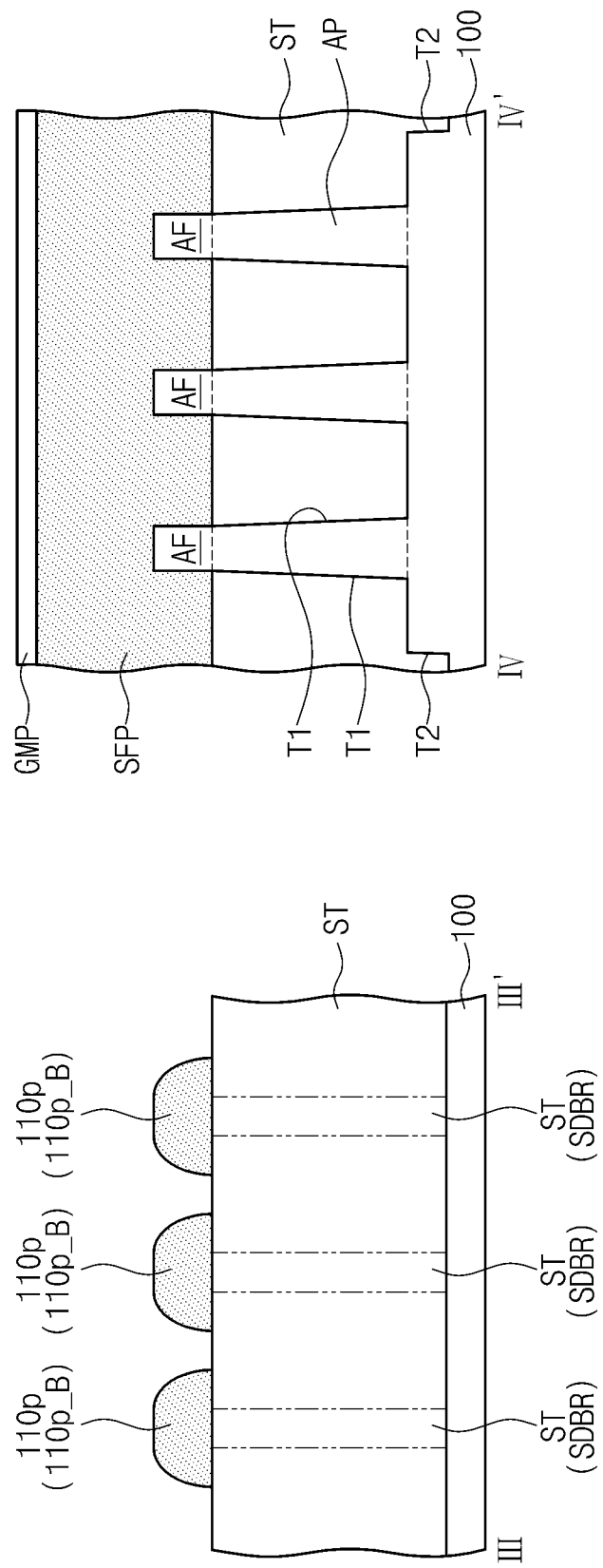
Figure 7D:
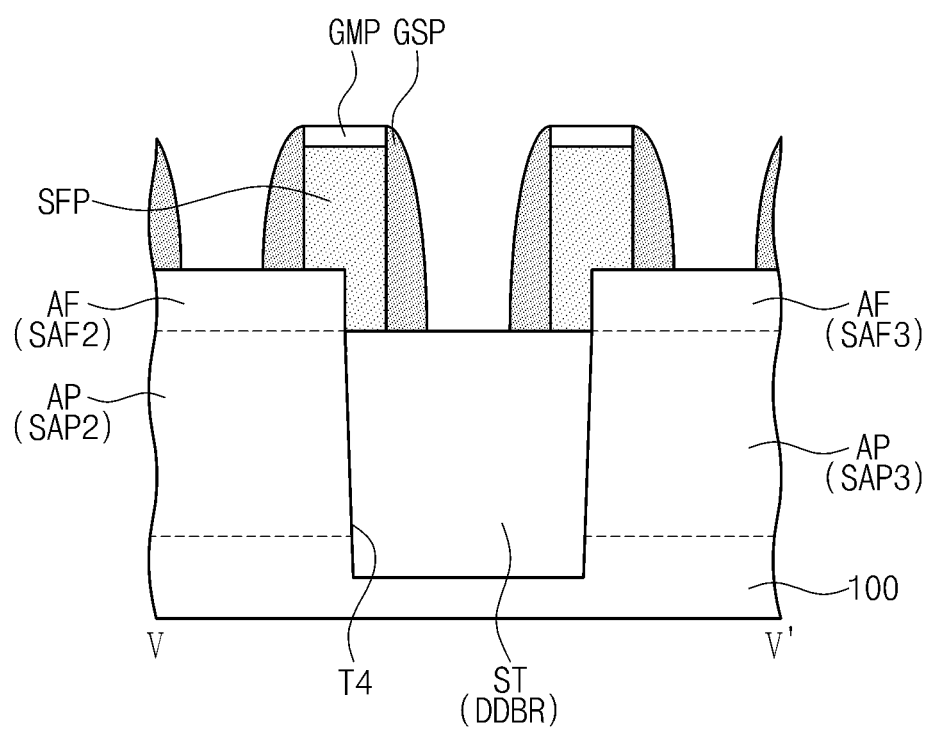
Figure 7E:
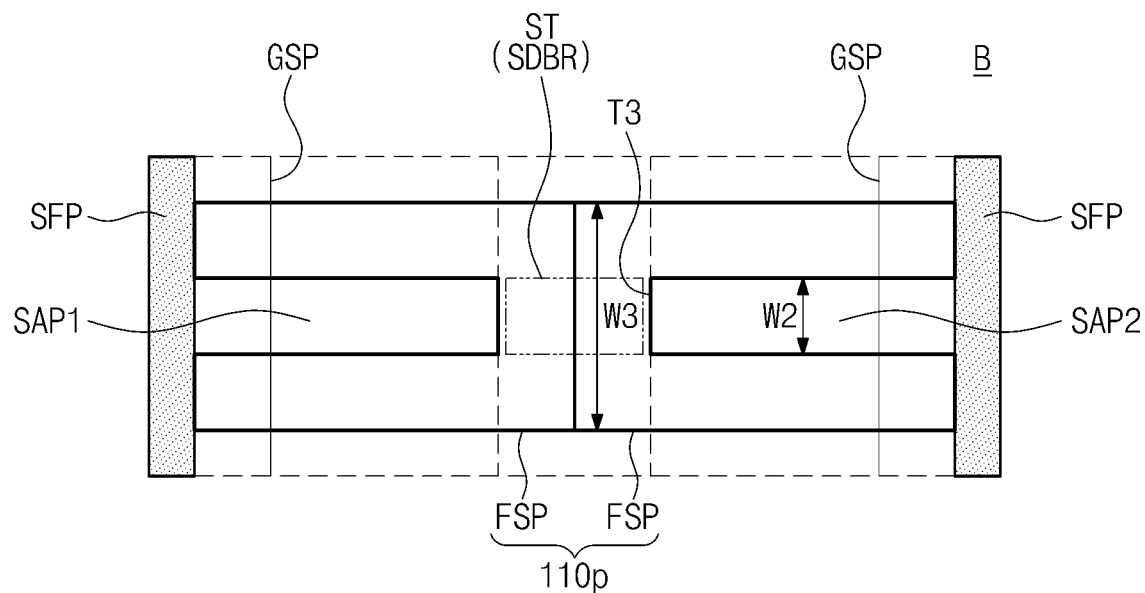
FIG. 7E is an enlarged view of a region 'B' of FIG. 7A.
Figure 7F:
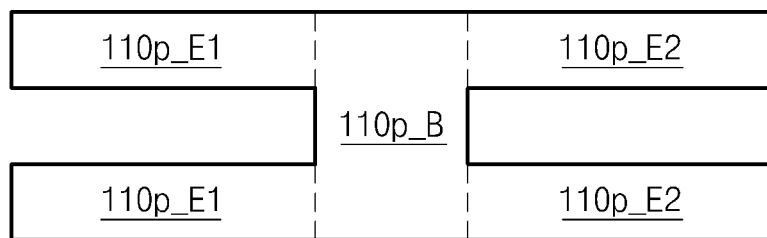
FIG. 7F is a plan view illustrating a preliminary isolation structure according to some embodiments of the inventive concepts.
Figure 8A:
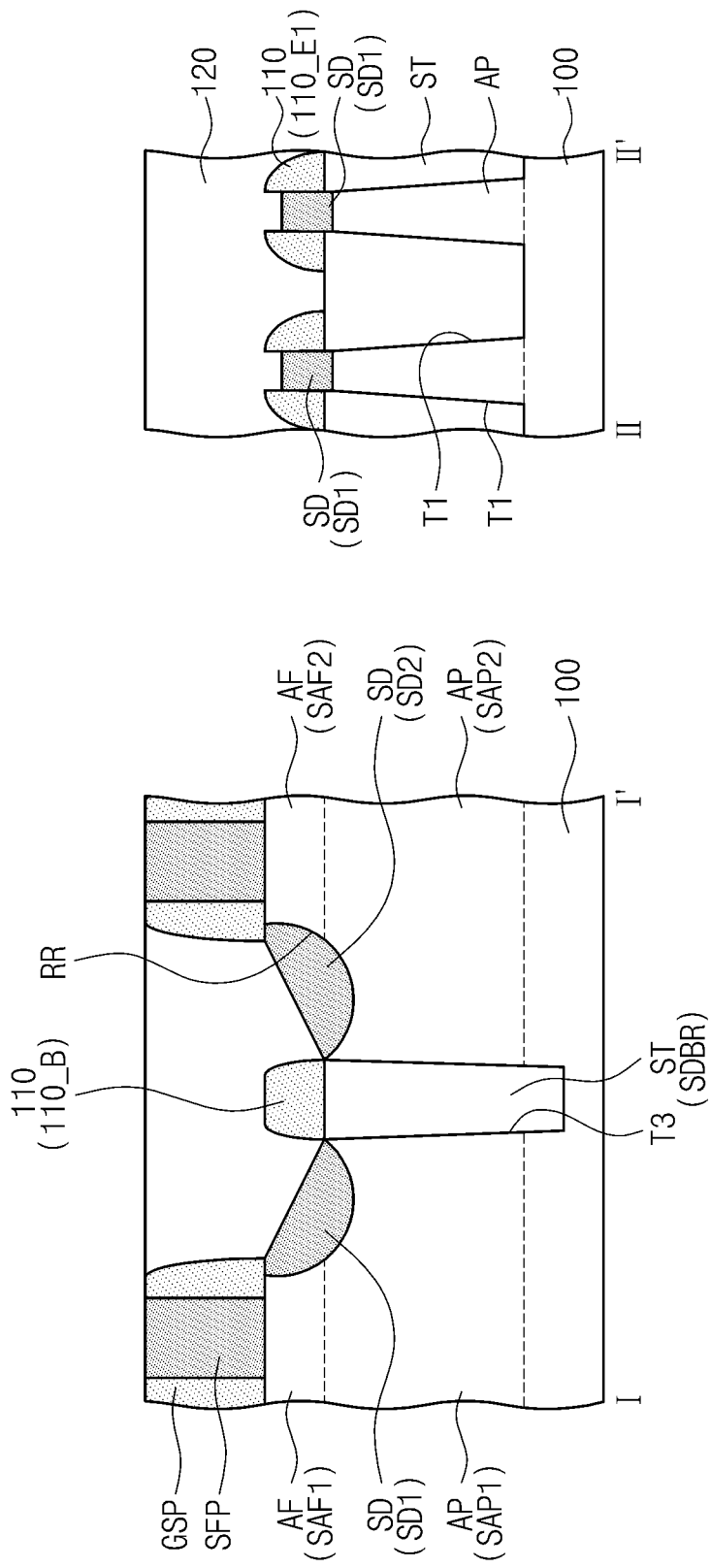
FIGS. 8A and 9A are cross-sectional views corresponding to the lines I-I' and II-II' of FIG. 1 to illustrate a method of manufacturing a semiconductor device according to some embodiments of the inventive concepts.
Figure 8B:
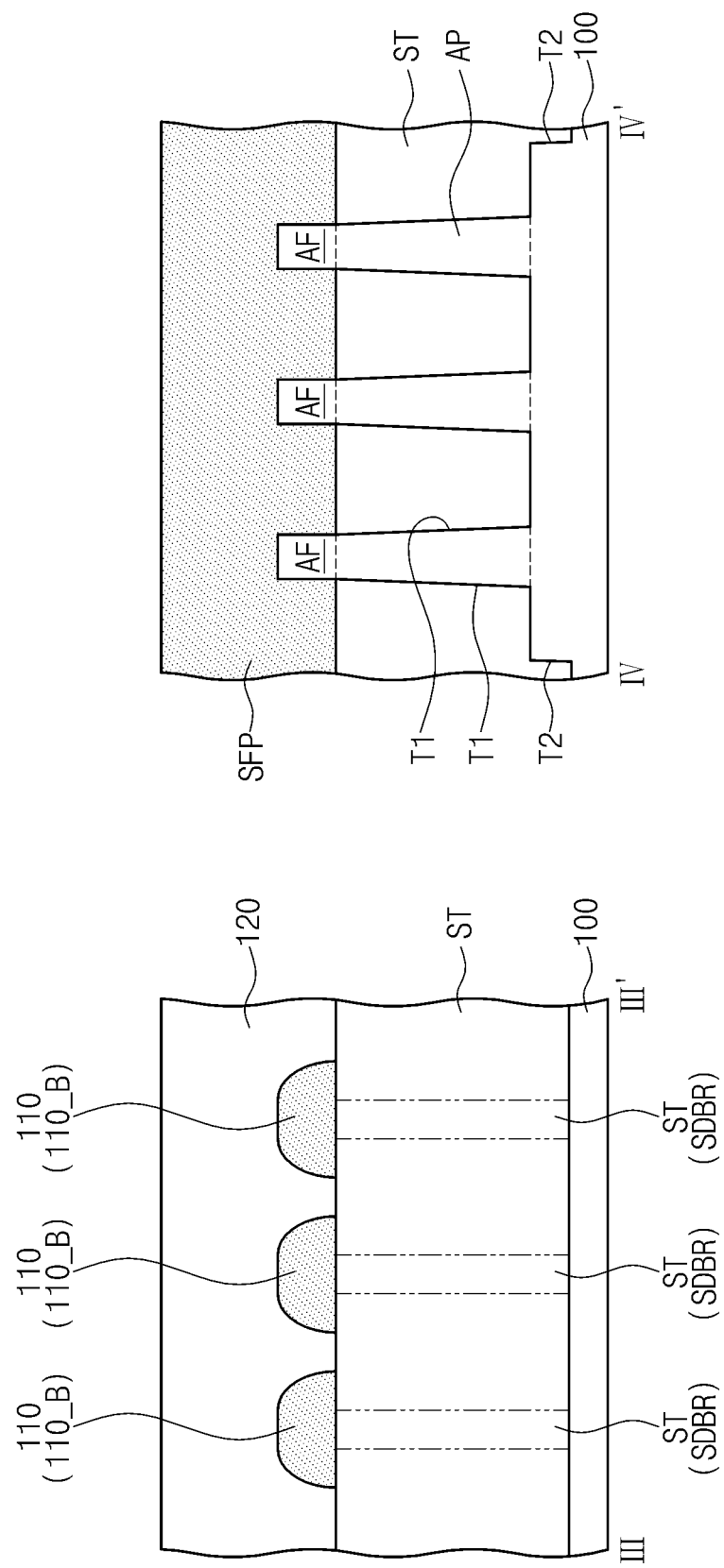
FIGS. 8B and 9B are cross-sectional views corresponding to the lines III-III' and IV-IV' of FIG. 1 to illustrate a method of manufacturing a semiconductor device according to some embodiments of the inventive concepts.
Figure 8C:
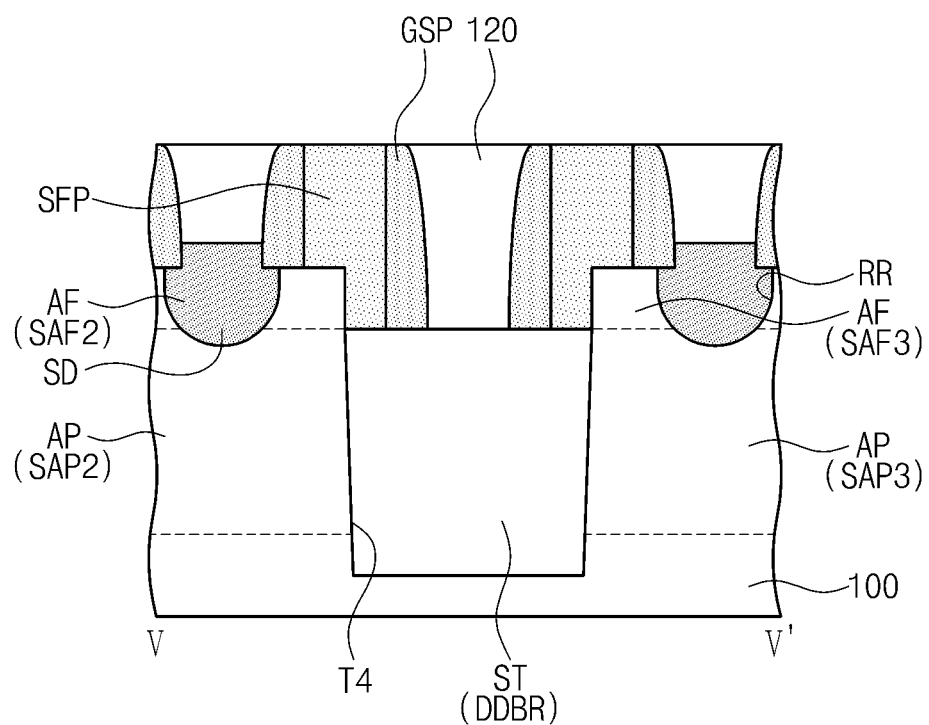
FIGS. 8C and 9C are cross-sectional views corresponding to the line V-V' of FIG. 1 to illustrate a method of manufacturing a semiconductor device according to some embodiments of the inventive concepts.
Figure 9A:
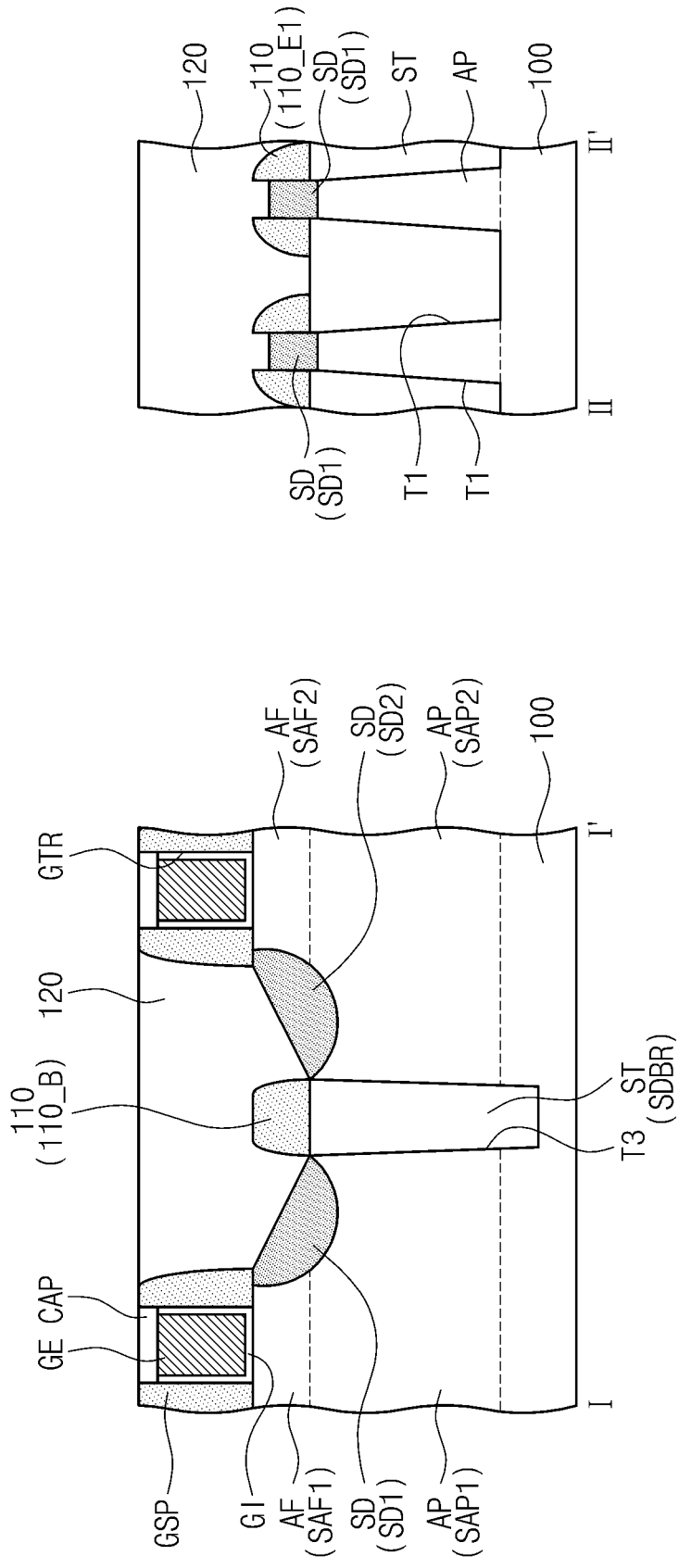
Figure 9B:
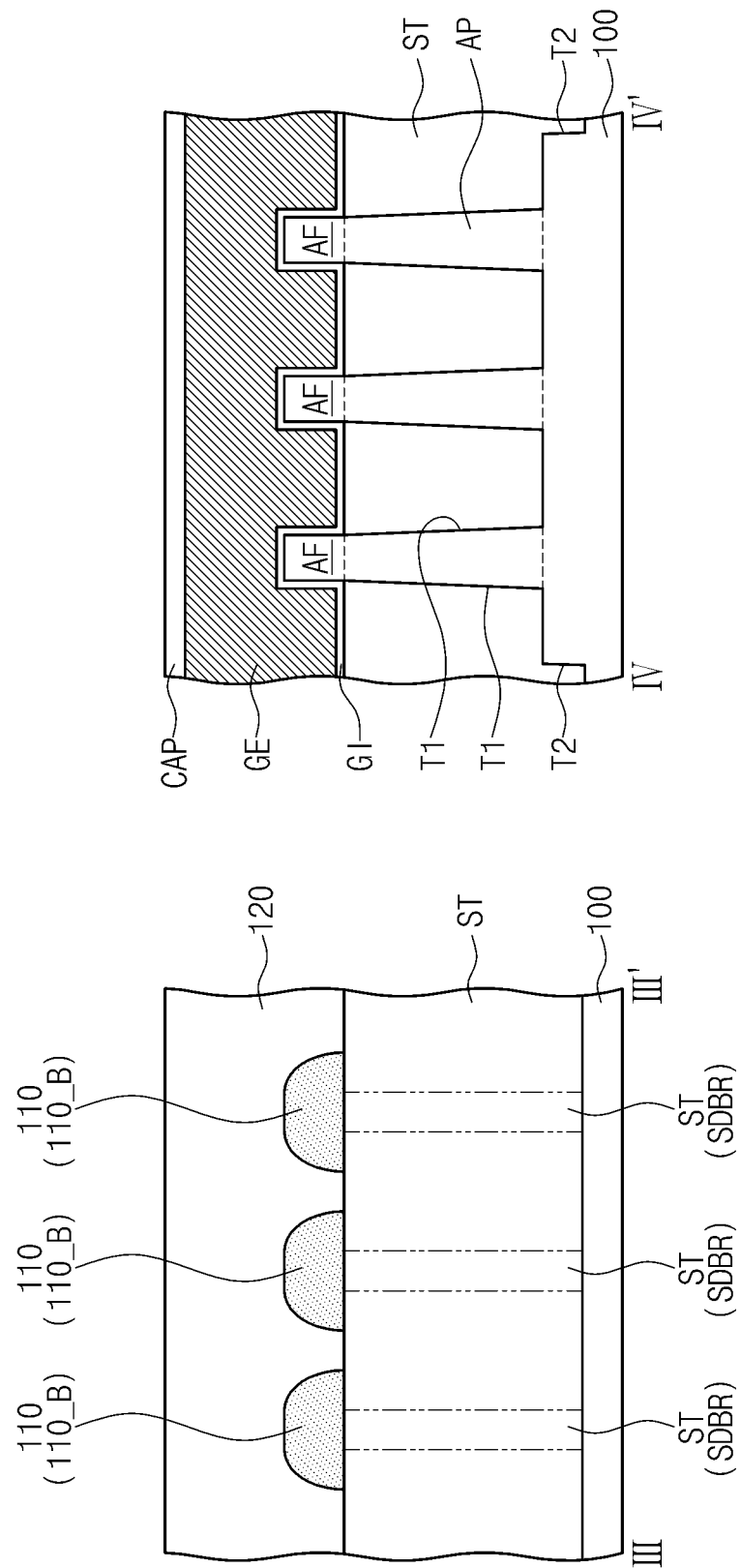
Figure 9C:
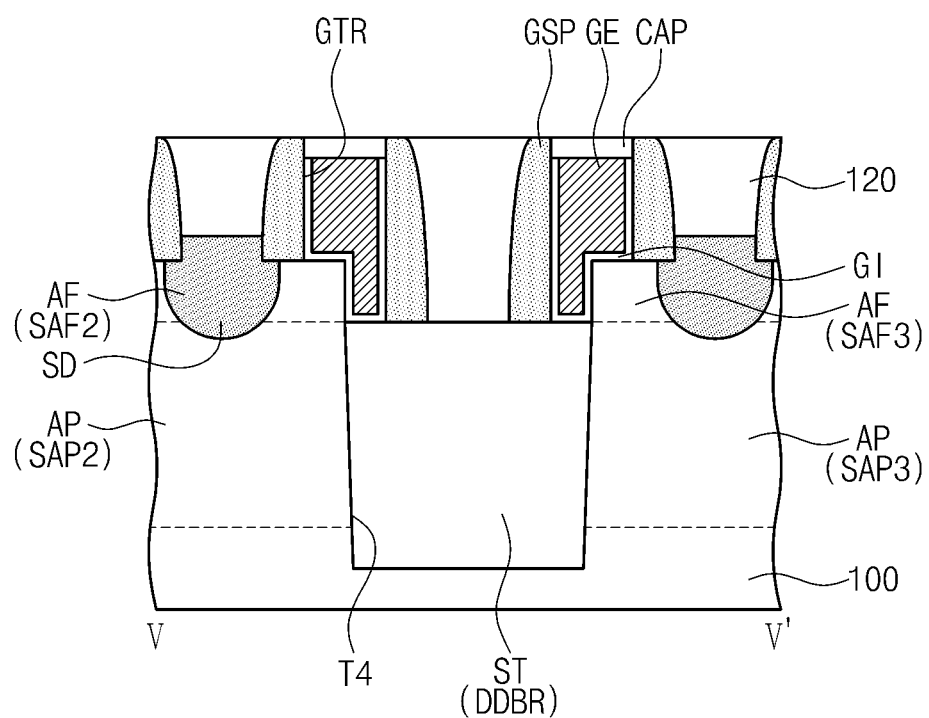

FIGS. 5A, 6A, and 7A are plan views illustrating a method of manufacturing a semiconductor device according to some embodiments of the inventive concepts. FIGS. 5B, 6B, and 7B are cross-sectional views taken along lines I-I' and II-II' of FIGS. 5A, 6A, and 7A, respectively. FIGS. 5C, 6C, and 7C are cross-sectional views taken along lines and IV-IV' of FIGS. 5A, 6A, and 7A, respectively. FIGS. 5D, 6D, and 7D are cross-sectional views taken along lines V-V' of FIGS. 5A, 6A, and 7A, respectively. FIG. 7E is an enlarged view of a region 'B' of FIG. 7A. FIG. 7F is a plan view illustrating a preliminary isolation structure according to some embodiments of the inventive concepts. FIGS. 8A and 9A are cross-sectional views corresponding to the lines I-I' and II-II' of FIG. 1 to illustrate a method of manufacturing a semiconductor device according to some embodiments of the inventive concepts. FIGS. 8B and 9B are cross-sectional views corresponding to the lines III-III' and IV-IV' of FIG. 1 to illustrate a method of manufacturing a semiconductor device according to some embodiments of the inventive concepts. FIGS. 8C and 9C are cross-sectional views corresponding to the line V-V' of FIG. 1 to illustrate a method of manufacturing a semiconductor device according to some embodiments of the inventive concepts. Hereinafter, a method of manufacturing a semiconductor device according to some embodiments of the inventive concepts will be described with reference to the drawings. Hereinafter, the same components as described with reference to FIGS. 1, 2A to 2C, 3A, and 3B will be indicated by the same reference numerals or the same reference designators. For the purpose of ease and convenience in explanation, the descriptions to the same technical features as mentioned above will be omitted or mentioned briefly.

Referring to FIGS. 5A to 5D, a substrate 100 may be provided. For example, the substrate 100 may be a silicon substrate, a germanium substrate, a silicon-on-insulator (SOI) substrate, or a germanium-on-insulator (GOI) substrate.

First trenches T1 extending in first direction D1 may be formed in an upper portion of the substrate 100. Active patterns AP extending in the first direction D1 may be defined by the first trenches T1. For example, each of the active patterns AP may be defined by a pair of the first trenches T1 adjacent to each other. The active patterns AP may be spaced apart from each other in a second direction D2 crossing (e.g., perpendicular to) the first direction D1. The first direction D1 and the second direction D2 may be substantially parallel to a top surface of the substrate 100.

A second trench T2 may be formed in the upper portion of the substrate 100 to define active regions PR and NR. The second trench T2 may include portions that extend in the first direction D1 to define sides, which are parallel to the first direction D1, of each of the active regions PR and NR. The second trench T2 may further include portions that extend in the second direction D2 to define sides, which are parallel to the second direction D2, of each of the active regions PR and NR. A depth of the second trench T2 may be greater than depths of the first trenches T1. The active regions PR and NR may include a P-channel MOSFET region PR and an N-channel MOSFET region NR which are spaced apart from each other.

Third and fourth trenches T3 and T4 extending in the second direction D2 may be formed in the upper portion of the substrate 100. The third and fourth trenches T3 and T4 may divide each of the active patterns AP into first, second, and third sub-active patterns SAP1, SAP2, and SAP3. The third trench T3 may separate the first and second sub-active patterns SAP1 and SAP2 of each of the active patterns AP from each other, and the fourth trench T4 may separate the second and third sub-active patterns SAP2 and SAP3 of each of the active patterns AP. The third trench T3 and the fourth trench T4 may be provided in each of the active regions PR and NR. A width T3_W of the third trench T3 in the first direction D1 may be smaller than a width T4_W of the fourth trench T4 in the first direction D1. For example, the width T3_T of the third trench T3 in the first direction D1 may be smaller than twice a width (SFP_W of FIG. 6A) of a sacrificial pattern (SFP of FIG. 6A) in the first direction D1. The sacrificial pattern SFP will be described later. A depth of the third trench T3 and a depth of the fourth trench T4 may be greater than the depth of the first trench T1.

In some embodiments, the third and fourth trenches T3 and T4 may be formed at the same time. In certain embodiments, the second to fourth trenches T2, T3, and T4 may be formed at the same time.

A device isolation layer ST may be formed to fill portions (i.e., lower portions) of the first to fourth trenches T1, T2, T3, and T4. Forming the device isolation layer ST may include forming an insulating layer (e.g., a silicon oxide layer) filling the first to fourth trenches T1 to T4 on the substrate 100, and planarizing and etching the insulating layer to expose upper portions (hereinafter, referred to as 'active fins AF') of the active patterns AP. The active fin AF may include first, second, and third sub-active fins SAF1, SAF2, and SAF3 which are included in the first, second, and third sub-active patterns SAP1, SAP2, and SAP3, respectively. The device isolation layer ST may include single diffusion break regions SDBR and double diffusion break region DDBR. Each of the single diffusion break regions SDBR may correspond to a portion of the device isolation layer ST, which is disposed between the first and second sub-active patterns SAP1 and SAP2 included in the same active pattern AP. Each of the double diffusion break regions DDBR may correspond to a portion of the device isolation layer ST, which is disposed between the second and third sub-active patterns SAP2 and SAP3 included in the same active pattern AP.

Referring to FIGS. 6A to 6D, sacrificial patterns SFP may be formed to cross the active fins AF. In some embodiments, the sacrificial patterns SFP may extend in the second direction D2 and may be spaced apart from each other in the first direction D1. Two of the sacrificial patterns SFP may be formed to cross and/or overlap the double diffusion break regions DDBR. The sacrificial patterns SFP may not be formed on the single diffusion break regions SDBR. Forming the sacrificial patterns SFP may include forming a sacrificial layer covering an entire top surface of the substrate 100, forming gate mask patterns GMP on the sacrificial layer, and patterning the sacrificial layer using the gate mask patterns GMP as etch masks. For example, the sacrificial layer may include a poly-silicon layer. The gate mask patterns GMP may include, for example, silicon nitride or silicon oxynitride.

A spacer layer SPL may be formed on the substrate 100 to conformally cover the device isolation layer ST, the active patterns AP, and the sacrificial patterns SFP. The spacer layer SPL is omitted in FIG. 6A to clearly illustrate other components. The spacer layer SPL may cover sidewalls of the sacrificial patterns SFP, sidewalls of the active fins AF exposed by the sacrificial patterns SFP, and a top surface of the device isolation layer ST. Portions of the spacer layer SPL respectively covering the sidewalls of the first and second sub-active fins SAF1 and SAF2 included in the same active fin AF may be in contact with each other on the single diffusion break region SDBR so as to be merged with each other. Thus, as illustrated in FIGS. 6B and 6C, the portion of the spacer layer SPL formed on the single diffusion break region SDBR may have a thickness greater than those of other portions of the spacer layer SPL. For example, the spacer layer SPL may include at least one of silicon oxide, silicon nitride, silicon oxynitride, silicon carbonitride (SiCN), or silicon-carbon oxynitride (SiCON).

Referring to FIGS. 7A to 7D, the spacer layer SPL may be anisotropically etched to form gate spacers GSP, preliminary isolation structures 110p, and fin spacers FSP. For example, a blanket anisotropic etching process may be performed on the spacer layer SPL until top surfaces of the active patterns AP are exposed, thereby forming the gate spacers GSP, the preliminary isolation structures 110p, and the fin spacers FSP.

The gate spacers GSP may be formed on both sidewalls of each of the sacrificial patterns SFP. The gate spacers GSP may correspond to portions of the spacer layer SPL, which remain on the both sidewalls of each of the sacrificial patterns SFP.

The fin spacers FSP may be formed on both sidewalls of each of the active fins AF exposed by the sacrificial patterns SFP. The fin spacers FSP may correspond to portions of the spacer layer SPL, which remain on the both sidewalls of each of the active fins AF. The fin spacers FSP may extend to the sidewalls of the sacrificial patterns SFP so as to be connected to the gate spacers GSP.

Referring to FIGS. 7A to 7D, 7E, and 7F, a pair of the fin spacers FSP formed on the sidewalls of the first and second sub-active fins SAF1 and SAF2 included in the same active fin AF and merged with each other on the single diffusion break region SDBR may constitute the preliminary isolation structure 110p.

The preliminary isolation structures 110p may be formed on the device isolation layer ST. Each of the preliminary isolation structures 110p may include a preliminary body portion 110p_B, a pair of first preliminary extensions 110p_E1, and a pair of second preliminary extensions 110p_E2. The preliminary body portion 110p_B may cover the single diffusion break region SDBR and may be disposed on the device isolation layer ST between the first and second sub-active patterns SAP1 and SAP2 included in the same active pattern AP. A width W3 of the preliminary body portion 110p_B in the second direction D2 may be greater than a width W2 of the active pattern AP in the second direction D2. The first preliminary extensions 110p_E1 may extend along both sidewalls, extending in the first direction D1, of the first sub-active fin SAF1, respectively. The second preliminary extensions 110p_E2 may extend along both sidewalls, extending in the first direction D1, of the second sub-active fin SAF2, respectively. Thus, each of the preliminary isolation structures 110p may have an H-shape in a plan view. In some embodiments, top surfaces of the preliminary isolation structures 110P may be disposed at the substantially same level as top surfaces of the active patterns AP.

Referring to FIGS. 1 and 8A to 8C, source/drain regions SD may be formed on the active patterns AP at both sides of each of the sacrificial patterns SFP. Forming the source/drain regions SD may include etching the active fins AF using the gate mask patterns GMP and the gate spacers GSP as etch masks to form recess regions RR, and performing a selective epitaxial growth (SEG) process using the active patterns AP exposed by the recess regions RR as a seed. End portions of the first and second sub-active fins SAF1 and SAF2, which face each other, may be removed to form the recess regions RR. Here, the end portions of the first and second sub-active fins SAF1 and SAF2 may be adjacent to the single diffusion break region SDBR. Source/drain regions SD1 and SD2 grown in the recess regions RR formed by the removal of the end portions of the first and second sub-active fins SAF1 and SAF2 may have the substantially same shapes as the first and second source/drain regions SD1 and SD2 described with reference to FIGS. 1 and 2A.

The source/drain regions SD may include a different semiconductor element from the substrate 100. In some embodiments, the source/drain regions SD may include a semiconductor element of which a lattice constant is greater or smaller than that of the semiconductor element of the substrate 100. Since the source/drain regions SD include a different semiconductor element from the substrate 100, a compressive strain or a tensile strain may be provided to the active fins AF. In some embodiments, when the substrate 100 is a silicon substrate, the source/drain regions SD in the P-channel MOSFET region PR may include silicon-germanium (SiGe) or germanium (Ge). In this case, the compressive strain may be provided to the active fins AF of the P-channel MOSFET region PR. In some embodiments, when the substrate 100 is a silicon substrate, the source/drain regions SD in the N-channel MOSFET region NR may include silicon carbide (SiC). In this case, the tensile strain may be provided to the active fins AF of the N-channel MOSFET region NR.

The source/drain regions SD may be doped with dopants of a second conductivity type different from a first conductivity type of the active patterns AP. In some embodiments, the source/drain regions SD may be doped with the dopants of the second conductivity type in-situ during the formation of the source/drain regions SD. In certain embodiments, the dopants of the second conductivity type may be provided into the source/drain regions SD by an ion implantation process after the formation of the source/drain regions SD.

During the process of forming the recess regions RR, the preliminary isolation structures 110p may be partially etched to be formed into isolation structures 110. Shapes of the isolation structures 110 may be varied according to a ratio of an etch rate of the active fins AF to an etch rate of the preliminary isolation structures 110p in the process of forming the recess regions RR.

In an embodiment in which the etch rate ratio of the active fins AF to the preliminary isolation structures 110p is high in the process of forming the recess regions RR, the preliminary isolation structures 110p may be hardly etched. Thus, each of the isolation structures 110 may include a body portion 110_B and first and second extensions 110_E1 and 110_E2, as illustrated in FIGS. 1, 2A to 2C, 3A, and 3B. For example, the top surface of the body portion 110_B and the top surfaces of the first and second extensions 110_E1 and 110_E2 may be disposed at the substantially same level as the top surface of the active fin AF. According to this embodiment, the fin spacers FSP may be hardly etched but may remain.

In an embodiment in which the etch rate ratio of the active fins AF to the preliminary isolation structures 110p is low in the process of forming the recess regions RR, the first and second preliminary extensions 110p_E1 and 110p_E2 of the preliminary isolation structures 110p may be removed but the preliminary body portions 110p_B of the preliminary isolation structures 110p may remain. Thus, the isolation structures 110 may have only the body portions 110_B, as described with reference to FIGS. 4A to 4C. In this case, a level of the top surface of the body portion 110_B may be lower than a level of the top surfaces of the active fins AF. According to this embodiment, the fin spacers FSP may be removed.

In an embodiment in which an etch rate ratio is between the etch rate ratios of the two embodiments described above, the preliminary body portions 110p_B and the first and second preliminary extensions 110p_E1 and 110p_E2 of the preliminary isolation structures 110p may be partially etched. In this case, each of the isolation structures 110 may include the body portion 110_B and the first and second extensions 110_E1 and 110_E2, as described with reference to FIGS. 1, 2A to 2C, 3A, and 3B. In this case, the first and second preliminary extensions 110p_E1 and 110p_E2 having relatively small widths in the second direction D2 may be etched more than the preliminary body portion 110p_B having a relatively great width in the second direction D2. Thus, in this embodiment, the top surfaces of the first and second extensions 110_E1 and 110_E2 may be disposed at a lower level than the top surface of the body portion 110_B and the top surface of the body portion 110_B and the top surfaces of the first and second extensions 110_E1 and 110_E2 may be disposed at lower levels than the top surface of the active fin AF. According to this embodiment, the fin spacers FSP may be partially etched such that top surfaces of the fin spacers FSP may be disposed at a lower level than the top surfaces of the active fins AF.

Next, a first interlayer insulating layer 120 may be formed to cover the source/drain regions SD. In some embodiments, the first interlayer insulating layer 120 may be formed on an entire top surface of the substrate 100 to cover the source/drain regions SD, the sacrificial patterns SFP, and the gate mask patterns GMP. For example, the first interlayer insulating layer 120 may include a silicon oxide layer and may be formed by a flowable chemical vapor deposition (FCVD) process.

Thereafter, the first interlayer insulating layer 120 may be planarized until the top surfaces of the sacrificial patterns SFP are exposed. The planarization process of the first interlayer insulating layer 120 may be performed using an etch-back process or a chemical mechanical polishing (CMP) process. The gate mask patterns GMP may be removed by the planarization process, and thus the top surfaces of the sacrificial patterns SFP may be exposed. For example, upper portions of the gate spacers GSP may be removed by the planarization process. Thus, a top surface of the first interlayer insulating layer 120 may be substantially coplanar with the top surfaces of the sacrificial patterns SFP and top surfaces of the gate spacers GSP.

Referring to FIGS. 1 and 9A to 9C, the sacrificial patterns SFP may be replaced with gate structures. Each of the gate structures may include a gate insulating pattern GI, a gate electrode GE, and a capping pattern CAP.

First, the sacrificial patterns SFP may be selectively removed to form gate trenches GTR. The active fins AF may be partially exposed through the gate trenches GTR.

A gate insulating layer may be formed in the gate trenches GTR. The gate insulating layer may not completely fill the gate trenches GTR but may be conformally formed in the gate trenches GTR. The gate insulating layer may be formed by, for example, an atomic layer deposition (ALD) process. For example, the gate insulating layer may include at least one of silicon oxide, silicon oxynitride, or a high-k dielectric material of which a dielectric constant is higher than that of silicon oxide.

A gate electrode layer may be formed on the gate insulating layer to fill the gate trenches GTR. For example, the gate electrode layer may include at least one of a doped semiconductor material, a metal, or a conductive metal nitride. The gate electrode layer may be formed by a deposition process such as a chemical vapor deposition (CVD) process or a sputtering process.

The gate electrode layer and the gate insulating layer may be planarized until the top surface of the first interlayer insulating layer 120 is exposed. As a result, the gate insulating pattern GI and the gate electrode GE may be locally formed in each of the gate trenches GTR. The planarization process of the gate electrode layer and the gate insulating layer may be performed using, for example, a CMP process.

Upper portions of the gate electrodes GE may be recessed, and then the capping patterns CAP may be formed on the gate electrodes GE, respectively. For example, the upper portions of the gate electrodes GE may be removed by a selective etching process. Top surfaces of the gate electrodes GE etched by the selective etching process may be lower than the top surface of the first interlayer insulating layer 120. According to some embodiments, portions of the gate insulating patterns GI higher than the recessed top surfaces of the gate electrodes GE may be removed after the upper portions of the gate electrodes GE are recessed. The capping patterns CAP may be formed to cover the recessed top surfaces of the gate electrodes GE, respectively. The capping patterns CAP may completely fill empty regions defined on the recessed gate electrodes GE in the gate trenches GTR, respectively. For example, the capping patterns CAP may be insulator patterns. The capping patterns CAP may include, for example, at least one of silicon oxide, silicon nitride, silicon oxynitride, silicon carbonitride (SiCN), or silicon-carbon oxynitride (SiCON).

Referring again to FIGS. 1 and 2A to 2C, a second interlayer insulating layer 122 may be formed to cover the first interlayer insulating layer 120 and the capping patterns CAP. For example, the second interlayer insulating layer 122 may include at least one of a silicon oxide layer or a silicon oxynitride layer.

Next, contacts 130 may be formed to penetrate the second and first interlayer insulating layers 122 and 120. The contacts 130 may be connected to the source/drain regions SD. For example, the contacts 130 may include a conductive material such as tungsten. Interconnections (not shown) may be formed on the second interlayer insulating layer 122 so as to be electrically connected to the contacts 130.

According to some embodiments of the inventive concepts, the first and second sub-active patterns SAP1 and SAP2 may be isolated from each other by a simple structure including the single diffusion break region SDBR of the device isolation layer ST and the isolation structure 110. The device isolation layer ST and the isolation structure 110 may be formed by relatively simple processes, as described above. Thus, according to some embodiments of the inventive concepts, a manufacture cost of the semiconductor device may be reduced or minimized.

Figure 10:
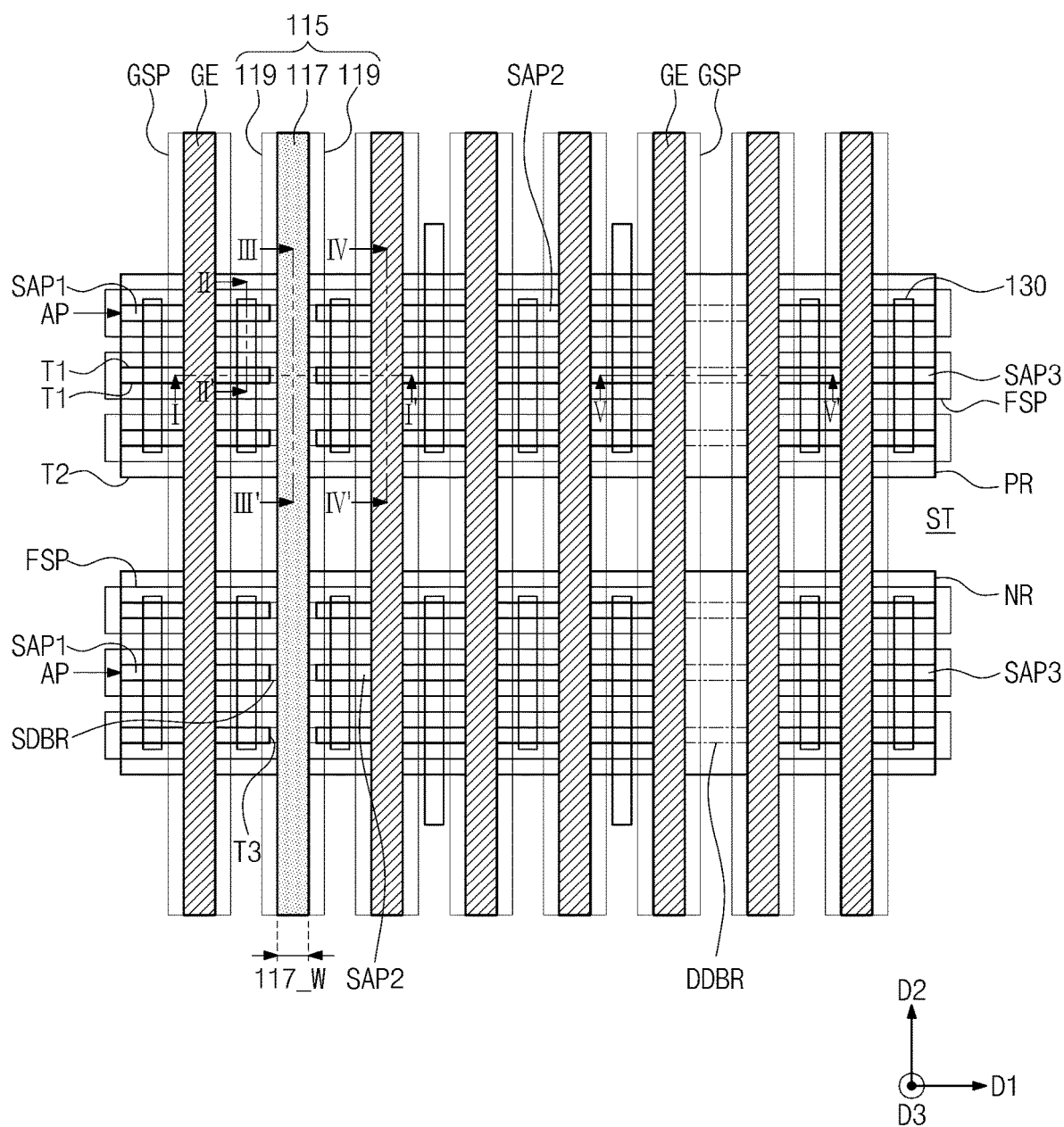
FIG. 10 is a plan view illustrating a semiconductor device according to some embodiments of the inventive concepts.
Figure 11A:
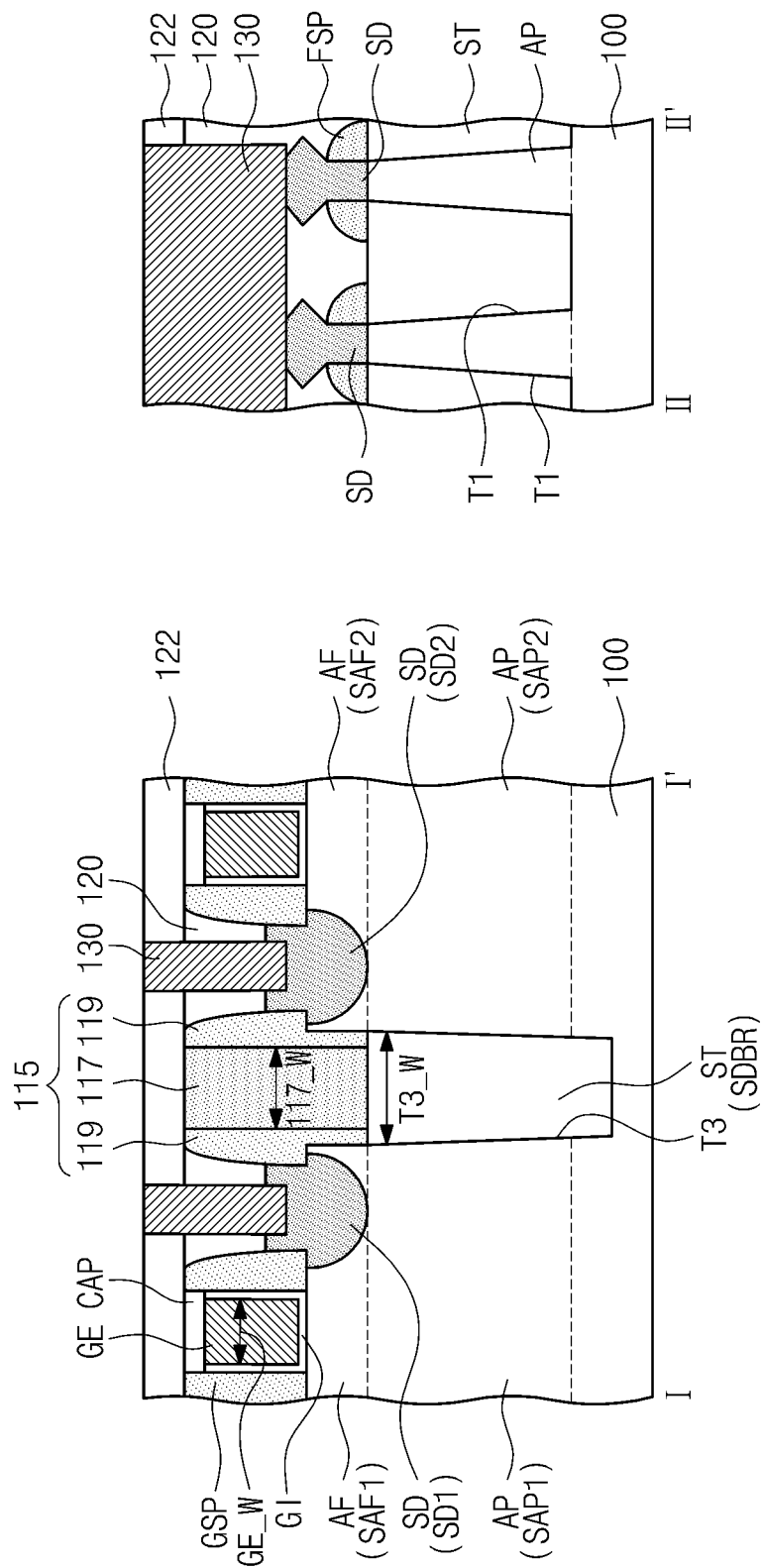
FIG. 11A is cross-sectional views taken along lines I-I' and II-II' of FIG. 10.
Figure 11B:
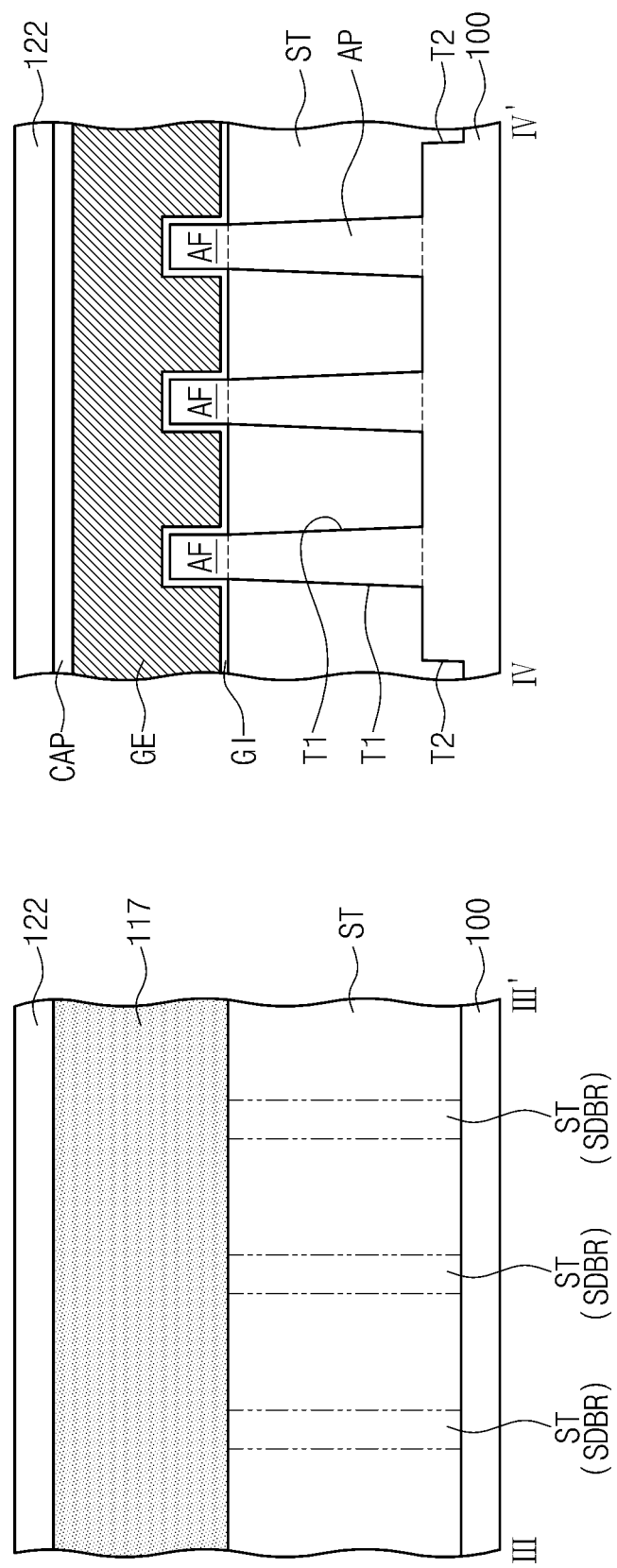
FIG. 11B is cross-sectional views taken along lines III-III' and IV-IV' of FIG. 10.
Figure 11C:
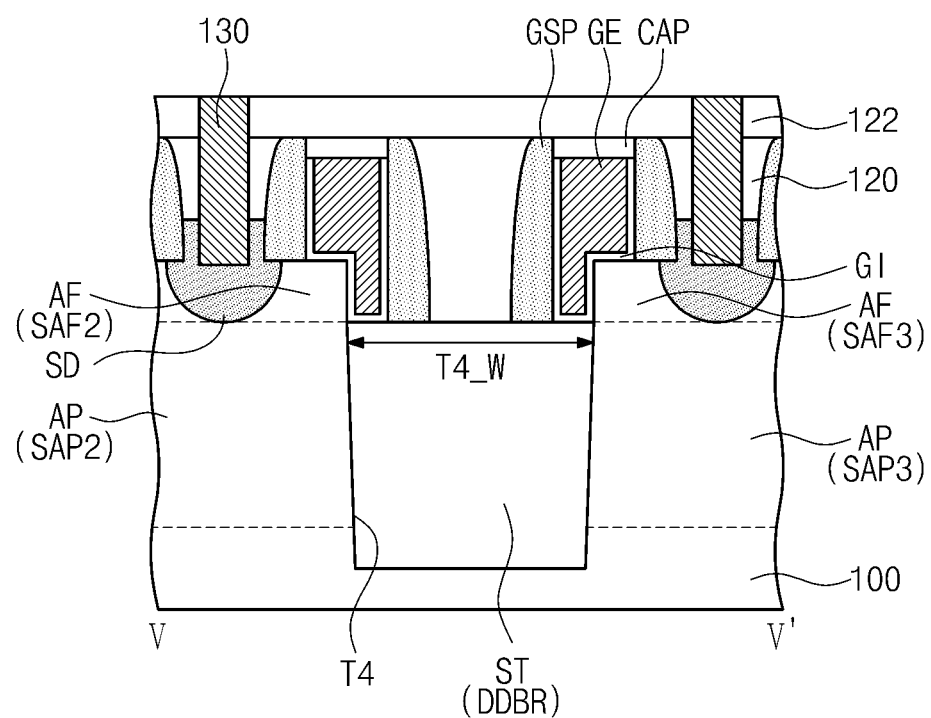
FIG. 11C is a cross-sectional view taken along a line V-V' of FIG. 10.
Figure 12A:
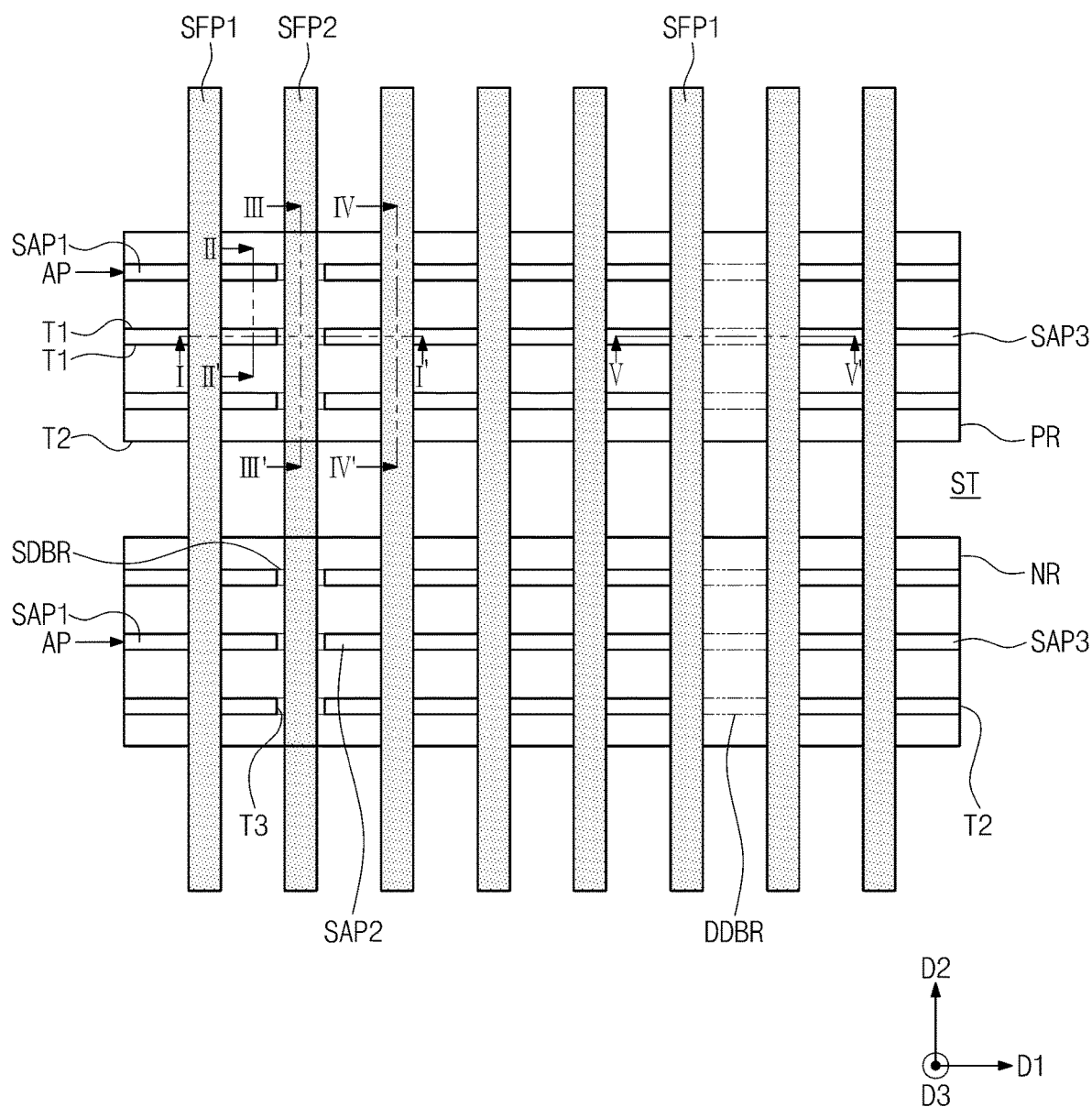
FIGS. 12A, 13A, 14A, 15A, and 16A are plan views illustrating a method of manufacturing a semiconductor device according to some embodiments of the inventive concepts.
Figure 12B:
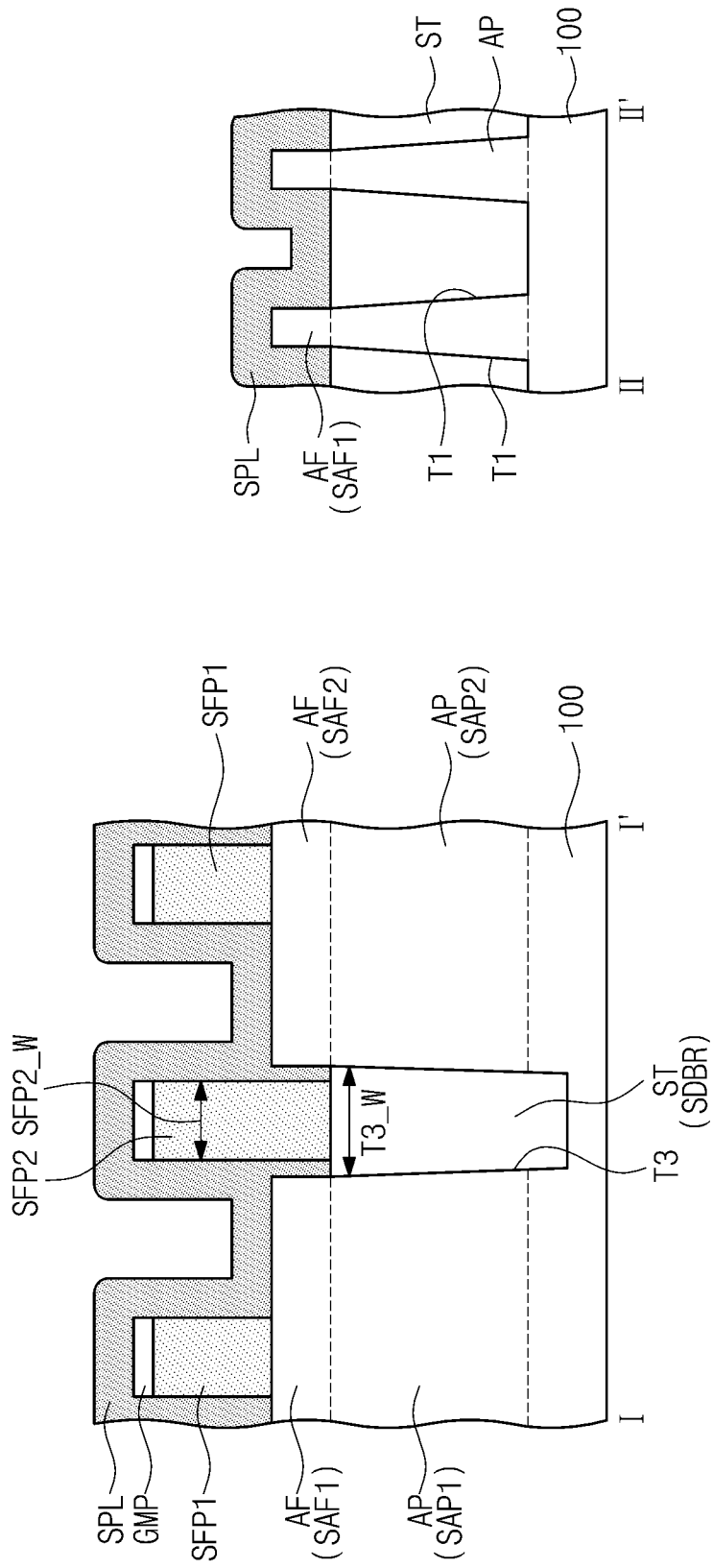
FIGS. 12B, 13B, 14B, 15B, and 16B are cross-sectional views taken along lines I-I' and II-II' of FIGS. 12A, 13A, 14A, 15A, and 16A, respectively.
Figure 12C:
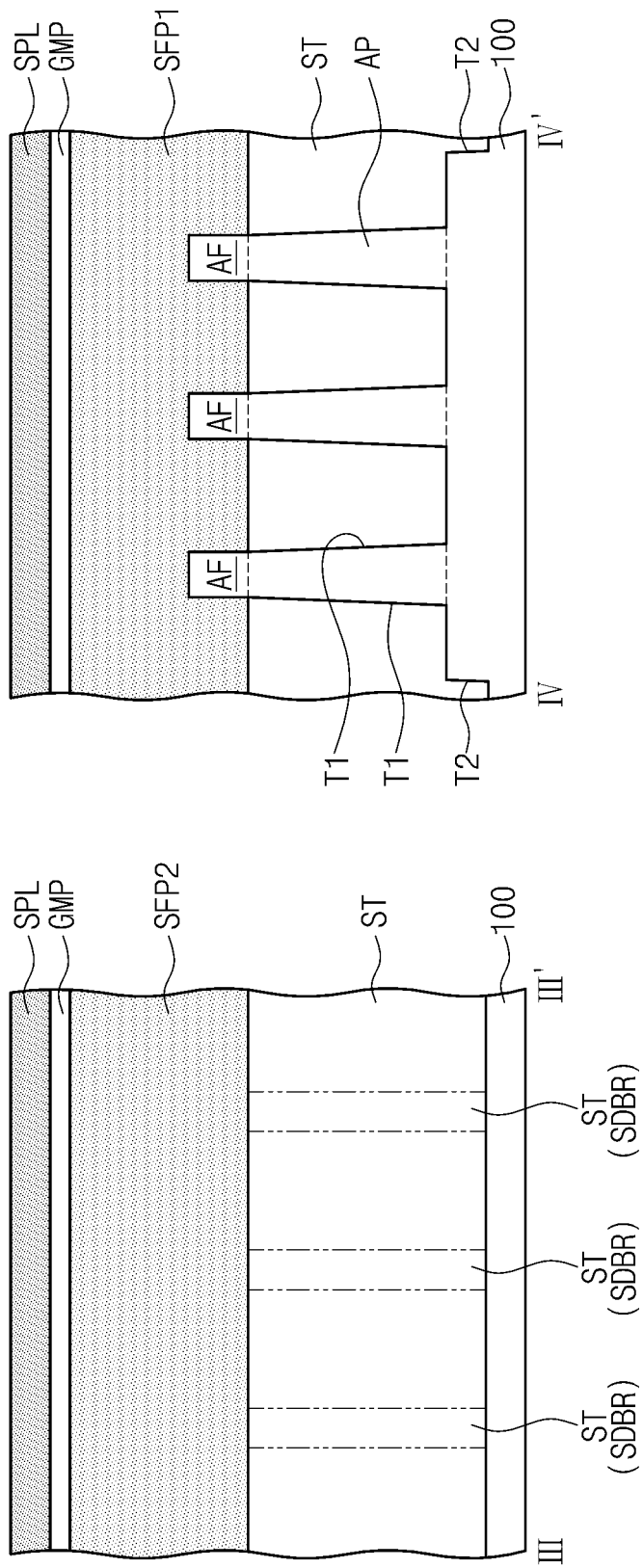
FIGS. 12C, 13C, 14C, 15C, and 16C are cross-sectional views taken along lines III-III' and IV-IV' of FIGS. 12A, 13A, 14A, 15A, and 16A, respectively.
Figure 12D:
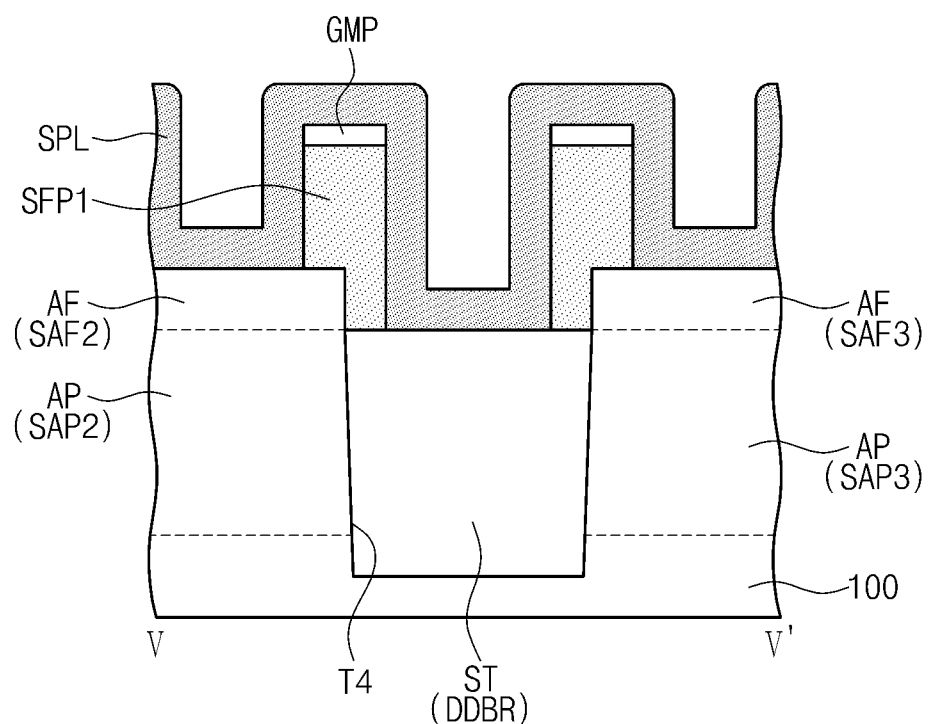
FIGS. 12D, 13D, 14D, 15D, and 16D are cross-sectional views taken along lines V-V' of FIGS. 12A, 13A, 14A, 15A, and 16A, respectively.

FIG. 10 is a plan view illustrating a semiconductor device according to some embodiments of the inventive concepts. FIG. 11A is cross-sectional views taken along lines I-I' and II-II' of FIG. 10. FIG. 11B is cross-sectional views taken along lines III-III' and IV-IV' of FIG. 10. FIG. 11C is a cross-sectional view taken along a line V-V' of FIG. 10. In the present embodiment, the substantially same components as described in the embodiment of FIGS. 1 and 2A to 2C will be indicated by the same reference numerals or the same reference designators. For the purpose of ease and convenience in explanation, the descriptions to the same components as in the embodiment of FIGS. 1 and 2A to 2C will be omitted or mentioned briefly.

Referring to FIGS. 10 and 11A to 11C, a semiconductor device may include a substrate 100, active patterns AP, source/drain regions SD, an isolation structure 115, gate electrodes GE, gate spacers GSP, gate insulating patterns GI, capping patterns CAP, and contacts 130. The substrate 100, the active patterns AP, the gate electrodes GE, the gate spacers GSP, the gate insulating patterns GI, the capping patterns CAP, and the contacts 130 may be substantially the same as described with reference to FIGS. 1 and 2A to 2C. Hereinafter, the isolation structure 115 and the source/drain regions SD will be mainly described.

The isolation structure 115 may cover the single diffusion break regions SDBR and may extend in a second direction D2 crossing (e.g., perpendicular to) a first direction D1. The first direction D1 may be a direction in which each of the active patterns AP extends. In some embodiments, the isolation structure 115 may include an isolation pattern 117 extending in the second direction D2 and a pair of isolation spacers 119 provided on both sidewalls of the isolation pattern 117. A bottom surface of the isolation structure 115 may be in contact with top surfaces of the single diffusion break regions SDBR.

At least a portion of the isolation pattern 117 may be provided in the third trench T3. The isolation pattern 117 may cover at least portions of the top surfaces of the single diffusion break regions SDBR and may extend in the second direction D2. In some embodiments, a width 117_W of the isolation pattern 117 in the first direction D1 may be smaller than a width T3_W of the third trench T3 in the first direction D1, as illustrated in FIGS. 10 and 11A. In these embodiments, the isolation pattern 117 may be disposed between the first and second sub-active fins SAF1 and SAF2 and may extend in the second direction D2. However, embodiments of the inventive concepts are not limited thereto. In certain embodiments, unlike FIGS. 10 and 11A, the width 117_W of the isolation pattern 117 in the first direction D1 may be substantially equal to or greater than the width T3_W of the third trench T3 in the first direction D1.

The pair of isolation spacers 119 may extend in the second direction D2 and may be provided on the both sidewalls of the isolation pattern 117, respectively. One of the pair of isolation spacers 119 may partially cover the top surfaces of the first sub-active fins SAF1 and may extend in the second direction D2, and the other of the pair of isolation spacers 119 may partially cover the top surfaces of the second sub-active fins SAF2 and may extend in the second direction D2.

In some embodiments, the one of the pair of isolation spacers 119 may cover end portions of the first sub-active fins SAF1 and the other of the pair of isolation spacers 119 may cover end portions of the second sub-active fins SAF2, as illustrated in FIGS. 10 and 11A. However, embodiments of the inventive concepts are not limited thereto.

A top surface of the isolation pattern 117 may be coplanar with top surfaces of the pair of isolation spacers 119. For example, the top surface of the isolation structure 115 may be coplanar with the top surface of the first interlayer insulating layer 120 covering the active patterns AP and the source/drain regions SD.

For example, the isolation pattern 117 may include at least one of silicon oxide, silicon nitride, silicon oxynitride, silicon carbonitride (SiCN), or silicon-carbon oxynitride (SiCON). In some embodiments, the isolation pattern 117 may have a multi-layered structure. The isolation spacers 119 may be formed of the same material as the gate spacers GSP. For example, the isolation spacers 119 may include at least one of silicon oxide, silicon nitride, silicon oxynitride, silicon carbonitride (SiCN), or silicon-carbon oxynitride (SiCON).

The source/drain regions SD may be provided on the active patterns AP at both sides of each of the gate electrodes GE.

In some embodiments, as illustrated in FIGS. 11A to 11C, each of the source/drain regions SD may include an epitaxial pattern grown using the active pattern AP as a seed. For example, the source/drain regions SD may include a crystal structure. In these embodiments, the active patterns AP may have recess regions disposed at both sides of the gate electrode GE, and the source/drain regions SD may be provided in the recess regions, respectively. The source/drain regions SD in the P-channel MOSFET region PR may be configured to provide a compressive strain to the active pattern AP disposed therebetween, and the source/drain regions SD in the N-channel MOSFET region NR may be configured to provide a tensile strain to the active pattern AP disposed therebetween. In some embodiments, when the active patterns AP include silicon (Si), the source/drain regions SD of the P-channel MOSFET region PR may include silicon-germanium (SiGe) and the source/drain regions SD of the N-channel MOSFET region NR may include silicon carbide (SiC). In some embodiments, a level of top surfaces of the source/drain regions SD may be higher than a level of the top surface of the active pattern AP. The source/drain regions SD of the P-channel MOSFET region PR may include P-type dopants, and the source/drain regions SD of the N-channel MOSFET region NR may include N-type dopants.

In certain embodiments, unlike FIGS. 11A to 11C, the source/drain regions SD may be dopant regions provided in the active fins AF at both sides of each of the gate electrodes GE. For, example, the source/drain regions SD may not be epitaxial patterns grown on recessed active fins AF but be formed with the active fins AF doped with impurities therein. In these embodiments, the source/drain regions SD of the P-channel MOSFET region PR may be P-type dopant regions, and the source/drain regions SD of the N-channel MOSFET region NR may be N-type dopant regions.

According to some embodiments of the inventive concepts, the first and second sub-active patterns SAP1 and SAP2 may be isolated (e.g. electrically isolated, insulated, and/or electrically separated) from each other by a simple structure including the single diffusion break region SDBR of the device isolation layer ST and the isolation structure 115.

FIGS. 12A, 13A, 14A, 15A, and 16A are plan views illustrating a method of manufacturing a semiconductor device according to some embodiments of the inventive concepts. FIGS. 12B, 13B, 14B, 15B, and 16B are cross-sectional views taken along lines I-I' and II-II' of FIGS. 12A, 13A, 14A, 15A, and 16A, respectively. FIGS. 12C, 13C, 14C, 15C, and 16C are cross-sectional views taken along lines and IV-IV' of FIGS. 12A, 13A, 14A, 15A, and 16A, respectively. FIGS. 12D, 13D, 14D, 15D, and 16D are cross-sectional views taken along lines V-V' of FIGS. 12A, 13A, 14A, 15A, and 16A, respectively. Hereinafter, the same components as described with reference to FIGS. 1, 2A to 2C, 3A, 3B, 10, and 11A to 11C will be indicated by the same reference numerals or the same reference designators. For the purpose of ease and convenience in explanation, the descriptions to the same technical features as mentioned above will be omitted or mentioned briefly.

Referring to FIGS. 12A to 12D, trenches T1, T2, T3, and T4 may be formed by the same method as described with reference to FIGS. 5A to 5D. The active regions PR and NR and the active patterns AP extending in the first direction D1 may be defined by the trenches T1, T2, T3, and T4. Each of the active patterns AP may include the first to third sub-active patterns SAP1, SAP2, and SAP3 which are spaced apart from each other in the first direction D1.

A device isolation layer ST may be formed to fill portions (i.e., lower portions) of the first to fourth trenches T1, T2, T3, and T4. Upper portions (hereinafter, referred to as 'active fins AF') of the active patterns AP may be exposed by the device isolation layer ST. Each of the active fins AF may include first, second, and third sub-active fins SAF1, SAF2, and SAF3 which are included in the first, second, and third sub-active patterns SAP1, SAP2, and SAP3, respectively. The device isolation layer ST may include single diffusion break regions SDBR and double diffusion break region DDBR. Each of the single diffusion break regions SDBR may correspond to a portion of the device isolation layer ST, which is disposed between the first and second sub-active patterns SAP1 and SAP2 included in the same active pattern AP. Each of the double diffusion break regions DDBR may correspond to another portion of the device isolation layer ST, which is disposed between the second and third sub-active patterns SAP2 and SAP3 included in the same active pattern AP.

First and second sacrificial patterns SFP1 and SFP2 may be formed to extend in the second direction D2. The first and second sacrificial patterns SFP1 and SFP2 may be spaced apart from each other in the first direction D1. The first sacrificial patterns SFP1 may be formed to cross the active fins AF. Two of the first sacrificial patterns SFP1 may be formed to cross the double diffusion break regions DDBR. The second sacrificial pattern SFP2 may be formed to cross the single diffusion break regions SDBR. A width SFP2_W of the second sacrificial pattern SFP2 in the first direction D1 may be smaller than a width T3_W of the third trench T3 in the first direction D1. Thus, in some embodiments, the second sacrificial pattern SFP2 may be formed between the first and second sub-active fins SAF1 and SAF2 and may partially expose the top surfaces of the single diffusion break regions SDBR. Forming the first and second sacrificial patterns SFP1 and SFP2 may include forming a sacrificial layer covering an entire top surface of the substrate 100, forming gate mask patterns GMP on the sacrificial layer, and patterning the sacrificial layer using the gate mask patterns GMP as etch masks. For example, the sacrificial layer may include a poly-silicon layer. The gate mask patterns GMP may include, for example, silicon nitride or silicon oxynitride.

A spacer layer SPL may be formed on the substrate 100 to conformally cover the device isolation layer ST, the active patterns AP, and the first and second sacrificial patterns SFP1 and SFP2. The spacer layer SPL is omitted in FIG. 12A to clearly illustrate other components. When an empty space exists between the second sacrificial pattern SFP2 and each of the first and second sub-active fins SAF1 and SAF2, the spacer layer SPL may be formed to fill the empty space. For example, the spacer layer SPL may include at least one of silicon oxide, silicon nitride, silicon oxynitride, silicon carbonitride (SiCN), or silicon-carbon oxynitride (SiCON).

Referring to FIGS. 13A to 13D, the spacer layer SPL may be anisotropically etched to form gate spacers GSP, isolation spacers 119, and fin spacers FSP. The gate spacers GSP may be formed on both sidewalls of each of the first sacrificial patterns SFP1, and the isolation spacers 119 may be formed on both sidewalls of the second sacrificial pattern SFP2. The fin spacers FSP may be formed on both sidewalls of each of the active fins AF exposed by the first sacrificial patterns SFP1.

Source/drain regions SD may be formed on the active patterns AF at both sides of each of the first and second sacrificial patterns SFP1 and SFP2. Forming the source/drain regions SD may include etching the active fins AF using the gate mask patterns GMP, the gate spacers GSP, and the isolation spacers 119 as etch masks to form recess regions RR, and performing a SEG process using the active patterns AP exposed by the recess regions RR as a seed.

The source/drain regions SD may include a different semiconductor element from the substrate 100. In some embodiments, the source/drain regions SD may include a semiconductor element of which a lattice constant is greater or smaller than that of the semiconductor element of the substrate 100. Since the source/drain regions SD include a different semiconductor element from the substrate 100, a compressive strain or a tensile strain may be provided to the active fins AF. In some embodiments, when the substrate 100 is a silicon substrate, the source/drain regions SD in the P-channel MOSFET region PR may include silicon-germanium (SiGe) or germanium (Ge). In this case, the compressive strain may be provided to the active fins AF of the P-channel MOSFET region PR. In some embodiments, when the substrate 100 is a silicon substrate, the source/drain regions SD in the N-channel MOSFET region NR may include silicon carbide (SiC). In this case, the tensile strain may be provided to the active fins AF of the N-channel MOSFET region NR.

The source/drain regions SD may be doped with dopants of a second conductivity type different from a first conductivity type of the active patterns AP. In some embodiments, the source/drain regions SD may be doped with the dopants of the second conductivity type in-situ during the formation of the source/drain regions SD. In certain embodiments, the dopants of the second conductivity type may be provided into the source/drain regions SD by an ion implantation process after the formation of the source/drain regions SD.

Figure 13A:
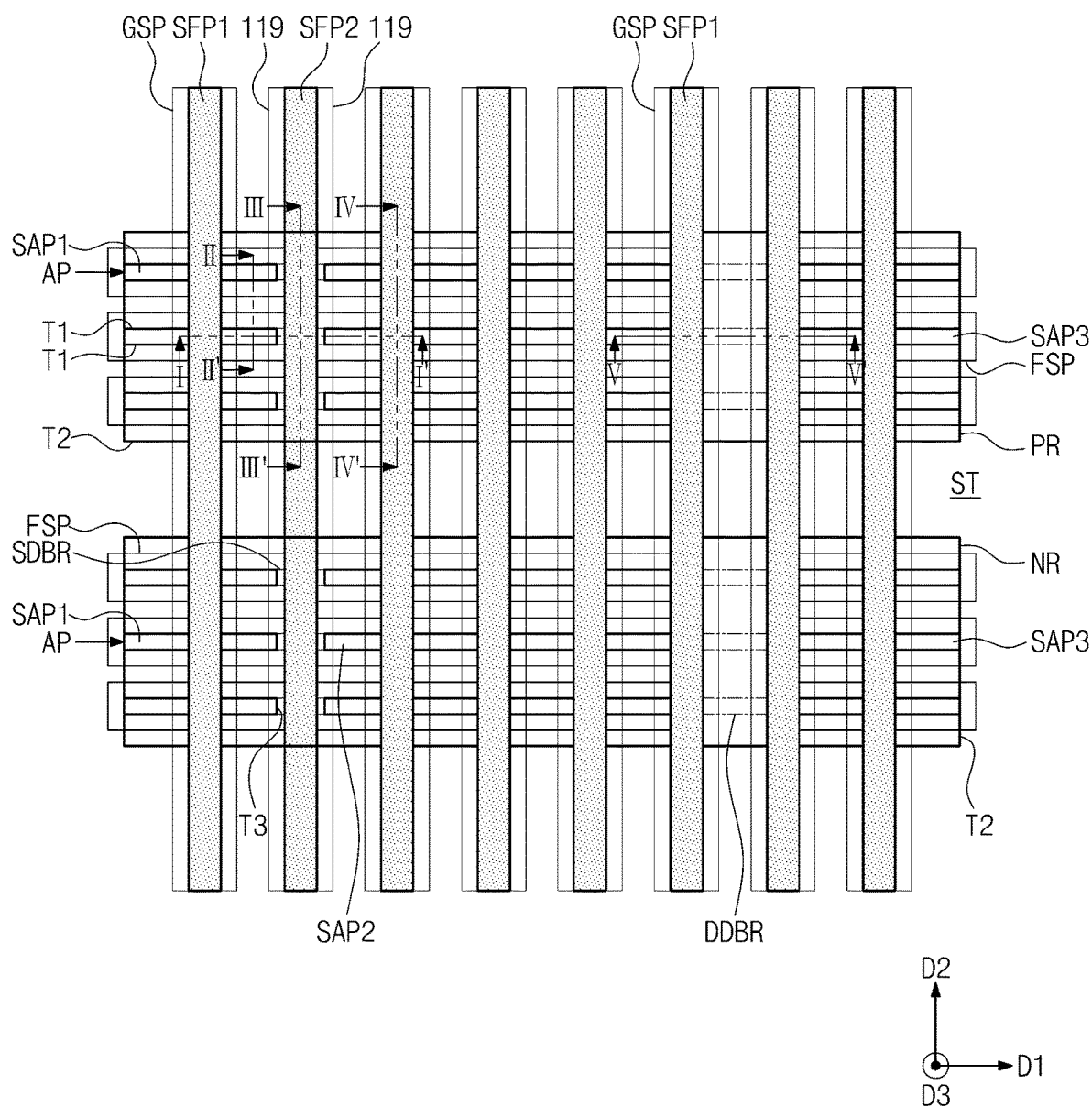
Figure 13B:
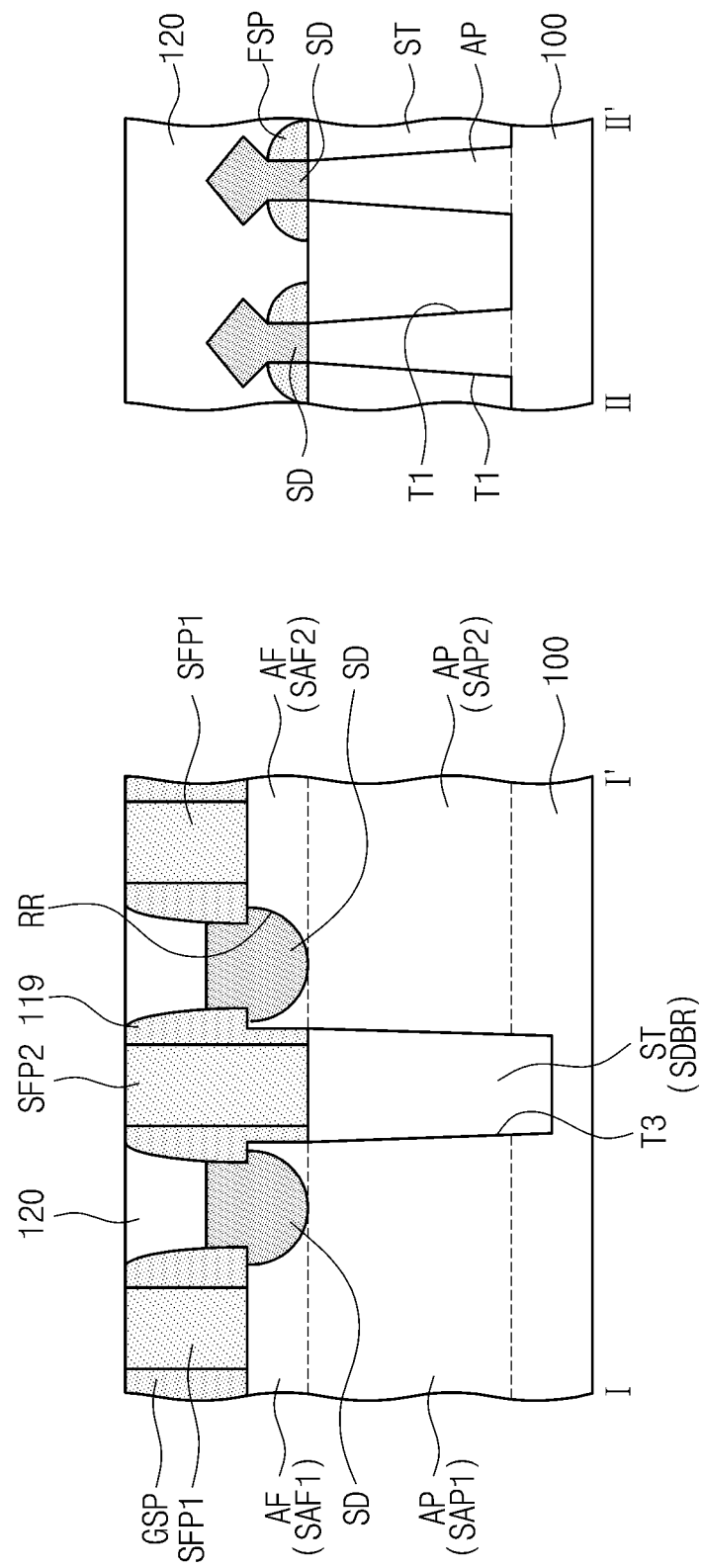
Figure 13C:
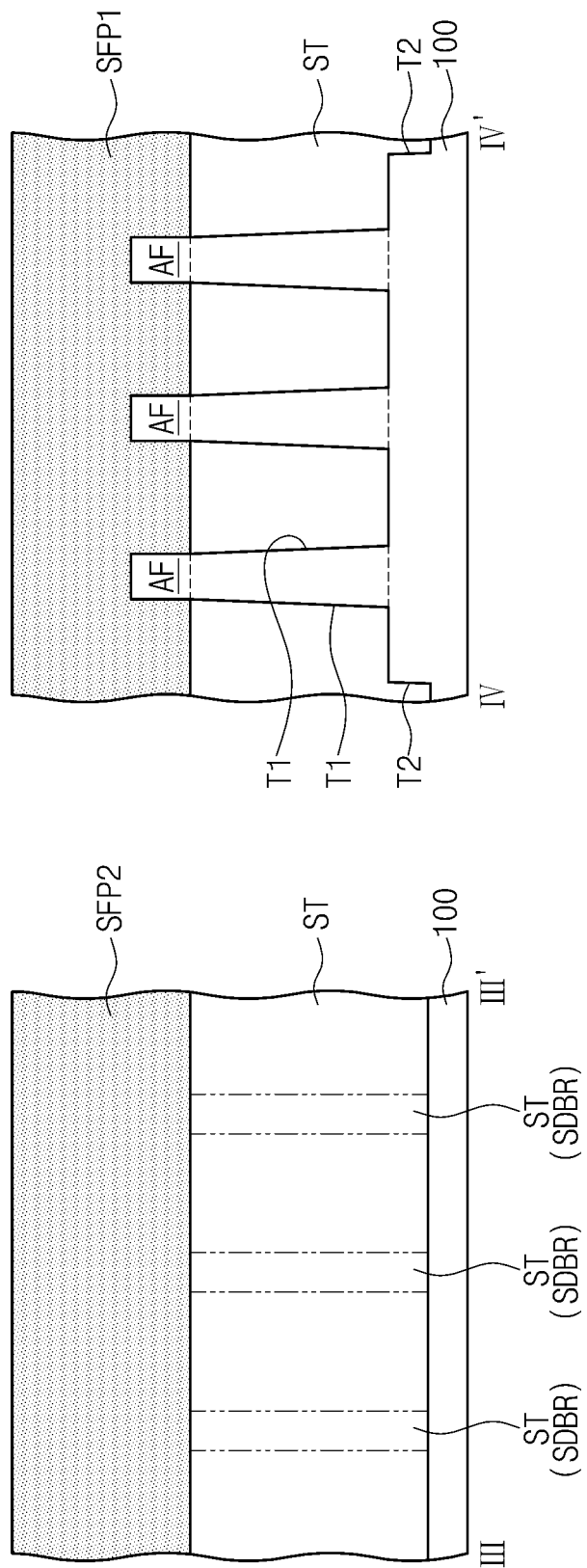
Figure 13D:
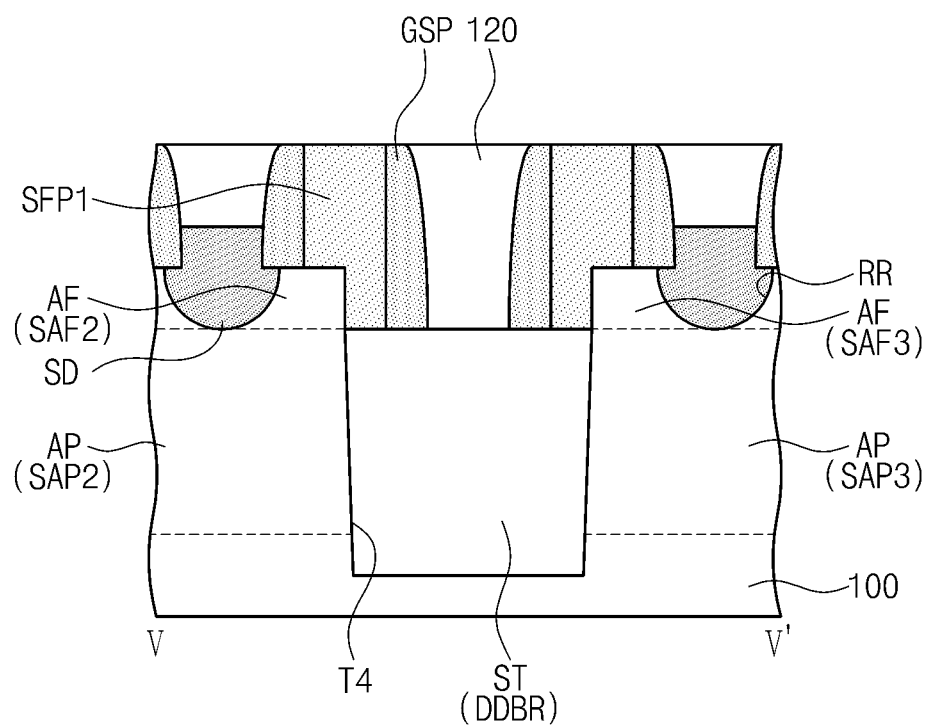
Figure 14A:
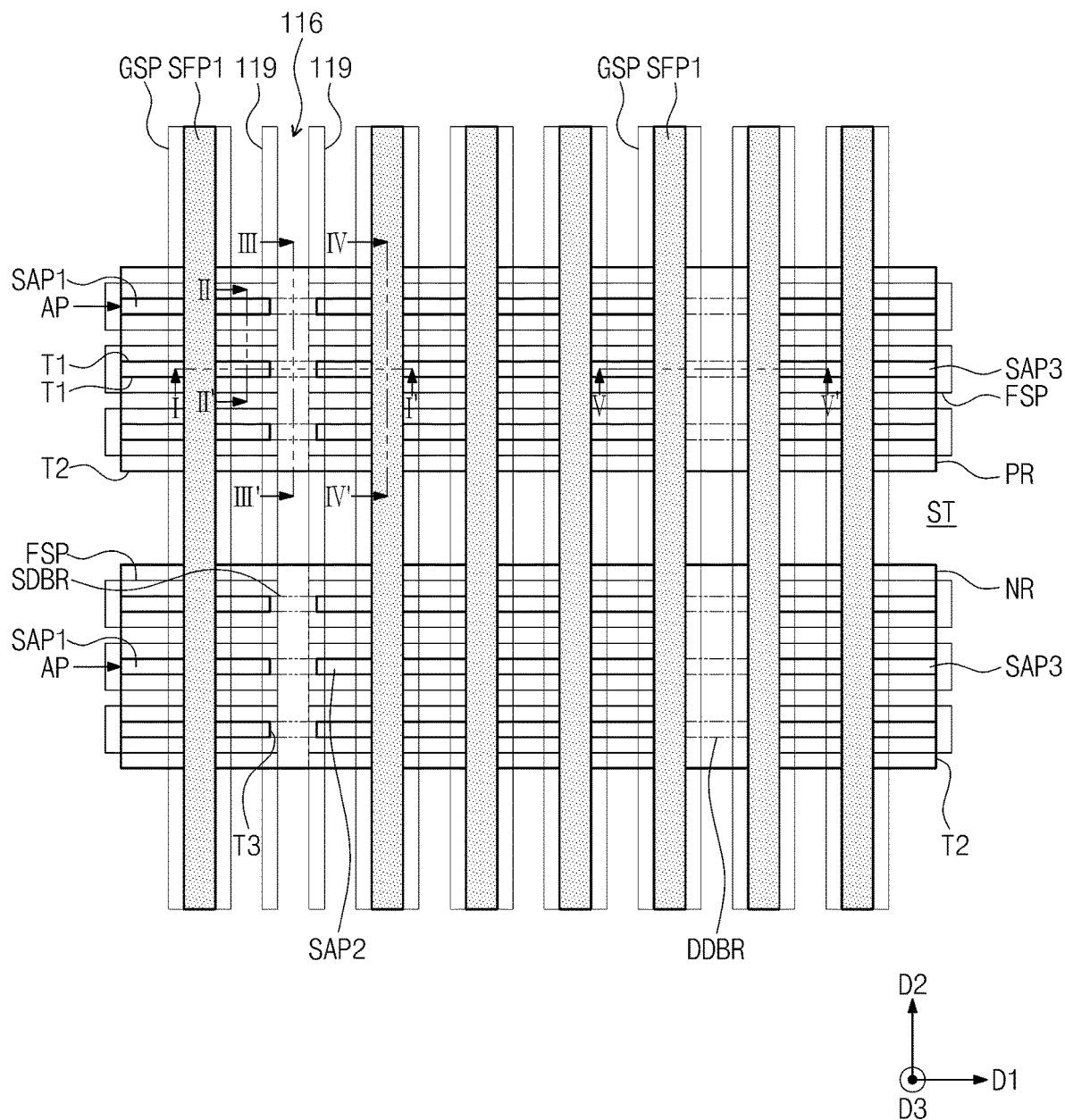
Figure 14B:
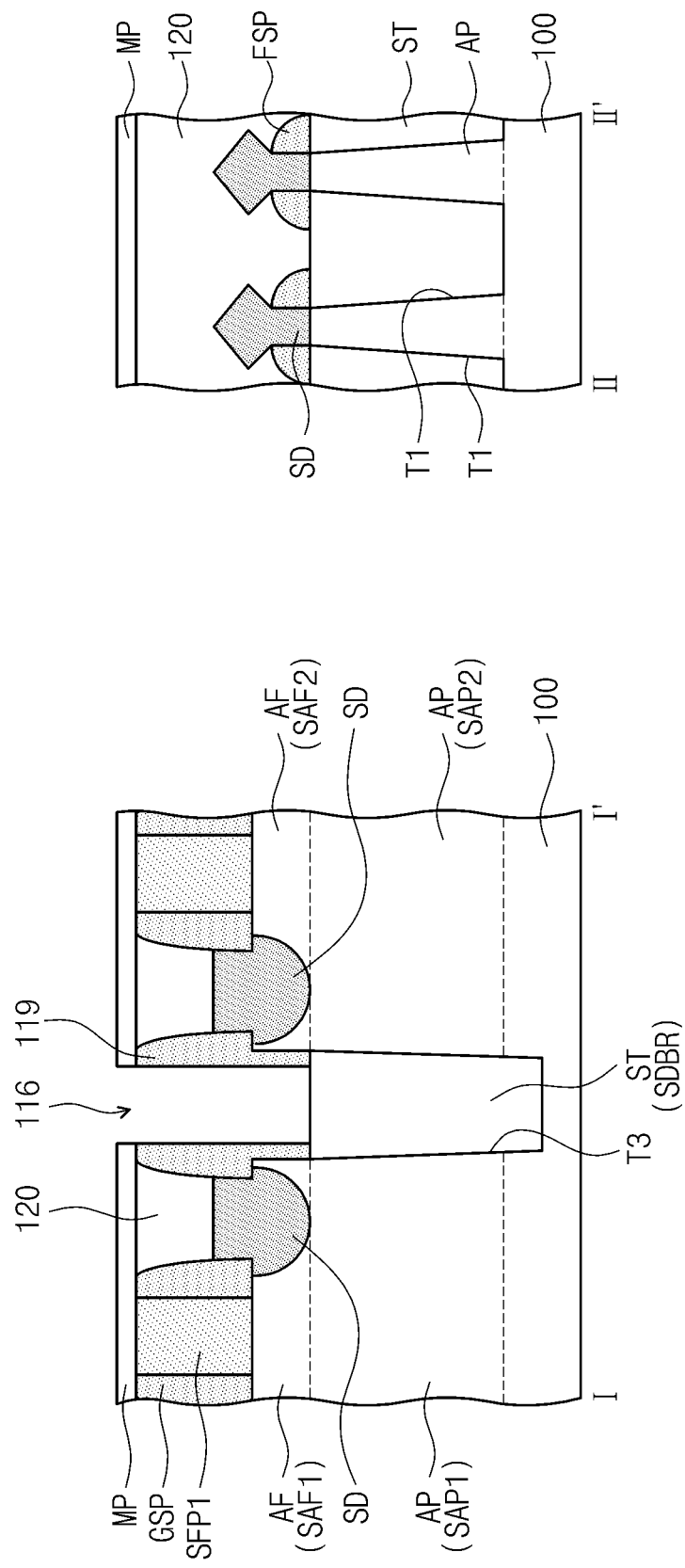
Figure 14C:
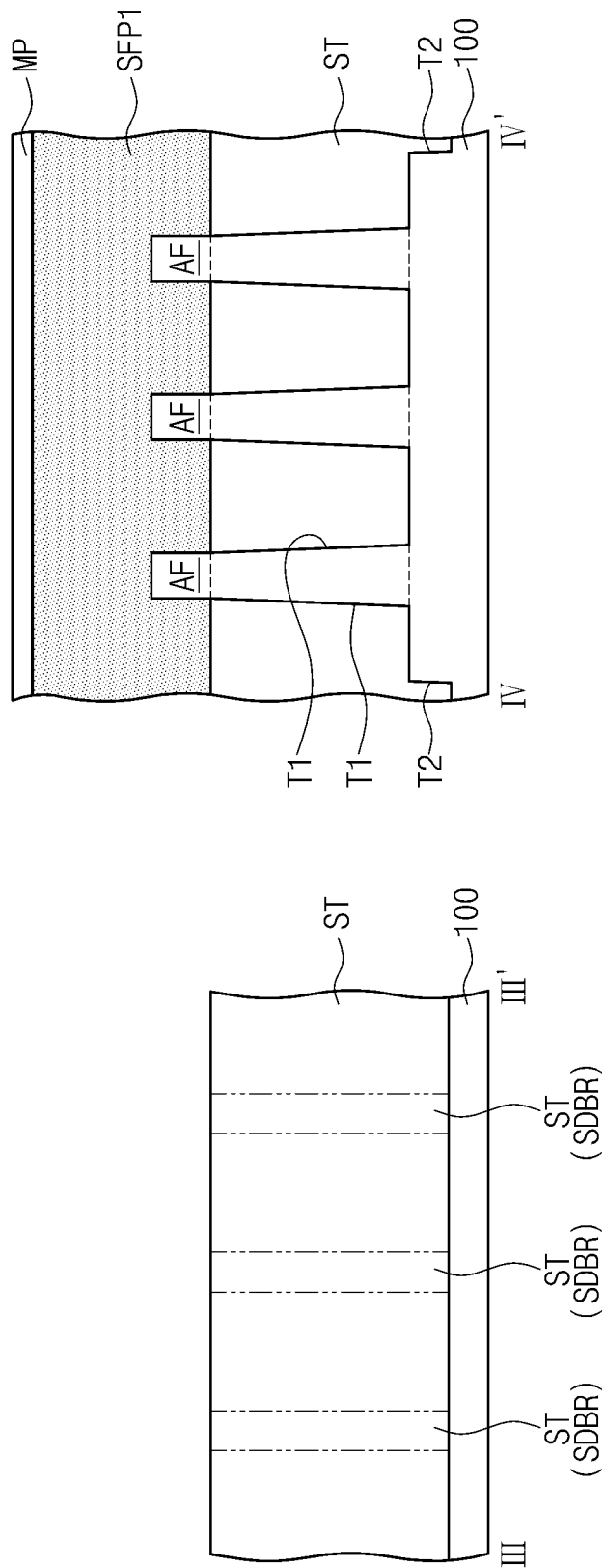
Figure 14D:
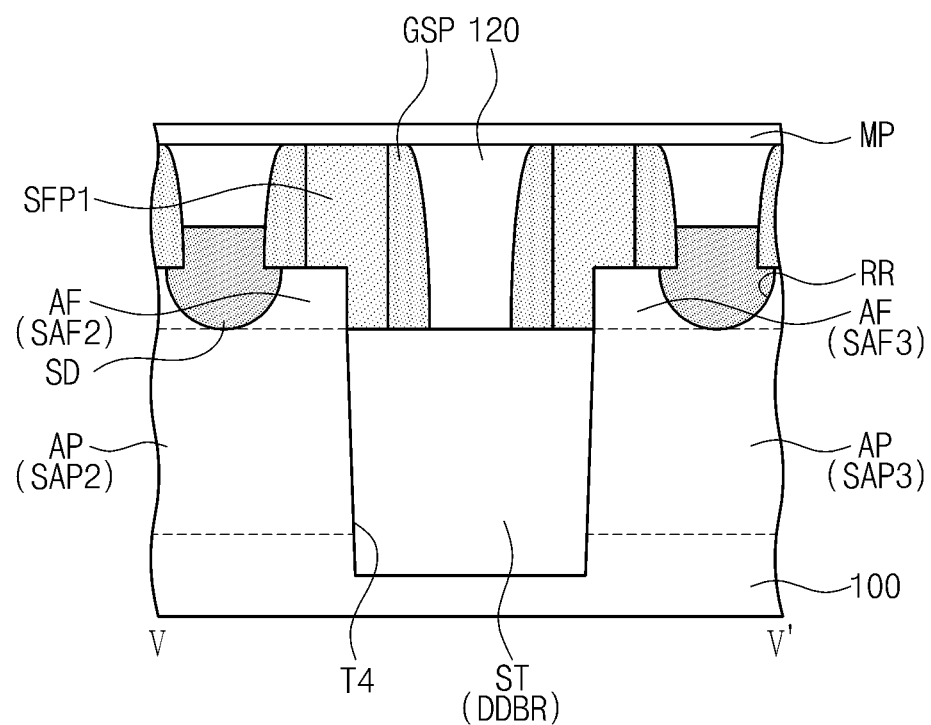
Figure 15A:
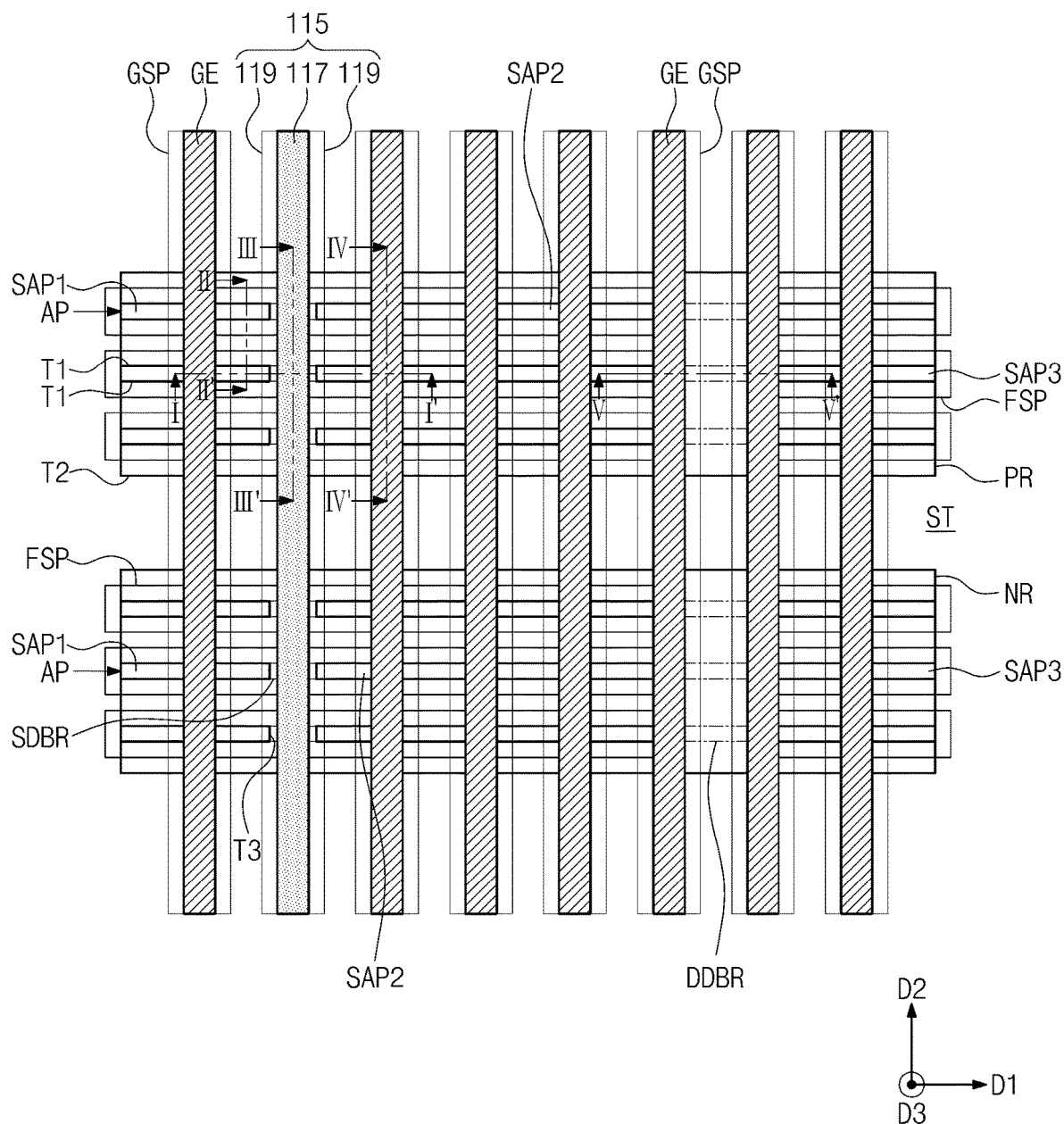
Figure 15B:
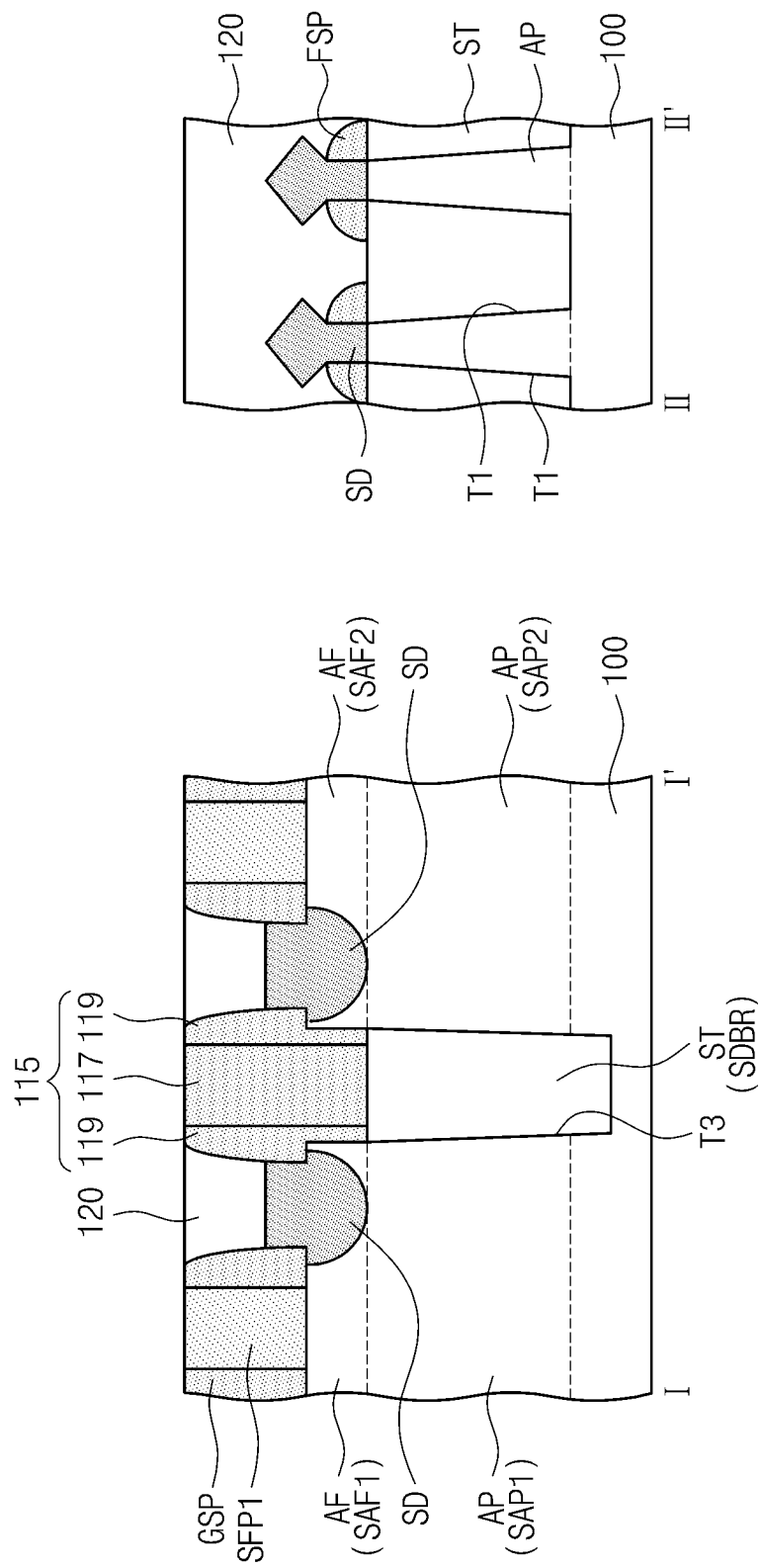
Figure 15C:
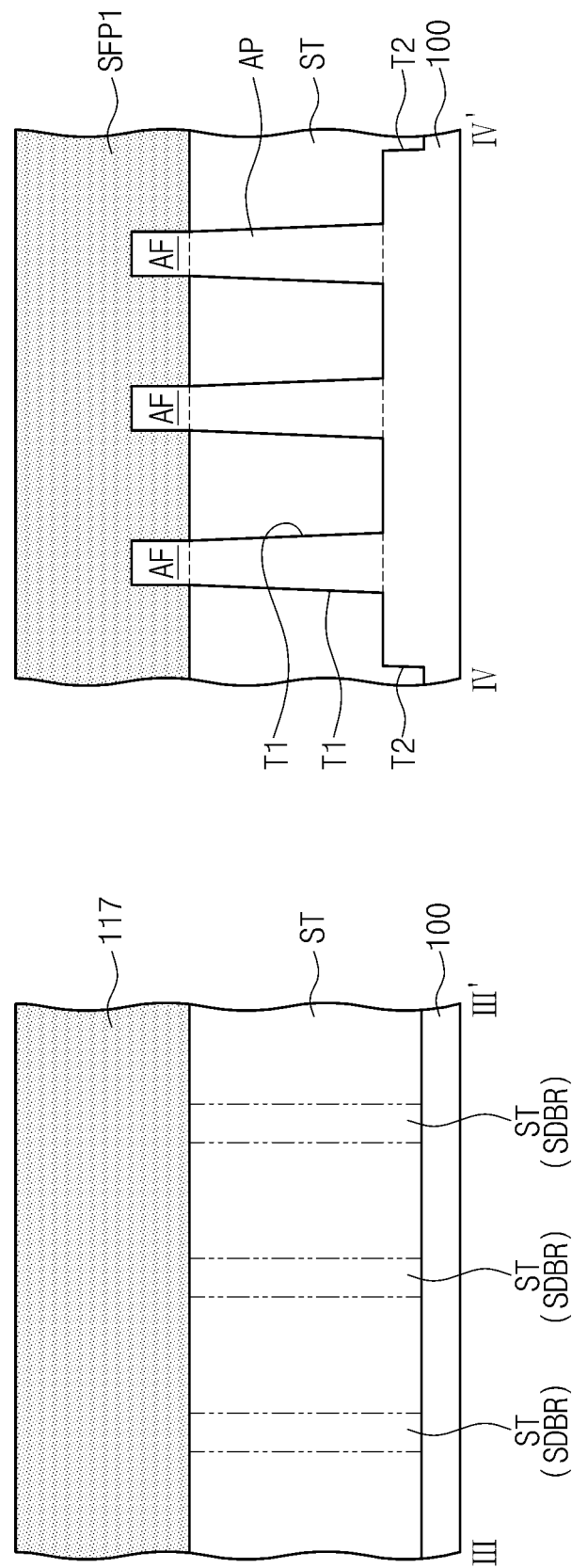
Figure 15D:
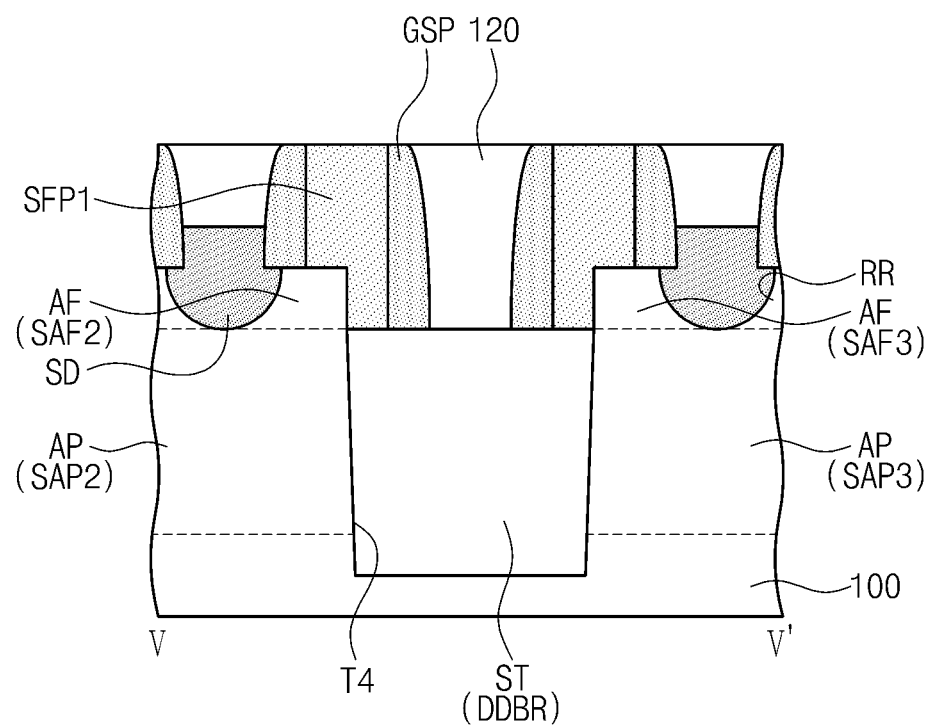
Figure 16A:
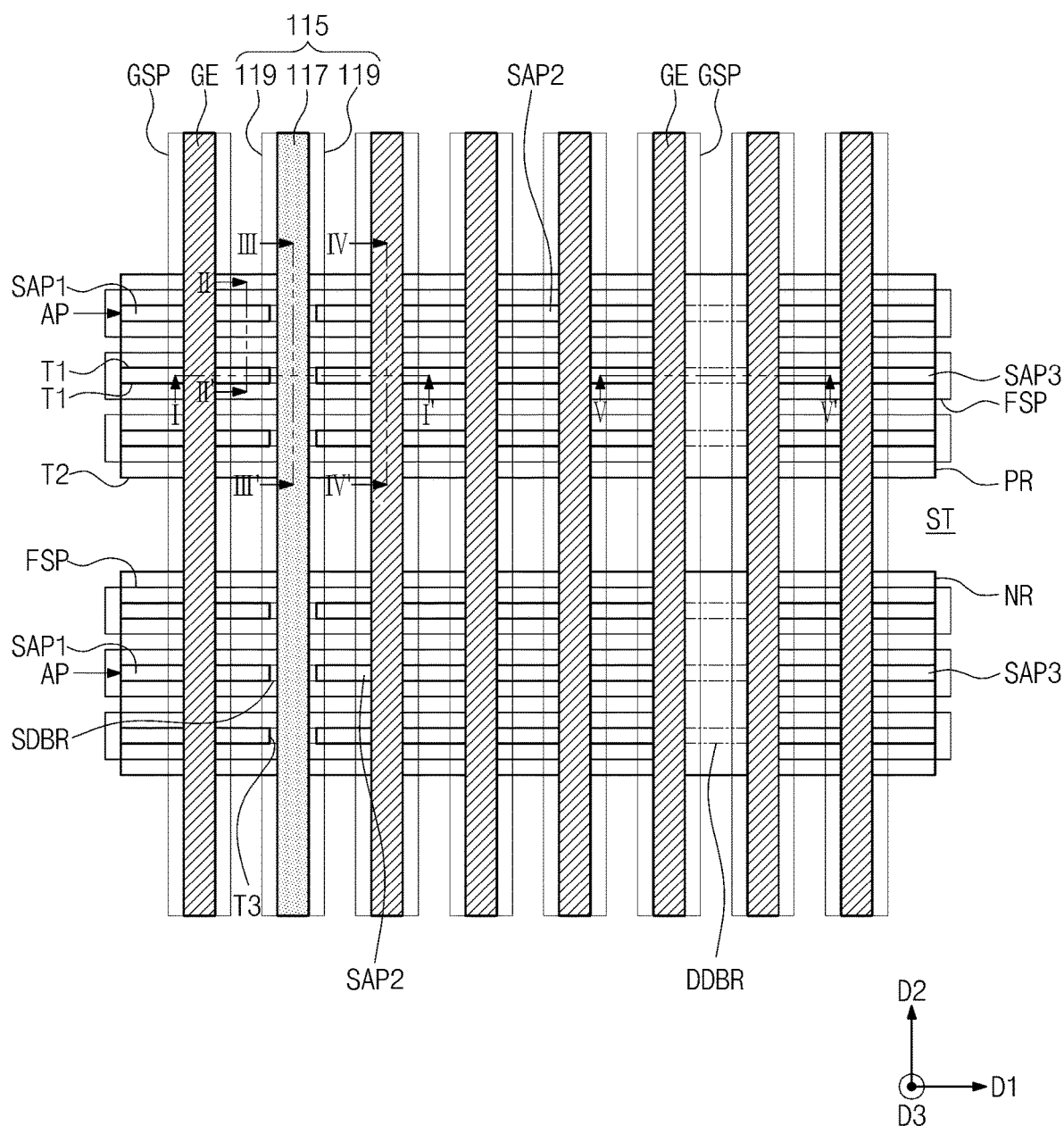
Figure 16B:
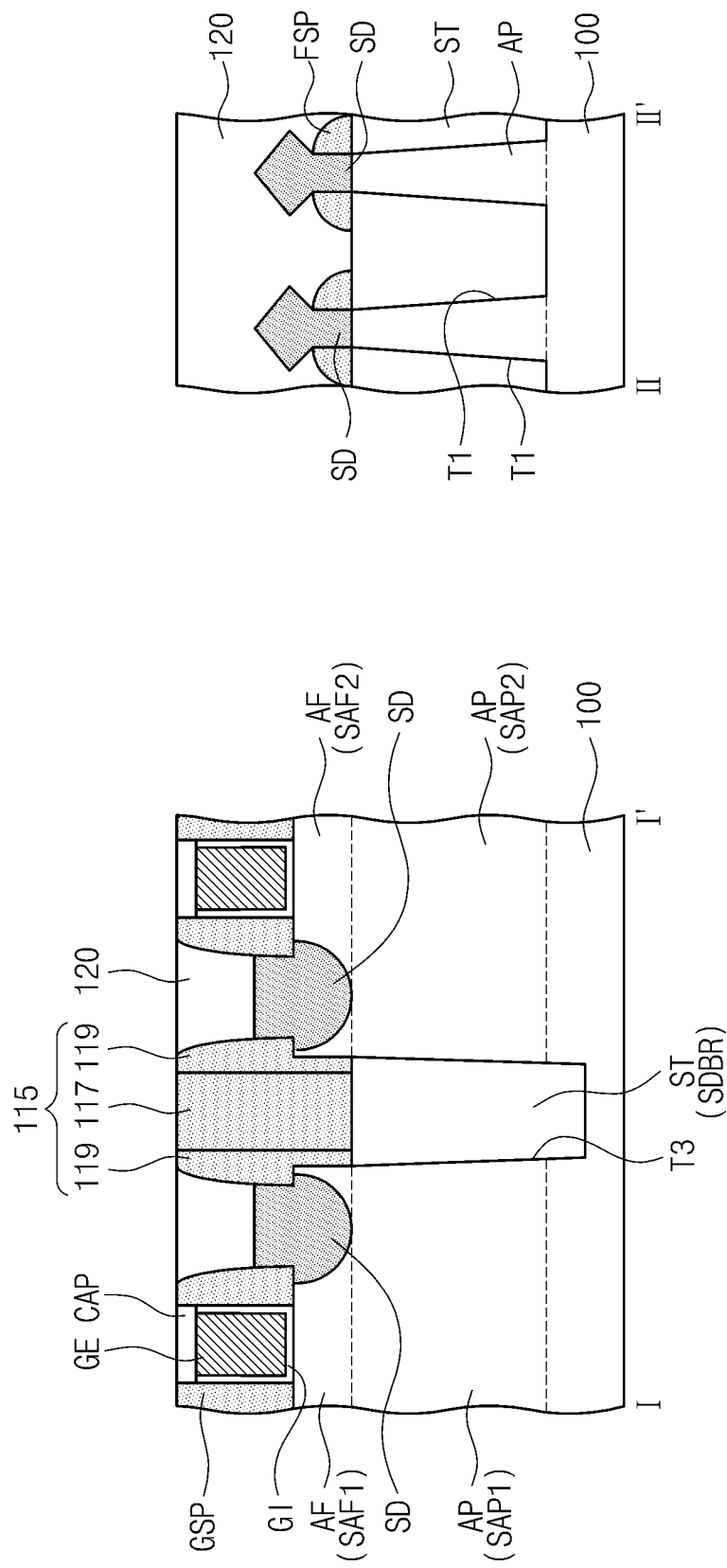
Figure 16C:
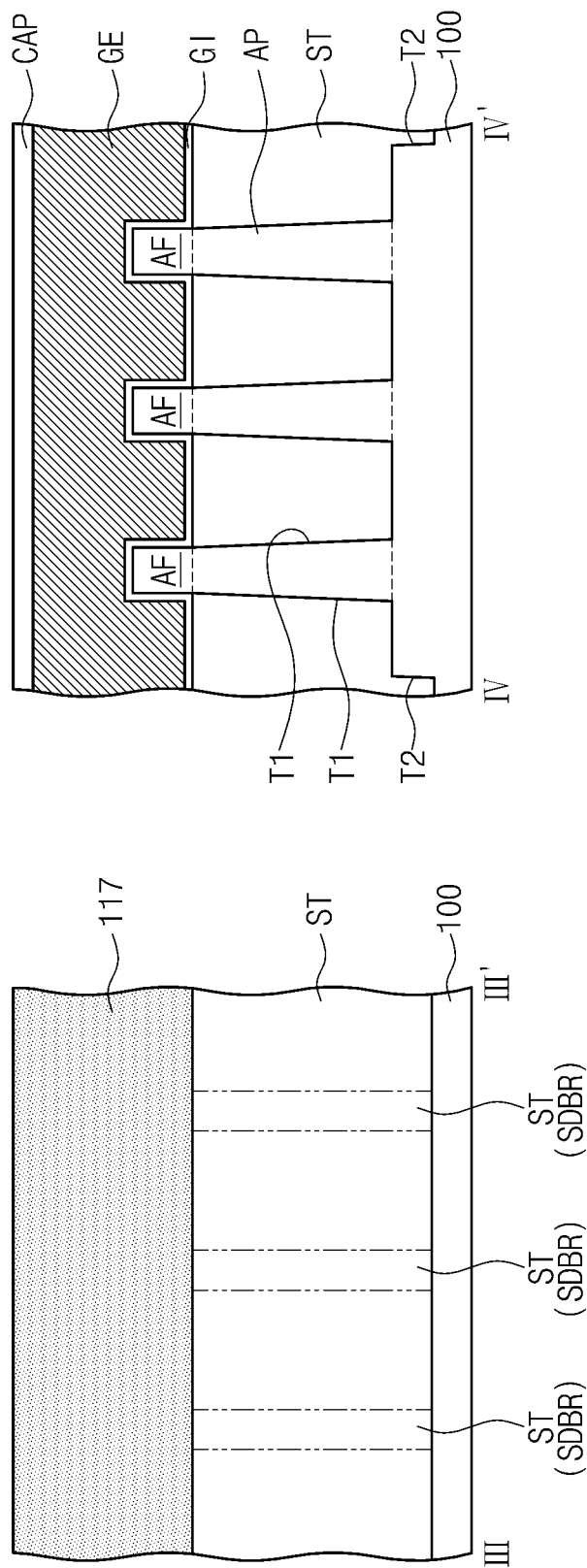
Figure 16D:
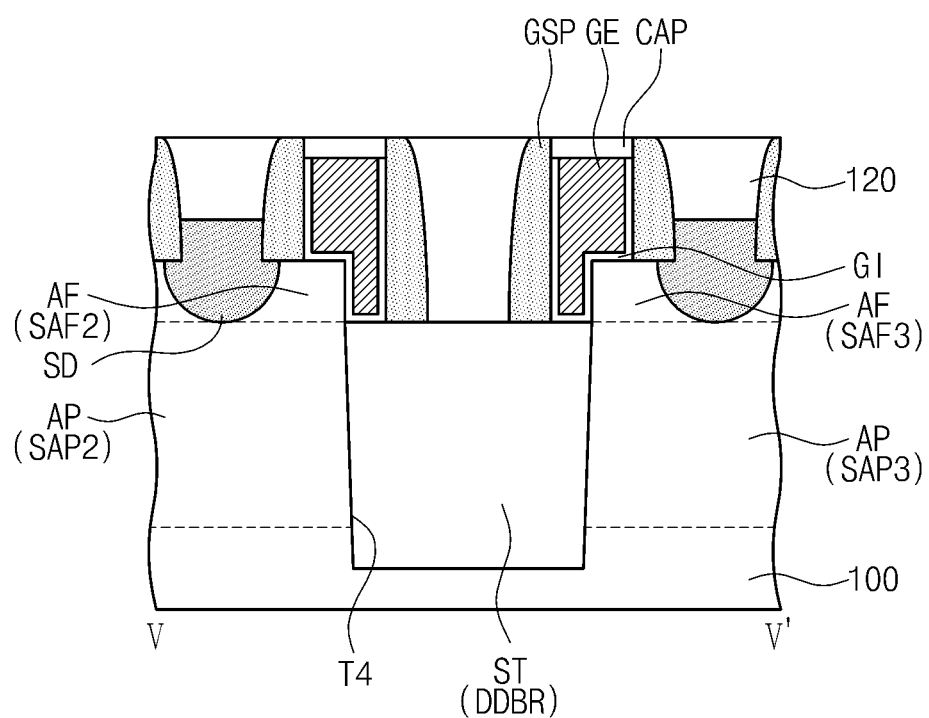

At least portions of the fin spacers FSP may be etched by the process of forming the recess regions RR. In some embodiments, as illustrated in FIG. 13B, at least a portion of each of the fin spacers FSP may remain, and a level of top surfaces of the remaining fin spacers FSP may be lower than a level of the top surfaces of the active fins AF. In certain embodiments, the fin spacers FSP may be removed unlike FIG. 13B.

Next, a first interlayer insulating layer 120 may be formed to cover the source/drain regions SD. Forming the first interlayer insulating layer 120 may include forming an insulating layer covering the sacrificial patterns SFP1 and SFP2 and the gate mask patterns GMP, and planarizing the insulating layer until the top surfaces of the sacrificial patterns SFP1 and SFP2 are exposed.

Referring to FIGS. 14A to 14D, the second sacrificial pattern SFP2 may be selectively removed to form a gap region 116 between the isolation spacers 119. Forming the gap region 116 may include forming a mask pattern MP exposing the second sacrificial pattern SFP2 on the first interlayer insulating layer 120, and selectively etching the second sacrificial pattern SFP2. The single diffusion break regions SDBR may be exposed through the gap region 116.

Referring to FIGS. 15A to 15D, an isolation pattern 117 may be formed to fill the gap region 116. Forming the isolation pattern 117 may include forming an isolation layer filling the gap region 116 on the first interlayer insulating layer 120, and planarizing the isolation layer until the first sacrificial patterns SFP1 are exposed. Upper portions of the isolation spacers 119 and an upper portion of the first interlayer insulating layer 120 may also be planarized by the process of planarizing the isolation layer, and thus a top surface of the isolation pattern 117 may be substantially coplanar with top surfaces of the isolation spacers 119 and a top surface of the first interlayer insulating layer 120. For example, the isolation layer may include at least one of silicon oxide, silicon nitride, silicon oxynitride, silicon carbonitride (SiCN), or silicon-carbon oxynitride (SiCON). In some embodiments, the isolation layer may be formed of a multi-layer.

The isolation pattern 117 and the isolation spacers 119 on both sidewalls of the isolation pattern 117 may compose an isolation structure 115. For example, an isolation structure 115 may include an isolation pattern 117 and isolation spacers 119 formed on sidewalls of the isolation pattern 117. The isolation structure 115 may cover the single diffusion break regions SDBR and may extend in the second direction D2.

Referring to FIGS. 16A to 16D, the first sacrificial patterns SFP1 may be replaced with gate structures. Each of the gate structures may include a gate insulating pattern GI, a gate electrode GE, and a capping pattern CAP. The process of replacing the first sacrificial patterns SFP1 with the gate structures may be substantially the same as the process of replacing the sacrificial patterns SFP with the gate structures described with reference to FIGS. 1 and 9A to 9C.

Referring again to FIGS. 10 and 11A to 11C, a second interlayer insulating layer 122 may be formed to cover the first interlayer insulating layer 120 and the capping patterns CAP. For example, the second interlayer insulating layer 122 may include at least one of a silicon oxide layer or a silicon oxynitride layer.

Next, contacts 130 may be formed to penetrate the second and first interlayer insulating layers 122 and 120. The contacts 130 may be connected to the source/drain regions SD. For example, the contacts 130 may include a conductive material such as tungsten. Interconnections (not shown) may be formed on the second interlayer insulating layer 122 so as to be electrically connected to the contacts 130.

According to some embodiments of the inventive concepts, the first and second sub-active patterns SAP1 and SAP2 may be isolated (e.g. electrically isolated, insulated, and/or electrically separated) from each other by a simple structure including the single diffusion break region SDBR of the device isolation layer ST and the isolation structure 115. The device isolation layer ST and the isolation structure 115 may be formed by relatively simple processes, as described above. Thus, according to some embodiments of the inventive concepts, a manufacture cost of the semiconductor device may be reduced or minimized.

While aspects of embodiments of the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
a device isolation layer provided on a substrate, the device isolation layer defining a first sub-active pattern and a second sub-active pattern, the first and second sub-active patterns extending in a first direction and spaced apart from each other in the first direction;
a first gate electrode and a second gate electrode crossing the first sub-active pattern and the second sub-active pattern, respectively; and
an isolation structure provided on the device isolation layer between the first and second sub-active patterns,
wherein the device isolation layer includes a diffusion break region disposed between the first and second sub-active patterns,
wherein the isolation structure covers a top surface of the diffusion break region,
wherein the isolation structure comprises:
an isolation pattern extending in a second direction crossing the first direction; and
isolation spacers provided on both sidewalls of the isolation pattern, respectively,
wherein the gate electrodes and the isolation pattern are formed of different materials from each other, and
wherein the isolation pattern has a first width that is the maximum width in the first direction, the diffusion break region has a second width that is the maximum width in the first direction, and the second width is greater than the first width.

2. The semiconductor device of claim 1, further comprising:
a pair of first trenches formed on the substrate, the first trenches extending in parallel in the first direction; and
a second trench formed on the substrate, the second trench crossing the first trenches,
wherein a portion of the isolation pattern is disposed in the second trench.

3. The semiconductor device of claim 1, further comprising:
gate capping patterns on the first gate electrode and the second gate electrode respectively,
wherein a top surface of the each of the gate capping patterns and a top surface of the isolation pattern are coplanar.

4. The semiconductor device of claim 1, wherein one of the isolation spacers partially covers a top surface of the first sub-active pattern, and the other of the isolation spacers partially covers a top surface of the second sub-active pattern.

5. The semiconductor device of claim 1, further comprising:
a first source/drain region on the first sub-active pattern being between the first gate electrode and the isolation pattern;
a second source/drain region on the second sub-active pattern being between the second gate electrode and the isolation pattern;
contacts connected to the first and second source/drain regions respectively; and
a first gate spacer on a sidewall of the first gate electrode; and
a second gate spacer on a sidewall of the second gate electrode
wherein a level of the bottommost surface of the each of the contacts is higher than the level of the bottommost surface of the first gate spacer and the level of the bottommost surface of the second gate spacer.

6. The semiconductor device of claim 1, wherein with respect to a vertical cross section taken along the first direction, a side surface of each of the device isolation spacers has a step shape.

7. A semiconductor device comprising:
a first fin-type active pattern formed on a substrate, the first fin-type active pattern extending in a first direction;
a second fin-type active pattern formed on the substrate, the second fin-type active pattern extending in the first direction;
the first and second fin-type active patterns spaced apart from each other in the first direction;
a device isolation layer disposed between the first and second fin-type active patterns, the device isolation layer being an insulator;
a first gate electrode and a second gate electrode crossing the respective first and second fin-type active patterns;
a first gate spacer disposed on one sidewall of the first gate electrode;
a second gate spacer disposed on the one sidewall of the second gate electrode; and
an isolation structure disposed on the device isolation layer between the first and second fin-type active patterns,
wherein the isolation structure comprises:
an isolation pattern extending in a second direction crossing the first direction; and
isolation spacers provided on both sidewalls of the isolation pattern, respectively,
wherein with respect to a vertical cross section taken along the first direction, the isolation pattern has a top surface at a location directly above a center of the device isolation layer at least as high as top surfaces of the first and second gate electrodes,
wherein the gate electrodes and the isolation pattern are formed of different materials from each other, and
wherein the isolation pattern has a first width that is the maximum width in the first direction, the diffusion break region has a second width that is the maximum width in the first direction, and the second width is greater than the first width.

8. The semiconductor device of claim 7, wherein the gate spacers are disposed above an uppermost surface of the first and second sub activcfin-type active patterns.

9. The semiconductor device of claim 7, wherein the first gate spacer and the second gate spacer contact a sidewall of the upper portion of the first fin-type active pattern and a sidewall of the upper portion of the second fin-type active pattern, respectively.

10. The semiconductor device of claim 7, wherein the isolation pattern completely fills a region between the isolation spacers.

11. The semiconductor device of claim 7, wherein the gate electrodes are formed of a conductive material, and the isolation pattern and the isolation spacers are formed of an insulator.

12. The semiconductor device of claim 7, wherein a top surface of the isolation pattern is coplanar with top surfaces of the isolation spacers.

13. A semiconductor device comprising:
a first fin-type active pattern formed on a substrate, the first fin-type active pattern extending in a first direction;
a second fin-type active pattern formed on the substrate, the second fin-type active pattern extending in the first direction;
the first and second fin-type active patterns spaced apart from each other in the first direction;
a device isolation layer disposed between the first and second fin-type active patterns, the device isolation layer being an insulator;
a first gate electrode and a second gate electrode crossing the respective first and second fin-type active patterns;
a first gate spacer disposed on one sidewall of the first gate electrode;
a second gate spacer disposed on the one sidewall of the second gate electrode; and
an isolation structure disposed on the device isolation layer between the first and second fin-type active patterns,
wherein the isolation structure comprises:
an isolation pattern extending in a second direction crossing the first direction; and
isolation spacers provided on both sidewalls of the isolation pattern, respectively,
wherein the gate electrodes and the isolation pattern are formed of different materials from each other, and
wherein the isolation pattern has a first width that is the maximum width in the first direction, the diffusion break region has a second width that is the maximum width in the first direction, and the second width is greater than the first width.

14. The semiconductor device of claim 13, wherein the first and second gate spacers are formed of the same material as that of the isolation spacers.

15. The semiconductor device of claim 13, wherein the gate electrodes are formed of a conductive material, and the isolation pattern is formed of an insulator.

16. The semiconductor device of claim 15, wherein the isolation spacers are formed of an insulator.

17. The semiconductor device of claim 13, wherein one of the isolation spacers partially covers a top surface of the first fin-type active pattern, and the other of the isolation spacers partially covers a top surface of the second fin-type active pattern.

18. The semiconductor device of claim 13, further comprising:
   an interlayer insulating layer covering the first and second fin-type active patterns,
   wherein a top surface of the isolation structure is coplanar with a top surface of the interlayer insulating layer.

19. The semiconductor device of claim 1,
   wherein the first and second sub-active patterns each have opposite sidewalls extending in the first direction and on which the device isolation layer is formed.

20. The semiconductor device of claim 1,
   wherein the device isolation layer is formed of silicon oxide and the isolation pattern is a single layer or multi-layered structure formed of one or more of silicon nitride, silicon oxynitride, silicon carbonitride and silicon-carbon oxynitride (SiCON).

* * * * *